(12) United States Patent  
Lal et al.

(10) Patent No.: US 9,263,519 B2  
(45) Date of Patent: Feb. 16, 2016

(54) NANOWIRE ARRAY STRUCTURES FOR SENSING, SOLAR CELL AND OTHER APPLICATIONS

(75) Inventors: Amit Lal, Ithaca, NY (US); Yuerui Lu, Ithaca, NY (US)

(73) Assignee: Cornell University, Ithaca, NY (US)

(*) Notice: Subject to any disclaimer, the term of this patent is extended or adjusted under 35 U.S.C. 154(b) by 0 days.

(21) Appl. No.: 13/448,384

(22) Filed: Apr. 16, 2012

(65) Prior Publication Data

US 2012/0322164 A1 Dec. 20, 2012

Related U.S. Application Data

(63) Continuation-in-part of application No. PCT/US2010/052971, filed on Oct. 15, 2010.

(60) Provisional application No. 61/252,610, filed on Oct. 16, 2009.

(51) Int. Cl.

| | |
|---|---|
| B32B 5/02 | (2006.01) |
| C12M 1/00 | (2006.01) |
| G01N 21/00 | (2006.01) |
| H01L 29/06 | (2006.01) |
| B82Y 10/00 | (2011.01) |
| H01L 31/0352 | (2006.01) |
| H01L 31/068 | (2012.01) |

(52) U.S. Cl.
CPC .......... *H01L 29/0665* (2013.01); *B82Y 10/00* (2013.01); *H01L 29/0676* (2013.01); *H01L 31/03529* (2013.01); *H01L 31/035281* (2013.01); *H01L 31/068* (2013.01); *Y02E 10/547* (2013.01); *Y10T 428/249921* (2015.04)

(58) Field of Classification Search
CPC .......... G01N 33/582; G01N 33/54366; G01N 21/8483
USPC ............... 436/501; 435/283.1; 422/82.05
See application file for complete search history.

(56) References Cited

U.S. PATENT DOCUMENTS

| | | |
|---|---|---|
| 6,087,197 A | 7/2000 | Eriguchi et al. |
| 2008/0090183 A1 | 4/2008 | Zhu et al. |
| 2009/0316158 A1* | 12/2009 | Ash, III ............... 356/450 |
| 2010/0117108 A1* | 5/2010 | Gaebler et al. ........ 257/98 |
| 2010/0196695 A1* | 8/2010 | Garcia et al. ......... 428/323 |
| 2010/0323917 A1* | 12/2010 | Vertes et al. ........... 506/12 |

OTHER PUBLICATIONS

Li et al. "Bottom up assembly of large area nanowire resonator arrays" Nature Nanotech, 2008, 3: 88-92.*
Karabacak et al "Analysis of optical interferometric displacment detection in nanoelectromechanical systems" J Applied Physics, 2005, 98: 124309-1-9.*
Zhu et al "Optical absorption enhancement in amophous silicon nanowire and nanocone arrays" Nano Letters, 2009, 9(1):279-282.*
Hu et al., Analysis of Optical Absorption in Silicon Nanowire Arrays for Photovoltaic Applications In: American Chemical Society, Nano Letters, vol. 7, No. 11 , 2007.

* cited by examiner

*Primary Examiner* — Betty Forman
(74) *Attorney, Agent, or Firm* — Perkins Coie LLP

(57) ABSTRACT

Nanowire array structures based on periodic or aperiodic nanowires are provided in various configurations for sensing and interacting with light and substances to provide various functions such as sensors for detecting DNAs and others and solar cells for converting light into electricity.

20 Claims, 35 Drawing Sheets

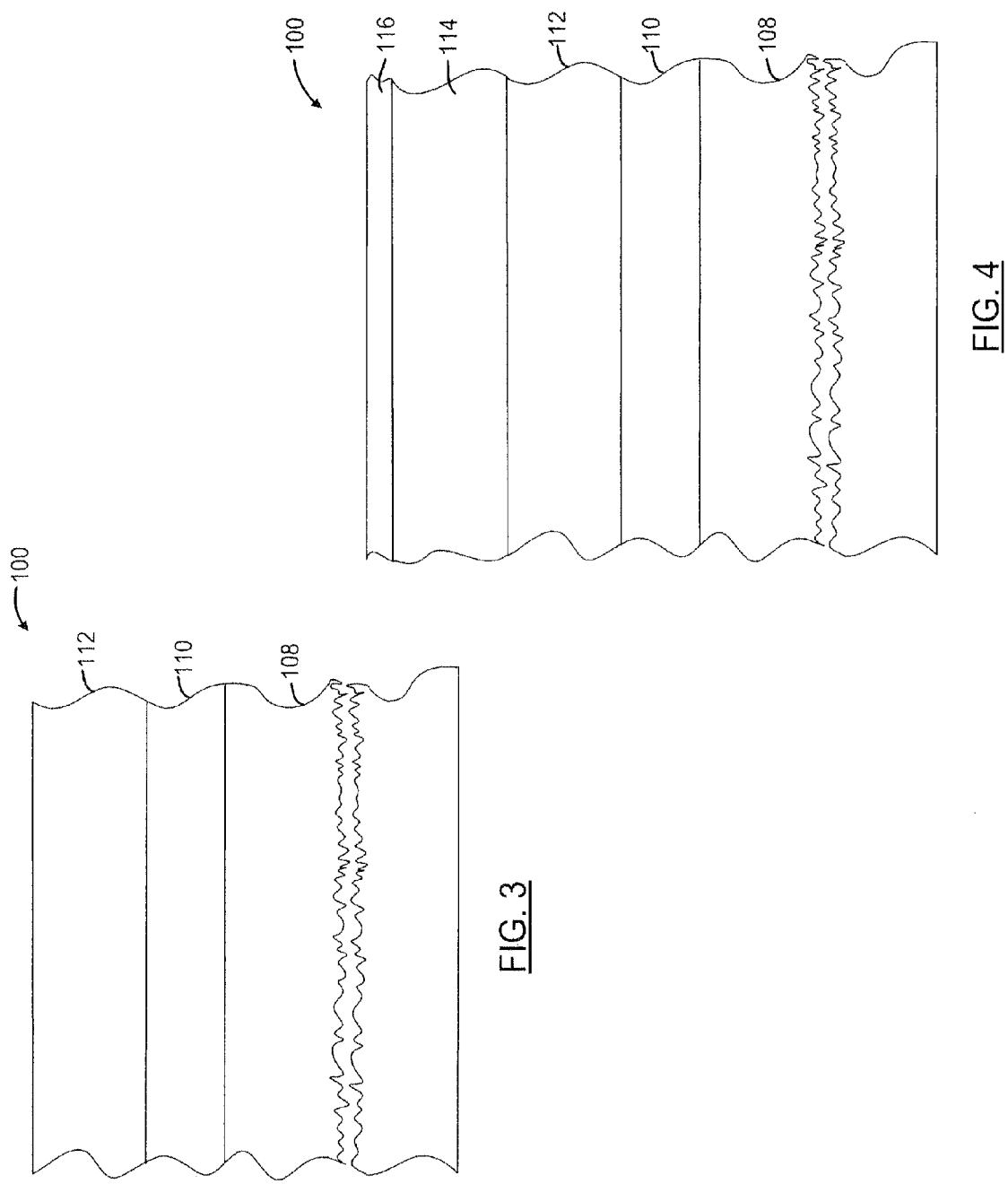

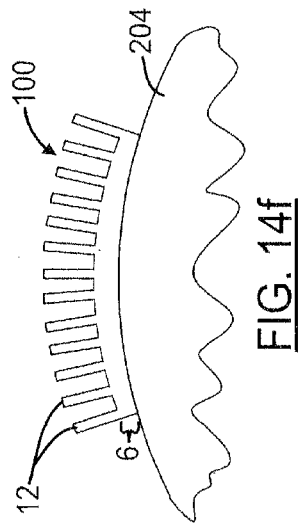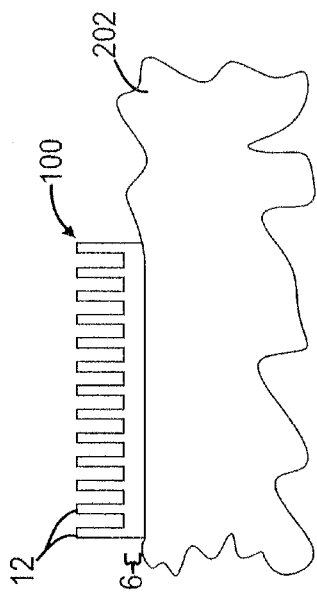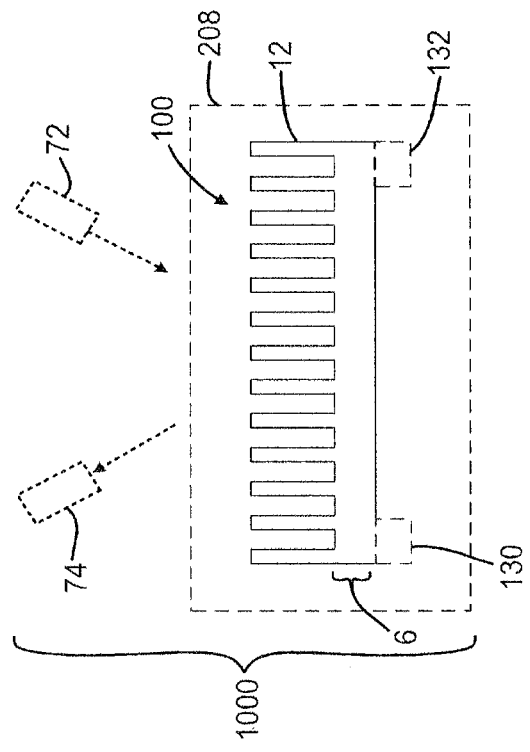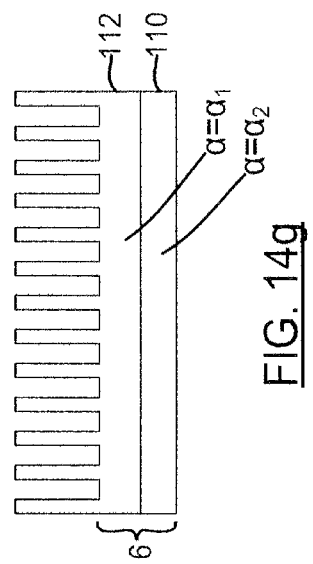

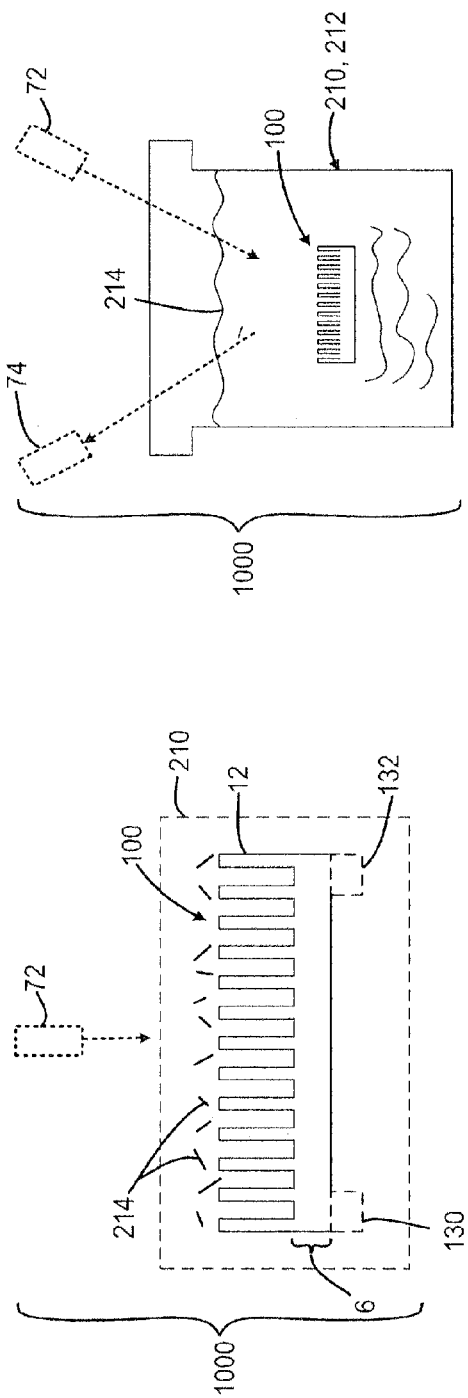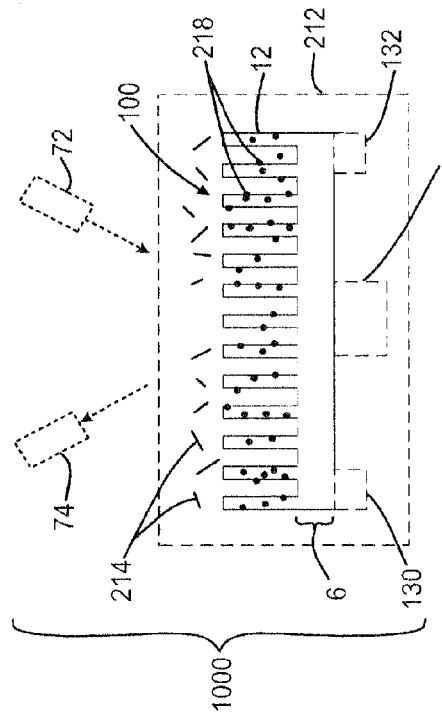

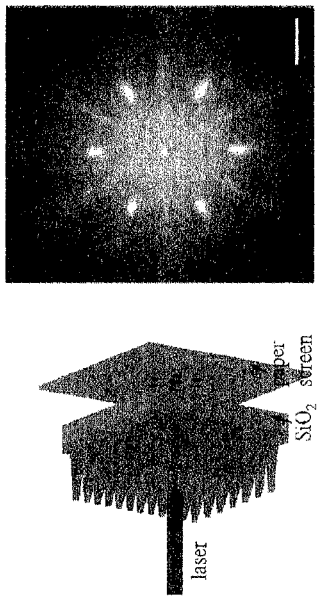
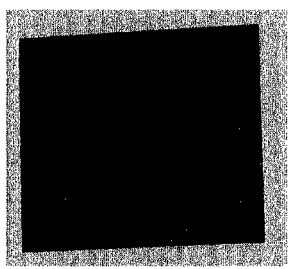
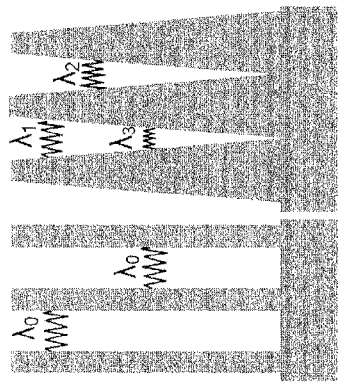
FIG. 21a
FIG. 21b
FIG. 21c
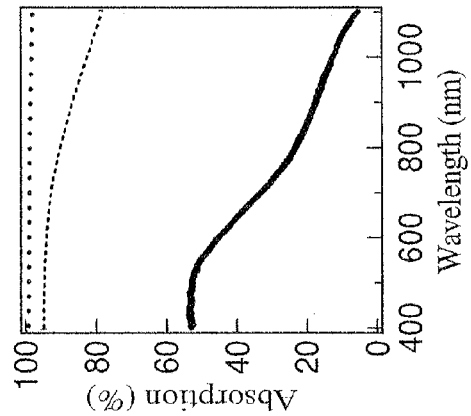
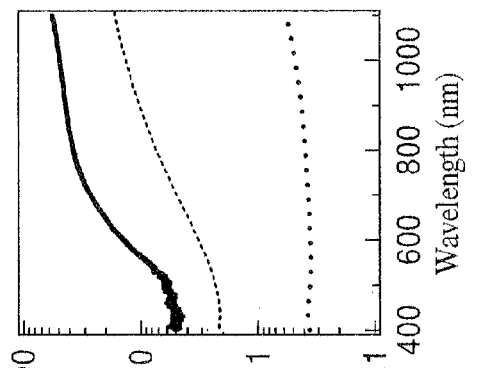
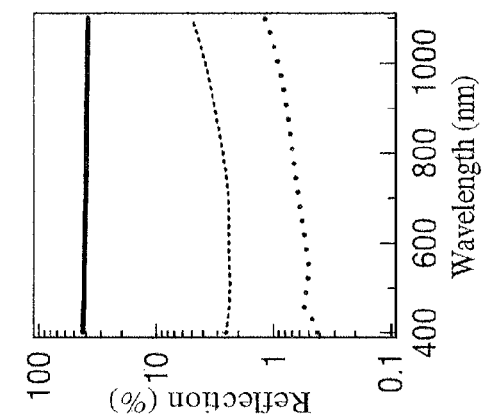
FIG. 21d
FIG. 21e
FIG. 21f

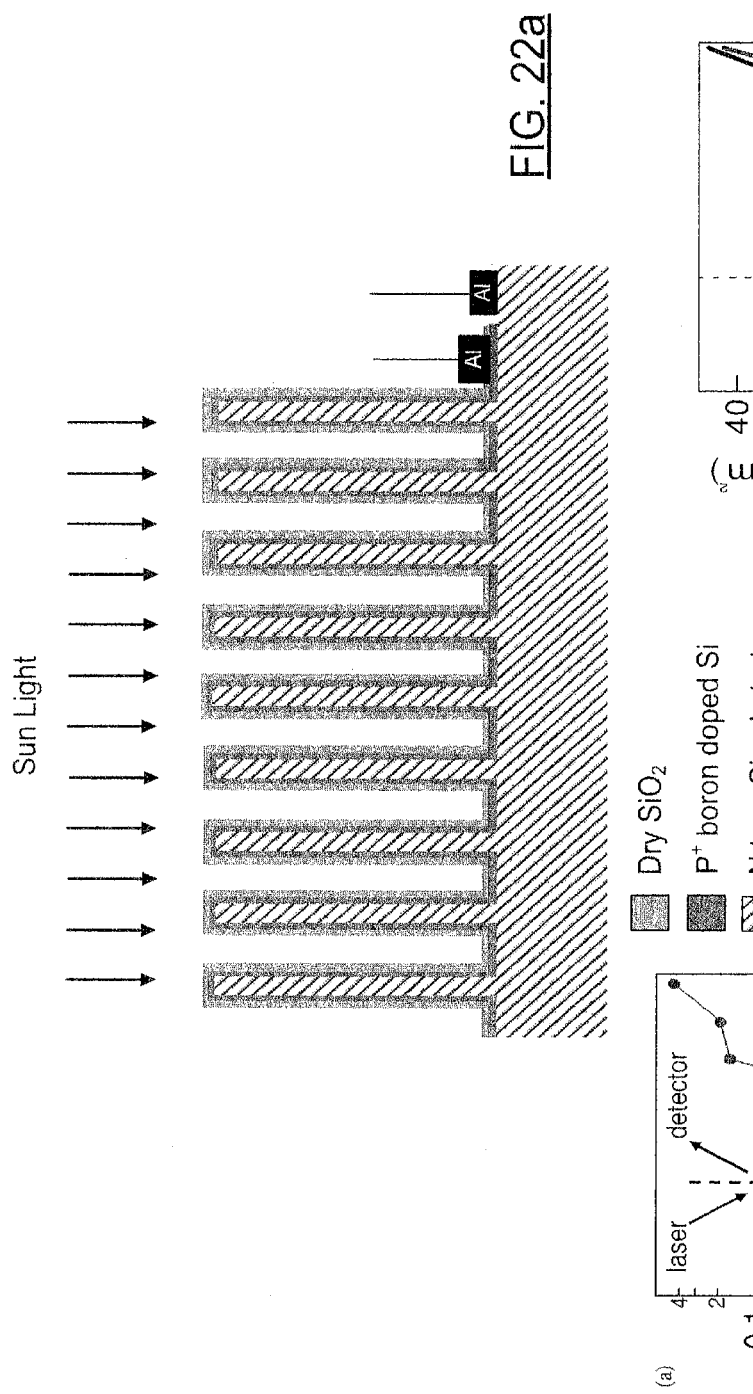

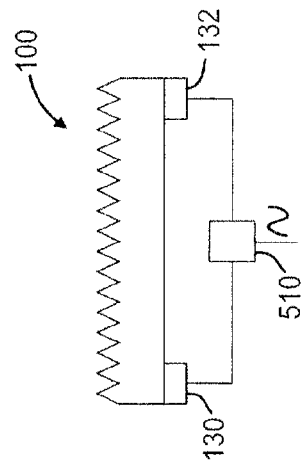
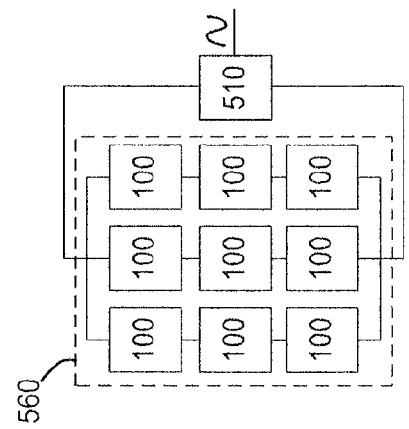
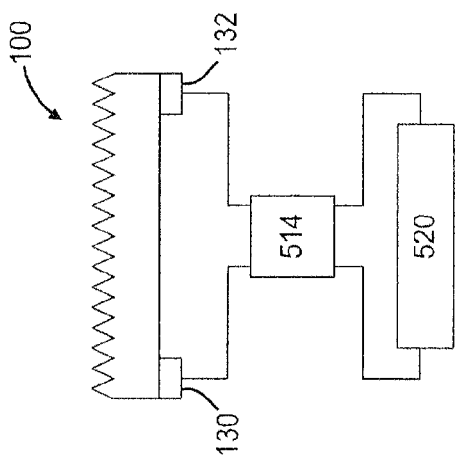

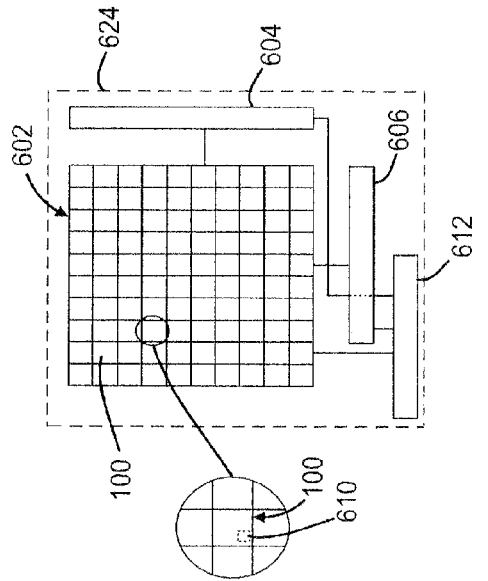
FIG. 28
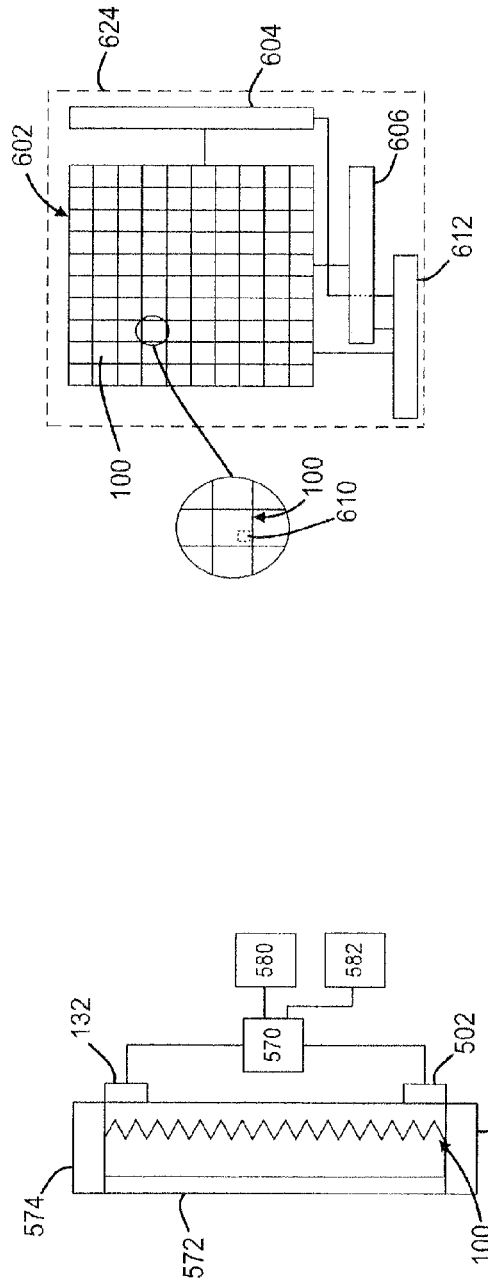
FIG. 29
FIG. 27

■ Si
■ SiO2

200 nm 100 nm

Fig. 54A
a
Fig. 54B
b
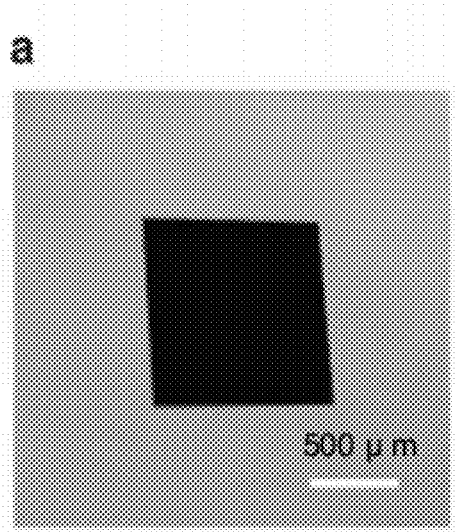
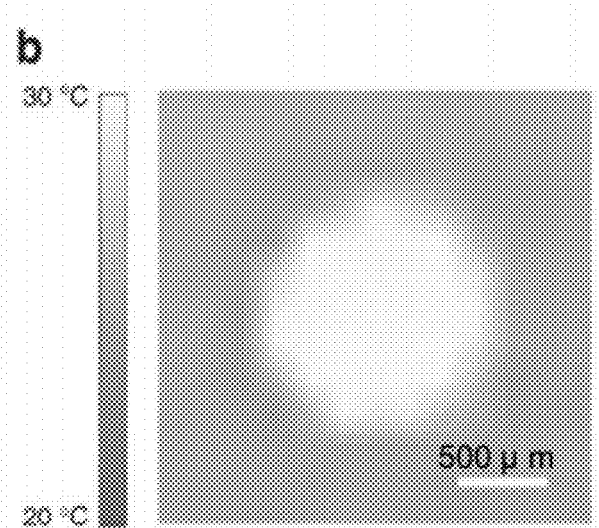
Fig. 54C
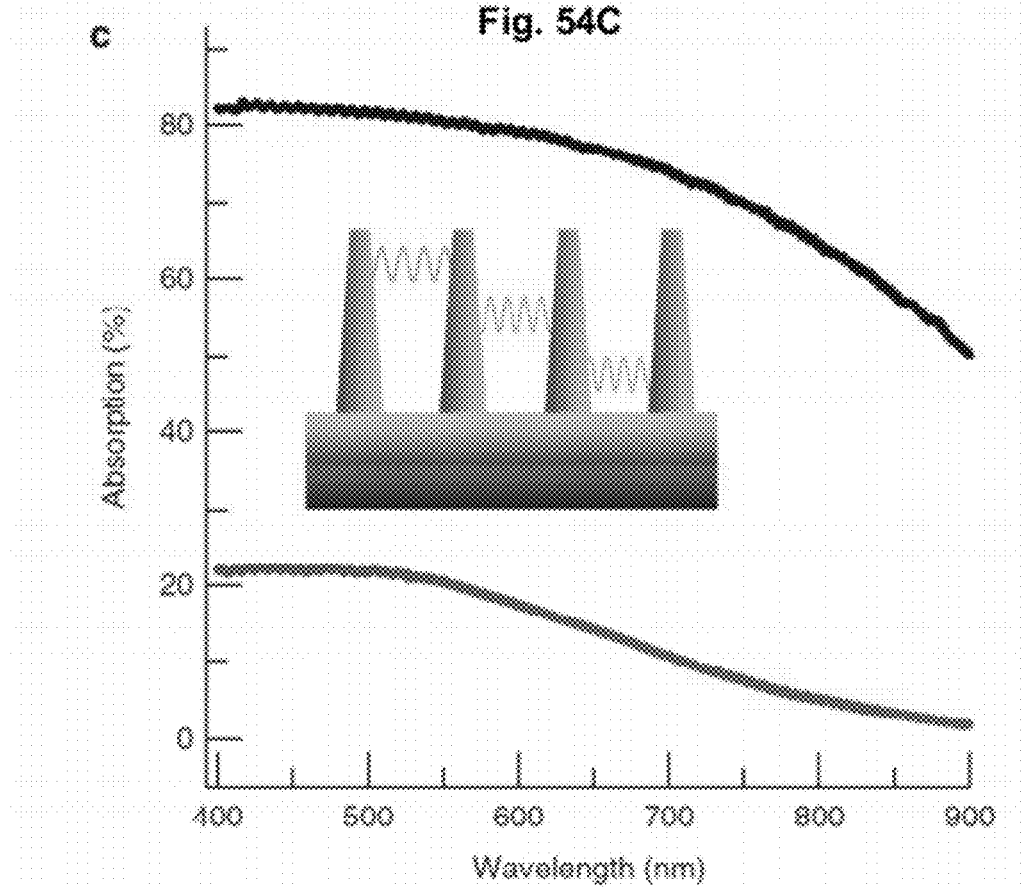

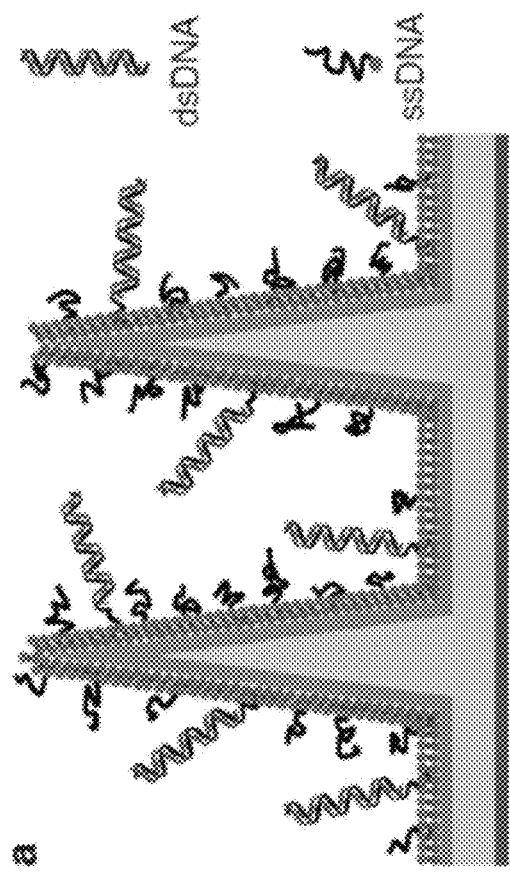
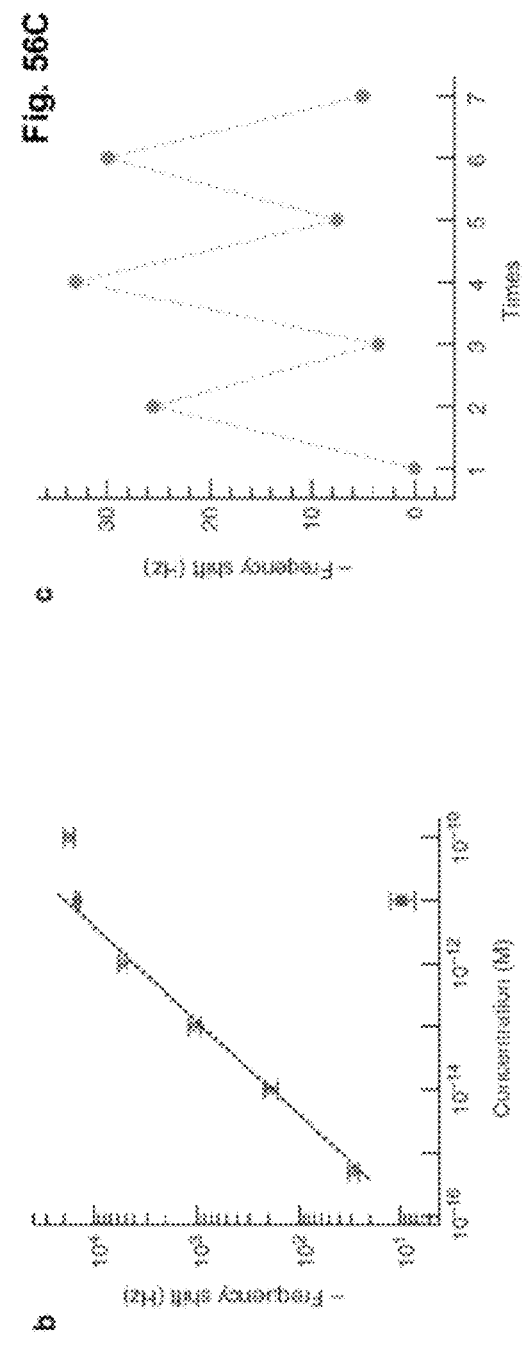
Fig. 56A
Fig. 56B
Fig. 56C

# NANOWIRE ARRAY STRUCTURES FOR SENSING, SOLAR CELL AND OTHER APPLICATIONS

CROSS REFERENCE TO RELATED APPLICATIONS

This application is a continuation-in-part of, and claims priority of, under 35 U.S.C. §120, the PCT application No. PCT/US2010/052971 entitled "METHOD AND APPARATUS INCLUDING NANOWIRE STRUCTURE" and filed Oct. 15, 2010 (published as PCT publication No. WO 2011/047359 on Apr. 21, 2011) which in turn claims priority under 35 U.S.C. §119 of U.S. Provisional Application No. 61/252,610, filed Oct. 16, 2009 entitled "Solar Cells Produced Through Radio Isotope Powered Electron Lithography." The entire disclosure of the above applications is incorporated herein by reference as part of this application.

BACKGROUND

Nanowires are high aspect-ratio objects which typically have widths in the sub-micron range.

Nanowire structures have been subject to investigation for a number of applications including solar energy collection, super hydrophobic surfaces, microelectronic components such as transistors and capacitive storage elements, sensor applications.

Various methods have been proposed for fabrication of nanowire structures including lithographic methods to define areas for etching and/or direct growth from solid, liquid or gas phase chemical sources.

Nanowires have high surface to volume ratio and have shown greatly enhanced response to different energy fluxes like electromagnetic waves, heat, acoustic, and fluids.

High aspect ratio nanowires with sharp tips can be advantageously used for generating high electric field emission. High aspect ratio nanowires can be fabricated by using growth control for realizing crystalline nanowires with minimal surface defects.

SUMMARY

This patent document discloses various nanowire structures and methods for fabrication of the same. A nanowire structure described here can be, for example, placed in a periodic or aperiodic array and such a nanowire structure can have characteristics that optimize performance of the structure for a particular application.

In one aspect, an apparatus is provided to include a plurality of nanowire pillars; a substrate supporting the plurality of nanowire pillars; wherein the plurality of nanowire pillars are arranged in a periodic array, the periodic array being a two dimensional periodic array; wherein the periodic array is characterized by a pillar to pillar pitch of less than about 800 nm; and wherein the periodic array is further characterized by a pillar aspect ratio of greater than about 5:1.

The above apparatus can be implemented to include one or more of the following features: the periodic array is characterized by a pillar shape having a base cross sectional area larger than a top cross sectional area; the periodic array is characterized by a conical pillar form; the periodic array is characterized by a frustoconical pillar form; the periodic array is characterized by bases of adjacent ones of the plurality of pillars being in contact with one another; the substrate comprising a single layer of material; the substrate comprises a plurality of layers of material; the substrate is provided by a flexible substrate; the periodic array is characterized by a pillar to pillar pitch of less than 600 nm; the periodic array is characterized by a pillar aspect ratio of greater than 20:1; the plurality of pillars are formed of semiconductor material; the plurality of pillars are formed of silicon; the plurality of pillars are vertically extending; or the structure is fabricated utilizing Radio Isotope Power Electron Lithography etching.

In another aspect, an apparatus is provided to include a plurality of nanowire pillars; a substrate supporting the plurality of nanowire pillars; wherein the plurality of nanowire pillars are arranged in a periodic array, the periodic array being a two dimensional periodic array;

wherein the periodic array is further characterized by a pillar aspect ratio of greater than about 5:1; and wherein the plurality pillars are configured so that the apparatus exhibits at least 90% absorption when exposed to electromagnetic radiation throughout the wavelength range of from about 400 nm to about 1000 nm.

The above apparatus can be configured to include one or more of the following features: the plurality of nanowire pillars are formed of silicon; pillars of the plurality of pillars define semiconductor p-n junctions for generating electrical current responsively to absorption of electromagnetic radiation; the plurality pillars are configured so that the apparatus exhibits at least 90% absorption when exposed to electromagnetic radiation throughout the wavelength range 400 nm to 1000 nm; or the plurality pillars are configured so that the apparatus exhibits at least 90% absorption when exposed to electromagnetic radiation throughout the wavelength range of from about 200 nm to about 1200 nm.

In another aspect, an apparatus is provided to include a plurality of nanowire pillars;
 a substrate supporting the plurality of nanowire pillars;
 wherein the plurality of nanowire pillars are arranged in a periodic array, the periodic array being a two dimensional periodic array;
 wherein the periodic array is configured so that the periodic array exhibits a reflectivity of at least 10% when exposed to electromagnetic radiation having a wavelength throughout the range of from about 200 nm to about 1000 nm; or
 the periodic array is configured so that the periodic array exhibits a reflectivity of at least 10% when exposed to electromagnetic radiation having a wavelength throughout the range 200 nm to 1000 nm.

In another aspect, an apparatus is provided to include
 a structure including a plurality of nanowire pillars;
 wherein the structure further includes a substrate supporting the plurality of nanowire pillars, the plurality of nanowire pillars being formed of semiconductor material;
 wherein the plurality of nanowire pillars are arranged in a periodic array, the periodic array being a two dimensional periodic array;
 wherein pillars of the plurality of pillars define semiconductor p-n junctions for generating electrical current responsively to absorption of electromagnetic radiation;
 the apparatus is configured so that the substrate is flexible, and wherein the apparatus is configured so that deformation of the substrate changes an absorptivity and reflectivity characteristic of the two dimensional array;
 the semiconductor p-n junctions are formed by doping the pillars using ion-implantation;
 the semiconductor p-n junction are formed by epitaxial growth;
 the semiconductor p-n junctions are formed by chemical vapor deposition;
 the apparatus further includes a passivation layer over the plurality of pillars;

the apparatus further includes a passivation layer over the plurality of pillars, and formed over the plurality of pillars by thermal oxidization for reduction of surface recombination errors;

the p-n junctions define a p region and an n region for the apparatus, and wherein the apparatus further includes a first electrode in contact with the p region and a second electrode in contact with the n region;

the semiconductor p-n junctions define an outer semiconductor junction region for the apparatus and inner semiconductor junction region for the apparatus, and wherein the outer semiconductor junction region is doped to a doping level on the order of at least 1018/cm3 wherein apparatus includes a passivation layer adjacent the outer semiconductor junction region, the apparatus further having an electrode in contact with the outer semiconductor region;

the plurality of pillars are configured so that the plurality of pillars exhibit at least 90% absorption when exposed to electromagnetic radiation throughout the wavelength range 400 nm to 1000 nm;

the plurality of pillars are configured so that the plurality of pillars exhibit at least 90% absorption when exposed to electromagnetic radiation throughout the wavelength range 200 nm to 1200 nm;

including an inverter for transforming direct current output from the structure into alternating current;

the pillars are formed of silicon and configured to be at least 90% absorptive throughout the wavelength range 400 nm to 1000 nm; or the pillars are formed of silicon and configured to be at least 90 % absorptive of electromagnetic radiation throughout the wavelength range 400 nm to 1000 nm, the apparatus further including a filter for filtering electromagnetic radiation in the visible wavelength band.

In another aspect, an apparatus is provided to include a photodetector array comprising a plurality of photosite picture elements;

wherein a characteristic photosite picture element of the photodetector array includes a nanowire structure having an array of nanowire pillars, wherein the nanowire structure of the characteristic photosite picture element is configured to output an electrical signal responsively to an absorption of electromagnetic radiation by the array of nanowire pillars;

further comprising an imaging lens for focusing an image onto the photodetector array;

further comprising an imaging lens for focusing an image onto the photodetector array, and a filter that filters visible light disposed in an optical receive path of the apparatus;

pillars of the array of nanowire pillars of the characteristic photosite picture element are formed of silicon and wherein the array of nanowire pillars of the characteristic photosite picture element is configured to be at least 90 % absorptive electromagnetic radiation through the wavelength range of 400 nm to 1000 nm;

the array of nanowire pillars of the characteristic photosite picture element is configured to be at least 90 % absorptive electromagnetic radiation through the wavelength range of 200 nm to 1200 nm, and wherein the apparatus further includes a filter that filters visible light disposed in an optical receive path of the apparatus; or the nanowire structure of the characteristic photosite picture element of the photodetector array includes first and second regions defining first and second nanowire pillar arrays, the first and second nanowire pillar arrays being differentiated by one or more of pitch and form.

In another aspect, an apparatus is provided to include a nanowire structure having a plurality of nanowire pillars;

wherein the nanowire structure further includes a substrate supporting the plurality of nanowire pillars;

wherein the plurality of nanowire pillars are arranged to define a two dimensional array of nanowire pillars;

wherein the apparatus is configured so that the substrate is flexible, and wherein the apparatus is further configured so that deformation of the substrate changes an absorptivity and reflectivity of pillars included in the two dimensional array;

the two dimensional array is configured to exhibit at least 90% absorption through the wavelength range of between 400 nm and 1000 nm;

the two dimensional array is configured to exhibit a reflectivity of at least 10% through the electromagnetic wavelength range of between 200 nm and 1000 nm;

the flexible substrate is a single layer silicon substrate that is of unitary construction with the plurality of pillars;

the flexible substrate includes a plurality of layers, the plurality of layers including a first layer and an adjacent second layer, the first layer having a coefficient of thermal expansion different from a coefficient of thermal expansion of the second layer;

the array of nanowire pillars is fabricated by providing using an Si/SiO2/Si wafer, etching the top Si layer to form the nanowire pillars and etching to remove a portion of the bottom Si layer;

the apparatus includes an electromagnetic radiation source for radiating pillars of the plurality of nanowire pillars;

the apparatus includes a detector for detecting light reflected from pillars of the plurality of nanowire pillars;

the apparatus includes a mechanical actuator for moving the substrate;

the apparatus is configured so that when the substrate deforms, a spacing of pillars of the plurality of nanowire pillars changes;

the apparatus is configured so that when the substrate deforms, an angle of pillars of the plurality of nanowire pillars changes;

the structure has a first region defining a first array of nanowire pillars and a second region defining a second array of nanowire pillars, the first region and the second region being differentiated based on one or more of pillar pitch, pillar form, and pillar orientation, and pillar periodic/aperiodic classification; or the two dimensional array is configured to exhibit at least 90 % absorption through the wavelength range of between 200 nm and 1200 nm.

In another aspect, a method is provided to include providing a structure including a plurality of nanowire pillars, the providing including providing the plurality of nanowire pillars to be arranged on a substrate in a two dimensional array, the providing including providing the structure so that pillars included in the plurality of nanowire pillars exhibit an absorptivity and reflectivity characteristic that is responsive to a force imparted to the structure;

receiving at the structure a force imparted to the structure so that an absorptivity and reflectivity characteristic of pillars included in the plurality of nanowire pillars changes from a first characteristic to a second characteristic;

the method includes detecting an absorptivity and reflectivity of the pillars when the force is received at the structure, the absorptivity and reflectivity indicating a characteristic of the force imparted to the structure;

the providing includes providing the structure to that a visible color exhibited by the pillars is responsive to a force imparted to the structure, and wherein the method includes visually observing an exhibited color profile of the pillars when the force is received at the structure;

the providing includes providing the structure to output an electrical signal responsively to a force being imparted to the structure, the method includes outputting an electrical signal indicative of the force received at the structure; or the providing includes providing the structure with a larger apparatus defining a sealed cavity that provides a pressure reference.

In another aspect, a method is provided to include providing a structure including a plurality of nanowire pillars, the providing including providing the plurality of nanowire pillars to be arranged on a substrate in a two dimensional array, the providing including providing the structure so that pillars included in the plurality of nanowire pillars exhibit an absorptivity and reflectivity that is responsive to a temperature in an environment of the structure;

exposing the structure to an environment of a certain temperature so that absorptivity and reflectivity of pillars included in the plurality of nanowire pillars is indicative of the certain temperature of the environment;

the method includes detecting an absorptivity and reflectivity characteristic of the pillars when the structure is exposed to the environment, the absorptivity and reflectivity characteristic indicating the certain temperature of the environment;

the providing includes providing the structure so that a visible color exhibited by the pillars is responsive to a temperature of the structure, and wherein the method includes visually observing an exhibited color profile of the pillars when the structure is exposed to the environment of the certain temperature;

the providing includes providing the structure to output an electrical signal responsively to a temperature of an environment of the structure, the method including outputting an electrical signal indicative of the certain temperature of the environment to which the structure is exposed;

the providing includes providing the structure so that the pillars include semiconductor p-n junctions for generating an electrical signal responsively to a temperature of an environment of the structure, the providing including providing the structure so that the substrate deforms responsively to a temperature in an environment of the structure. the method including generating an electrical signal indicative of the certain temperature of the environment to which the structure is exposed;

the providing includes providing the substrate to include first and second layers of material having different coefficients of thermal expansion; or the providing includes providing the structure so that the pillars exhibit a spacing change responsively to the structure being exposed to an environment undergoing a temperature change.

In another aspect, a method is provided to include providing a structure including a plurality of nanowire pillars arranged in a two dimensional array on a substrate in thermal communication with the plurality of nanowire pillars, wherein pillars included in the plurality of nanowire pillars are configured to absorb electromagnetic radiation;

directing electromagnetic radiation toward the pillars to induce thermal expansion of the substrate and movement of the plurality of nanowire pillars;

the directing includes directing light from a light source onto the pillars;

the directing includes directing light from a light source onto the pillars, the light having an amplitude that is modulated at a frequency corresponding to a mechanical resonance of the structure;

the directing includes directing amplitude modulated light from a light source onto the pillars, the light source being amplitude modulated at a frequency that corresponds to a mechanical resonance frequency of the substrate;

the method further includes sensing reflected light reflected from the pillars;

the method further includes directing amplitude modulated radiation from an electromagnetic radiation source to the pillars and detecting reflected modulated radiation from the electromagnetic radiation source reflected from the pillars;

the providing includes providing the structure so that a certain substance if present in an environment will attach to the pillars, the method further including exposing the pillars to an environment, wherein the directing includes directing modulated light from a light source modulated at certain frequency corresponding to the mechanical resonance frequency of the substrate if the pillars have the substance attached thereto, and wherein the method further includes sensing reflected light of the light source reflected from the pillars for determination of whether the environment includes the substance;

the pillars include an attractant that is sensitive to a specific substance;

the pillars include an attractant provided by an antibody for attracting an antigen;

the pillars include an attractant provided by an oxide for attracting a certain gaseous molecule;

the pillars include an attractant provided by a DNA sequence for attracting a certain DNA sequence;

the providing includes providing the structure so that a certain substance if present in an environment will attach to the pillars, the method further including exposing the pillars to an environment, wherein the directing includes directing amplitude modulated light from a light source modulated at certain frequency corresponding to the mechanical resonance frequency of the substrate if the pillars have the substance attached thereto, and wherein the method further includes sensing reflected light of the light source reflected from the pillars for determination of whether the environment includes the substance;

the providing includes providing the structure so that a certain substance if present an environment will attach to the pillars, the method further including exposing the pillars to an environment, wherein the directing includes directing amplitude modulated light from a light source modulated at a sweep of frequencies including a certain frequency corresponding to the mechanical resonance frequency of the substrate if the pillars have the substance attached thereto, and wherein the method further includes sensing reflected light of the light source reflected from the pillars for determination of whether the environment includes the substance; or the providing includes providing the substrate to include first and second layers of material having different coefficients of thermal expansion.

In another aspect, a method for determining a strain exhibited by a deformable body, the method comprising: is provided to include providing a deformable nanowire structure having a plurality of nanowire pillars arranged in a two dimensional array of nanowire pillars, the deformable nanowire structure having a substrate supporting the plurality of nanowire pillars;

disposing the deformable nanowire structure so that a deformation of the deformable body is translated to deform the deformable nanowire structure; and observing a change in absorptivity and reflectivity of pillars included in the plurality of nanowire pillars;

the providing includes providing the deformable nanowire structure so that the two dimensional array is a periodic two dimensional array;the disposing includes disposing the deformable nanowire structure so that the substrate is adjacent the deformable body;

the providing includes providing the deformable nanowire structure so that a visible color exhibited by the pillars is responsive to a deformation of the nanowire structure, and wherein the observing includes visually observing the pillars;

the observing includes detecting a change in absorptivity and reflectivity of the pillars by detecting reflected electromagnetic radiation reflected from the pillars;

the providing includes providing the nanowire structure so that the nanowire structure outputs an electrical signal responsively to electromagnetic radiation absorbed by the pillars, and wherein the detecting includes outputting an electrical signal from the nanowire structure;

the disposing includes disposing the deformable nanowire structure so that a deformation of an animal body is translated to the deformable nanowire structure.

In yet another aspect, a method for determining a curvature of a curved body, the method is provided to include providing a deformable nanowire structure having a plurality of nanowire pillars arranged in a two dimensional array of nanowire pillars, the deformable nanowire structure having a substrate supporting the plurality of nanowire pillars, the deformable nanowire structure being configured so that the plurality of nanowire pillars have a first absorptivity and reflectivity when in an unstressed state, and an absorptivity and reflectivity different from the first absorptivity and reflectivity when in a deformed state;

disposing the deformable nanowire structure so that the deformable nanowire structure conforms to a curved surface of the curved body; and observing absorptivity and reflectivity of pillars included in the plurality of nanowire pillars;

the providing includes providing the deformable nanowire structure so that the two dimensional array is a periodic two dimensional array;

the disposing includes disposing the deformable nanowire structure so that the substrate is adjacent the curved body;

the providing includes providing the deformable nanowire structure so that a visible color exhibited by the pillars is responsive to a deformation of the nanowire structure, and wherein the observing includes visually observing the pillars;

the observing includes detecting a change in absorptivity and reflectivity of the pillars by detecting reflected electromagnetic radiation reflected from the pillars;

the providing includes providing the deformable nanowire structure so that the nanowire structure outputs an electrical signal responsively to electromagnetic radiation absorbed by the pillars, and wherein the detecting includes outputting an electrical signal from the nanowire structure;

the disposing includes disposing the deformable nanowire structure so that the deformable nanowire structure conforms to a curved body provided by an animal body part; or the disposing includes disposing the deformable nanowire structure so that the deformable nanowire structure conforms to a curved body provided by an animal eye.

In another aspect, a sensing method for detecting a substance is provided to include placing a nanowire array of nanowires having at least two different layers with different thermal properties in contact with a target substance to be detected, to cause an amount of the target substance to attach to the nanowires of the nanowire array;

directing a temporally modulated optical beam of light to the nanowire array to cause optical absorption of the modulated light in the nanowire array and modulated bending of the nanowire array;

measuring a resonance frequency of the modulated bending with the attached target substance of the nanowire array;

determining a shift in a resonance frequency due to attachment of the target substance from a reference resonance frequency of the modulated bending without having the attached target substance; and using the shift in the resonance frequency to determine the amount of the target substance;

the nanowires are functionalized to selectively attach to the target substance via specific binding;

the target substance is a DNA;

setting a modulation frequency of the temporally modulated optical beam at an acoustic frequency to use the modulated bending to shake off materials or particles that are attached to the nanowires via non-specific binding while maintaining the target substance attached to the nanowires; or detecting reflected or scattered light from the nanowire array to measure the resonance frequency of the modulated bending.

BRIEF DESCRIPTION OF DRAWINGS

Features described herein can be better understood with reference to the drawings described below. The relative dimensions of features depicted in the drawings herein represent specific embodiments of the described technology. However, it is understood that apparatus, systems, and methods herein can be provided with use of relative dimensions other than those specifically set forth in the drawings. In the drawings, like numerals are used to indicate like parts throughout the various views.

FIGS. 3-10 are side schematic views illustrating fabrication of a nanowire pillar array in one embodiment;

FIG. 14e is a schematic diagram illustrating an application wherein a structure including a nanowire pillar array is utilized as a strain gauge;

FIG. 14e is a schematic diagram illustrating an application wherein a structure including a nanowire pillar array is utilized as a curvature sensor;

FIG. 14g is a schematic side view illustrating a nanowire structure having a flexible substrate that includes layers having different respective coefficients of thermal expansion;

FIG. 14h is a schematic side view illustrating an application wherein a structure having a nanowire pillar array is disposed in environment for sensing of a temperature of the environment;

FIG. 14i is a schematic side view illustrating an application wherein a structure having a nanowire pillar array is disposed in environment and then remotely activated to cause movement of the structure and corresponding movement a substance in the environment;

FIG. 14j is a schematic side view illustrating an application wherein a structure having a nanowire pillar array is disposed in environment comprising a liquid and defined by a liquid carrying vessel;

FIG. 14k is a schematic side view illustrating an application wherein a structure having a nanowire pillar array is disposed in environment for sensing a presence of a substance in the environment;

FIG. 16b illustrates a top view of a resist as shown in FIG. 15a;

FIG. 21a is a schematic diagram illustrating a transmitted diffraction pattern for a frustoconical nanowire pillar array;

FIG. 21b is a photograph of a structure having a frustoconical nanowire pillar array;

FIG. 21c is a schematic diagram illustrating a light trapping mechanism for a cylindroid nanowire pillar array and for a frustoconical nanowire pillar array;

FIG. 21d is a diagram illustrating a measured reflection sprectra for a frusto conical nanowire pillar array, a cylindroid nanowire pillar array and a control silicon sample;

FIG. 21e is a diagram illustrating a measured transmission spectra for a frusto conical nanowire pillar array, a cylindroid nanowire pillar array and a control silicon sample;

FIG. 21f is a diagram illustrating a measured absorption spectra for a frusto conical nanowire pillar array, a cylindroid nanowire pillar array and a control silicon sample;

FIG. 22a is a schematic side diagram illustrating fabrication of nanowire structure configured to output an electrical signal responsively to absorbed electromagnetic radiation;

FIG. 22b is a diagram illustrating test data for various samples wherein pitch is varied for the samples;

FIG. 22c is a diagram illustrating test data for a sample having a pitch of 400 nm.

FIG. 24 is a schematic diagram illustrating an apparatus having a nanowire structure and a battery recharging circuit, the nanowire structure including an array of nanowire pillars;

FIG. 25 is a schematic diagram illustrating an apparatus having a structure including a nanowire pillar array and an inverter;

FIG. 26 is a schematic diagram illustrating an apparatus having an array of nanowire structures coupled to an inverter, each structure including an plurality of nanowire pillars arranged in an array;

FIG. 27 is a schematic diagram illustrating an Infrared light detecting apparatus incorporating a structure having an array of nanowire pillars;

FIG. 28 is a schematic diagram illustrating a photodetector array apparatus incorporating nanowire pillar arrays;

FIG. 29 is a schematic diagram illustrating an imaging apparatus including a photodetector array incorporating nanowire pillar arrays;

FIGS. 54A, 54B and 54C show enhanced broad-band light absorption measurements for a photonic crystal NW array as part of a sensitive sensor device such as a DNA sensor.

In FIG. 55A, intensity-modulated light was used to actuate the membrane resonator and the vibration responses were measured using PolyTec interferometer with phase-locked loop. In FIG. 55B, Si/SiO2-bending moments were induced by heating from the modulated laser due to the thermal expansion coefficient differences between the bilayer materials. The periodic temperature difference (Δ T Si) necessary for device excitation is expected to be <0.1° C. In FIG. 55C, measured amplitude and phase of the resonator's response show a mode resonance at 7.76314 MHz. This mode has a high quality factor up to Q ~3.2×10$^5$. In FIG. 55D, measured standing-wave vibration amplitude 2D mapping pattern of the mode in FIG. 55C. During mapping, the optical actuation frequency was fixed at the resonance mode and the interferometer laser gun was controlled by a stage controller for lateral movement with sub 0.5 μm lateral resolution.

FIGS. 56A, 56B and 56C show an example of a NW array resonator functionalized to demonstrate a sensitive DNA sensor.

DETAILED DESCRIPTION

Figure 2:
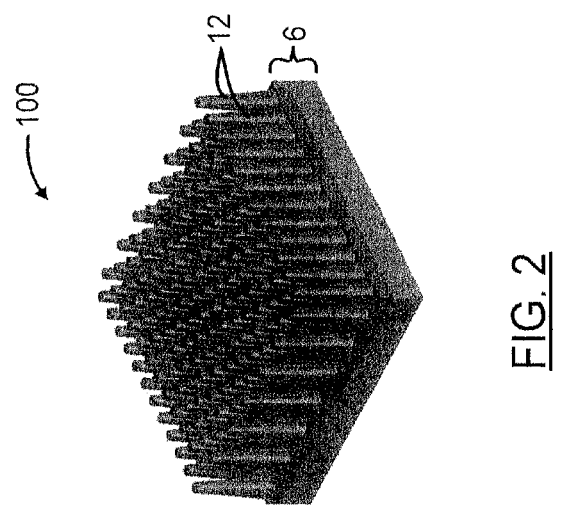
FIG. 2 is a perspective view of a nanowire structure apparatus including a periodic nanowire pillar array.
Figure 1:
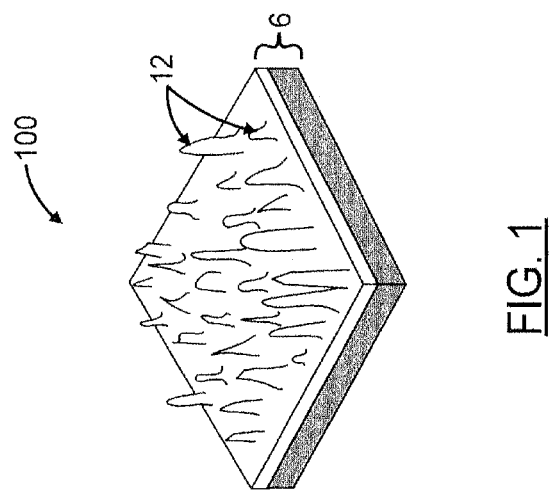
FIG. 1 is a perspective view of a nanowire structure apparatus including an aperiodic nanowire pillar array having nanowire pillars with randomized pillar pitch and form.

A nanowire structure herein can have characteristics that optimize performance of the structure for a particular application. Nanowire structure 100 in FIGS. 1 and 2 can include a plurality of pillars 12 distributed in an array arranged on a substrate 6, which can be single layer or multi layer, rigid, or flexible. In the embodiment of FIG. 1 nanowire structure 100 includes an aperiodic array. In the embodiment as shown in FIG. 2, nanowire structure 100 includes a periodic array. FIGS. 1 and 2 illustrate two dimensional arrays of nanowire pillars. Referring to further aspects of a structure 100 as set forth herein, a nanowire pillar can have a top, a base adjacent to substrate 6, and a body intermediate the top and base. A pitch of a nanowire pillar array can be regarded as a distance between respective axial centers of adjacent pillar bases. A spacing can be regarded as a distance between adjacent pillar bodies. A structure that is undergoing deformation by bending of a flexible substrate can have a constant pitch but a changing spacing.

Figure 6:
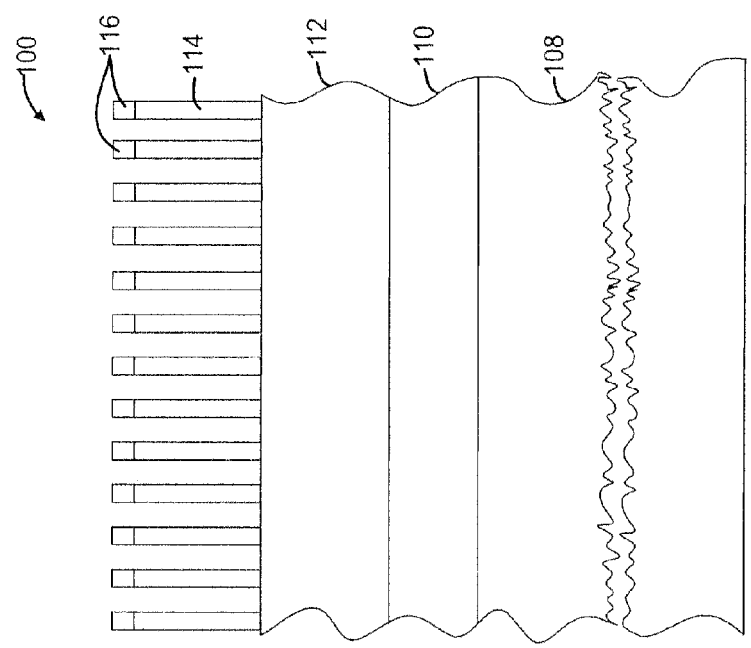
Figure 5:
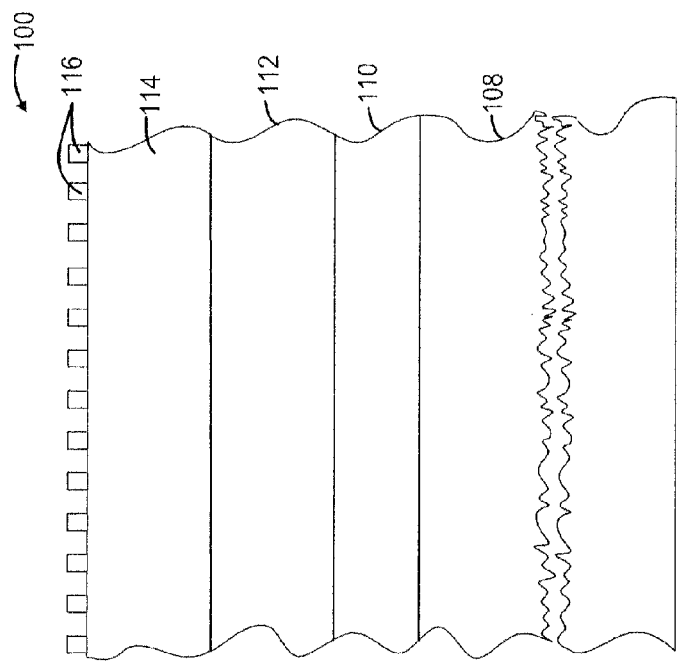
Figure 8:
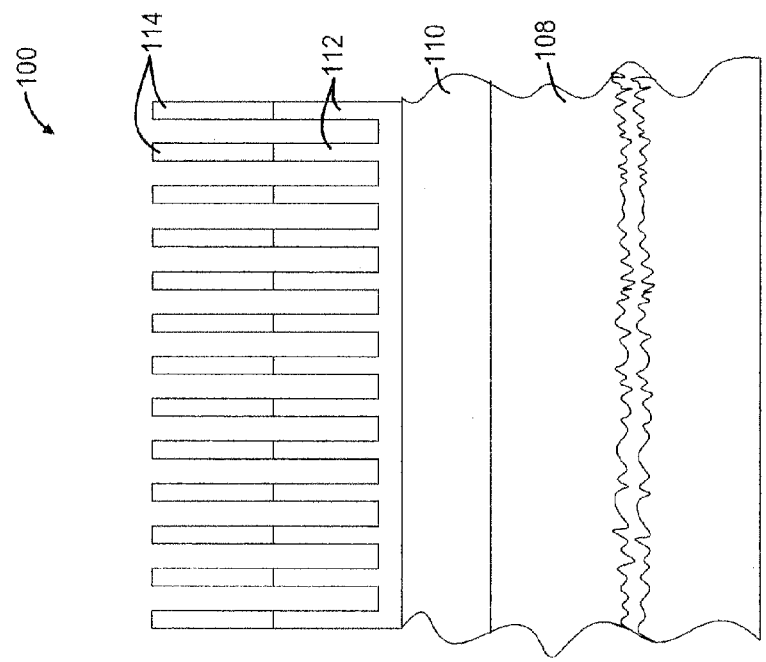
Figure 7:
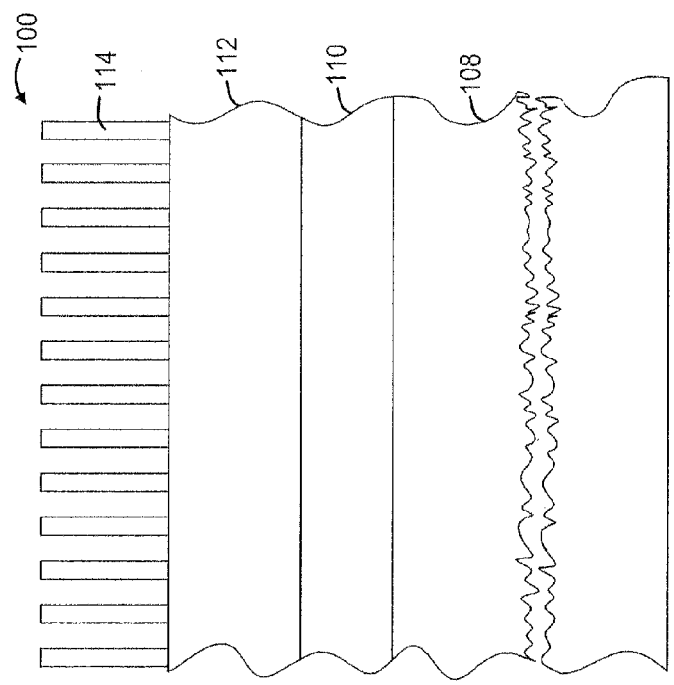
Figure 9:
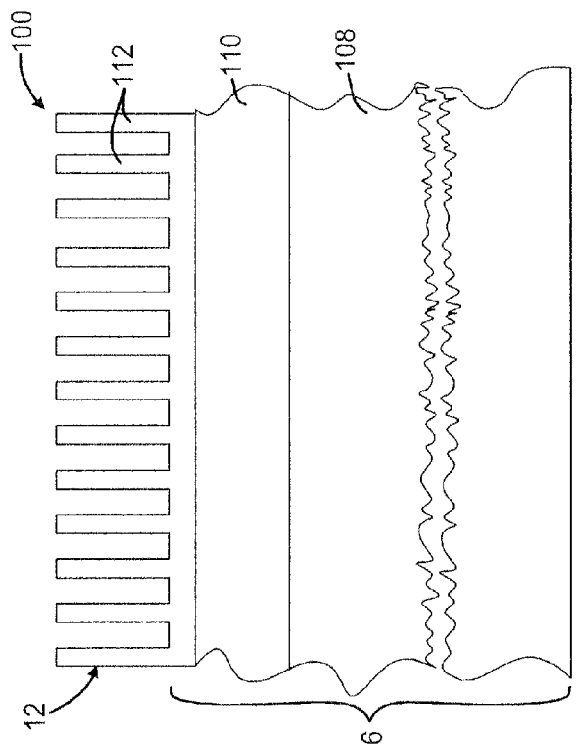
Figure 10:
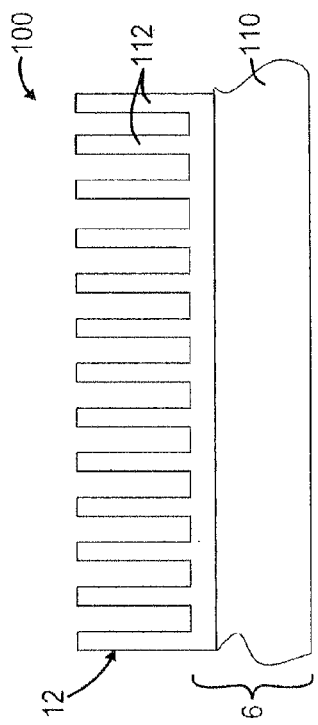

Referring now to FIGS. 3-10 an exemplary method for fabrication of a nanowire structure is described. Referring specifically to structure 100 as shown in FIG. 3, an Si (Si/SiO$_2$/Si) starting wafer can be provided having Si layer 108, SiO$_2$ layer 110, and Si layer 112. Typical thicknesses for the layers can be, e.g., layer 108, 400 μm, layer 110, 3 μm, and layer 112, 2 μm. As shown in FIG. 4, SiO$_2$ layer 114 can be formed over layer 112 and ebeam resist layer 116 can be formed over layer 114. In one embodiment, layer 114 can be formed via thermal oxidation, and layer 116 can be formed by spin coating. Resist layer 116 can be patterned as shown in FIG. 5. The patterning as shown in FIG. 5 can be performed, e.g., by electron beam lithography, nano-imprint lithography, or by electron lithography, e.g., Radio Isotope Power Electron Lithography etching with use of a mask as will set forth in greater detail herein. With structure 100 in the form as shown in FIG. 5, the structure 100 can be subject to further etching using the resist layer 116 as a mask to yield the structure as shown in FIG. 6. Such etching can comprise Reactive Ion Etching (RIE). Resist layer 116 can then be removed to yield the structure 100 as shown in FIG. 7. With the structure 100 in the form as shown in FIG. 7, structure 100 can be subject to further etching using SiO$_2$ layer as a mask to yield the structure as shown in FIG. 8. Such further etching in which layer 114 is used as a mask can comprise RIE etching. As shown in FIG. 9, layer 114 can be removed to yield the structure as shown in FIG. 9. Structure 100 can then be made flexible. For making structure 100 flexible, layer 108 can be removed to yield the structure 100 as shown in FIG. 10.

While Si starting wafers are exemplary, other starting materials can be utilized, e.g., Gallium Arsenide, GaAs, Gallium Nitride, GaN, SiC, diamond, poly-silicon, and organic semiconductors. Processes other than lithographic definition of a protective layer followed by etching the semiconductor through holes in the protective layer can be utilized in the fabrication of structure 100. For example, epitaxial growth fabrication technologies can be utilized in other fabrications of pillars 12. Nanowire pillars 12 as set forth herein can be formed of the following exemplary materials: Diamond, Silicon, Germanium, Silicon carbide, Silicon carbide, Silicon carbide, Silicon-germanium, Aluminium antimonide, Aluminium arsenide, Aluminium nitride, Aluminium phosphide, Boron nitride, Boron nitride, Boron nitride, Boron phosphide, Boron arsenide, Boron arsenide, Gallium antimonide, Gallium arsenide, germanium, Gallium nitride, Gallium phosphide, Indium antimonide, Indium arsenide, Indium nitride, Indium phosphide, Aluminium gallium arsenide, Indium gallium arsenide, Indium gallium phosphide, Aluminium indium arsenide, Aluminium indium antimonide, Gallium arsenide nitride, Gallium arsenide phosphide, Gallium arsenide antimonide, Aluminium gallium nitride, Aluminium gallium phosphide, Indium gallium nitride, Indium arsenide antimonide, Indium gallium antimonide, Aluminium gallium indium phosphide, Aluminium gallium arsenide phosphide, Indium gallium arsenide phosphide, Indium gallium arsenide antimonide, Aluminium indium arsenide phosphide, Aluminium gallium arsenide nitride, Indium gallium arsenide nitride, Indium aluminum arsenide nitride, Gallium arsenide antimonide nitride, Gallium indium nitride arsenide antimonide, Gallium indium arsenide antimonide phosphide, Cadmium selenide, Cadmium sulfide, Cadmium telluride, cadmium telluride photovoltaics, polysilicon, Zinc oxide, magnesium oxide, cadmium oxide, indium tin oxide, random lasers, Zinc selenide, Zinc sulfide, Zinc telluride, lithium niobate, terahertz radiation, Cadmium zinc telluride, Mercury cadmium telluride, mercury telluride, Mercury zinc telluride, Mercury zinc selenide, Cuprous chloride, Copper sulfide, Lead selenide, Lead(II) sulfide, Lead telluride, Tin sulfide, Tin sulfide, Tin telluride, Lead tin telluride, Thallium tin telluride, Thallium germanium telluride, Bismuth telluride, Cadmium phosphide, Cadmium arsenide, Cadmium antimonide, Zinc phosphide, Zinc arsenide, Zinc antimonide, Titanium dioxide, Titanium dioxide, Titanium dioxide, Copper(I) oxide, Copper(II) oxide, Uranium dioxide, Uranium trioxide, Bismuth trioxide, Tin dioxide, Barium titanate, Ferroelectric, piezoelectric, nonlinear optics, Strontium titanate, Ferroelectric, piezoelectric, Lithium niobate, Lanthanum copper oxide, Lead(II) iodide, Molybdenum disulfide, Gallium selenide, Tin sulfide, Bismuth sulfide, Gallium manganese arsenide, Indium manganese arsenide, Cadmium manganese telluride, Lead manganese telluride, Lanthanum calcium manganate, Iron(II) oxide, antiferromagnetic, Nickel (II) oxide, Europium(II) oxide, Europium(II) sulfide, Chromium(III) bromide, Copper indium gallium selenide, Copper zinc tin sulfide, Copper indium selenide, Silver gallium sulfide, Zinc silicon phosphide, Arsenic selenide, Platinum silicide, Bismuth(III) iodide, Mercury(II) iodide, Thallium(I) bromide, Selenium, Iron disulfide, poly-silicon, or any organic semiconductor.

In some embodiments of a structure 100 as set forth herein structure 100 can be utilized for absorbing electromagnetic radiation. In the development of structure 100 it was determined that pitches (pillar to pillar base distance taken from axial centers of bases) affects absorptive characteristics of a nanowire structure with smaller pitches generally increasing a structure's capacity to absorb light. It was also determined that increasing the height can improve the light absorption capability in structure 100. Further, for increasing a structure's capacity to absorb light, an array of nanowire pillars can include a characteristic pillar form having a larger base cross-section than top cross-section. It was also determined in the development of structure 100 that absorptive characteristics of structure 100 can be improved by providing structure 100 so that pillar bases contact each other.

In some embodiment of structure 100, reflective properties of structure can be utilized as opposed to absorptive properties. In the development of structure 100 it was noted that for providing structure 100 to exhibit light reflective properties a pitch of structure 100 can be increased. In some embodiments, it is desired that a nanowire structure 100 absorb a significant percentage of light but remains capable of reflecting an observable percentage of light incident thereon. The spacing also effects the absorption and reflection as a function of wavelength.

Figure 11:
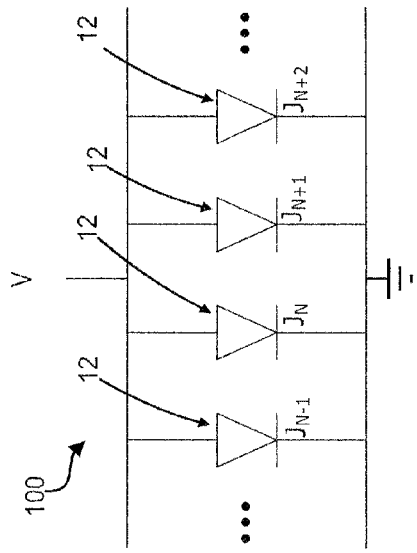
FIG. 11 is a side schematic view illustrating fabrication of a nanowire structure configured to output an electrical signal responsively to absorbed electromagnetic energy.

In some embodiments, structure 100 as set forth herein can be adapted so that electromagnetic radiation absorbed therein is converted into electrical energy. For providing structure 100 so that absorbed electromagnetic radiation can be converted into electrical energy, pillars 12 as shown in FIG. 11 can be subject to fabrication processing so that p-n junctions can be defined by pillars without changing a material composition of pillars 12. In one embodiment, there can be defined outer pn region 121 of pillars 12, and inner pn region 122 of pillars 12 which can extend to substrate 6. In one embodiment, the outer pn region 121 is a p region and the inner pn region 122 is an n region. In another embodiment, the outer pn region 121 is an n region and the inner pn region 122 is a p region. There is set forth herein an apparatus comprising a structure including a plurality of nanowire pillars, wherein the structure further includes a substrate supporting the plurality of nanowire pillars, the plurality of nanowire pillars being formed of semiconductor material, wherein the plurality of nanowire pillars are arranged in a periodic array, the periodic array being a two dimensional periodic array, wherein pillars of the plurality of pillars define semiconductor p-n junctions for generating electrical current responsively to absorption of electromagnetic radiation. Further, a passivation layer 123 can be provided on structure 100 to improve the electron-hole lifetime. In one embodiment, structure 100 includes a characteristic pillar having semiconductor, e.g., Si/Si p-n junction. Referring to further aspects of structure 100, passivation layer 123 can be formed by thermal oxidation to eliminate surface recombination centers to enhance electron hole pair collection efficiency across the junction depletion region. In another aspect, structure 100 can include a first electrode 130 in electrical ohmic contact with region 121 and a second electrode 132 in electrical ohmic contact with region 122. The pn regions can be formed by, e.g., ion implantation, epitaxial growth, or by chemical vapor deposition followed by thermal diffusion.

Figure 12A:
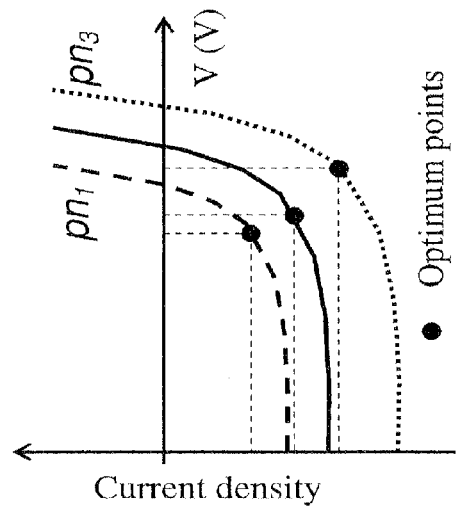
FIG. 12a is a schematic diagram illustrating an equivalent electrical circuit corresponding to a nanowire structure having a nanowire pillar array.
Figure 12B:
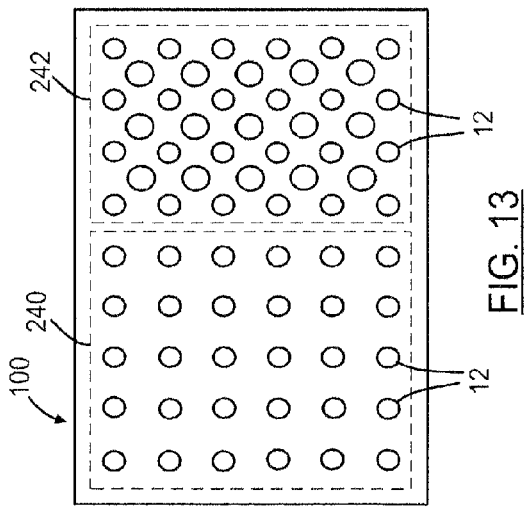
FIG. 12b is a current-voltage curve characterizing operation of a nanowire structure having a nanowire pillar array.

Structure 100 can be aperiodic and can include randomized pillar pitch form and orientation. However, providing structure 100 to define a periodic array can provide significant advantages. For example, with an arrangement of pillars being periodic, controlled fabrication processing (e.g., doping, epitaxial growth, chemical deposition, diffusion) for forming p-n junctions can yield an array of p-n junction pillars with substantially uniform electrical characteristics, to improve an electrical conversion efficiency of structure 100 as a whole. An electrical schematic diagram corresponding to structure 100 in which pillars 12 as p-n junctions (e.g., $J_{N-1}$, $J_N$, $J_{N+1}$, . . . ) are arranged in parallel to absorb light and generate electrical currents and in which a power output of structure 100 is a function of the combined electrical current provided by each pillar 12 is shown in FIG. 12a. It is seen that improper formation of pillars in the structure will reduce an overall power output efficiency of the structure. As is indicated in FIG. 12b, different pillars of an aperiodic nanowire pillar array can have different current-voltage (IV) characteristics, and as the same amount of light falls on each pillar, all of them connected in parallel with the voltage being applied to each one being the same the common voltage applied to all the pillars would force pillars to operate in non-optimal IV curve biasing. Providing structure 100 to define a periodic array can also improve the ability to predict an expected output of the structure 100 for improvement of the performance of the structure in a detection apparatus such as a force or substance detection apparatus.

Structure 100 as shown and described here in FIGS. 2, 9, 10, and 11 includes a periodic array. The periodic array depicted in FIGS. 2, 9, 10, 11 is characterized by a uniform (to manufacturing tolerance) pitch, pillar form, and orientation (all extending normally to a substrate to manufacturing tolerance). Structure 100 can include a periodic array not having one or more of a uniform pitch, pillar form or orientation. For example, a periodic array can be characterized by a non-uniform pitch having a repeating pattern. A periodic array can also be characterized by a non-uniform pillar form varying according to a repeating pattern. A periodic array can also be characterized by a non-uniform pillar orientation varying according to a repeating pattern. A periodic array can also be characterized by more than one of a non-uniform pitch, pillar form, and orientation varying according to a repeating pattern.

A periodic array herein can also include a non-uniform pitch and/or pillar form and/or orientation varying according to a predetermined gradient (e.g., linear, exponential, logarithmic, Gaussian).

Figure 13:
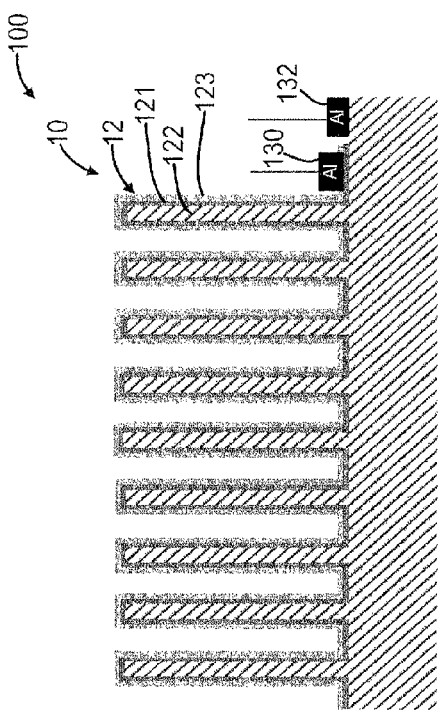
FIG. 13 shows an example of a structure 100 having a plurality of arrays located in different regions.

While a structure 100 can comprise a single array, structure 100 as shown in FIG. 13 can comprise a plurality of arrays; for example, a first region 240 of structure 100 can include a first periodic array having a first characteristic pitch and/or pillar form and/or attractant as will be described herein and a second region 242 of structure 100 can include a second periodic array having a second characteristic pitch and/or pillar form and/or attractant as will be observed herein. One or more of the regions can also define an aperiodic array. Structure 100 can include N regions defining N arrays.

In FIGS. 2, 9, 10, 11 structure 100 includes pillars that extend vertically and perpendicularly (to manufacturing tolerance) from substrate 6 that is planar (to manufacturing tolerances) in an unstressed state. In another embodiment, one or more of pillars 12 can extend at a non-perpendicular angle from substrate 6. Referring to further aspects of a structure 100 as set forth herein, a nanowire pillar can have a top, a base adjacent to substrate 6, and a body intermediate the top and base. A pitch of a nanowire pillar array can be regarded as a distance between respective axial centers of adjacent pillar bases. A spacing can be regarded as a distance between adjacent pillar bodies. A structure that is deformed by bending of a flexible substrate can have a constant pitch but a changed pillar spacing and changed angle.

In some embodiments of structure 100, structure 100 can be configured to include a flexible substrate 6. In one embodiment a structure 100 where fabricated using a Si (Si/SiO$_2$/Si) wafer as shown in FIG. 9 can be adapted to be flexible by removal of Si layer 108. Si layer 108 can be removed by etching. Referring to substrate 6, substrate 6 can be multi layer, e.g., can have three layers 108, 110, 112 as shown in FIG. 9 or can have two layers, 110, 112 as shown in FIG. 10. In one embodiment, substrate 6 can comprise a single layer. Structure 100 can be configured to include a single layer substrate by removal of layer 110 as shown in FIG. 10. In the embodiments, e.g., of FIGS. 2, 9, and 10 pillars 12 and the portion of substrate 6 provided by layer 112 are provided by a unitary (single) piece of material. If layer 110 as shown in FIG. 10 is removed, structure 100 can comprise a single piece of material. According to the fabrication method as shown in FIGS. 3-10, layer 112 is not etched through its entire thickness so that substrate 6 is partially defined by layer 112. According to another embodiment, layer 112 can be etched through its entire thickness in the formation of pillars 12.

When structure 100 defining one or more arrays includes a flexible substrate 6, the substrate can have such flexural rigidity that by deformation of the substrate changes in the characteristics of an array of nanowire pillars 12 can be observed. The flexural rigidity $f_R$ of substrate 6 can be defined as $$f_R = \frac{E_{EFF} * h_{EFF}^3}{D_{EFF}^2} \quad \text{Equation 1}$$

where $E_{EFF}$ is the effective Young's modulus of the substrate 6, $h_{EFF}$ is the effective thickness of the substrate 6, and $D_{EFF}$ is the effective diameter of the substrate 6.

Flexural rigidity of structures herein in some implementations may have a range of from about 0.1 N/m to about 10 N/m. However, substrates having flexural rigidity outside of the noted range can be regarded as flexible substrates if deformation of the substrate results in a change of an array of pillars 12 that can be observed.

Providing structure 100 to include a flexible substrate 6 facilitates a plurality of applications for use. If a flexible substrate 6 is deformed, the deformation can yield a change in a nanowire pillar array pillar spacing and angle and accordingly can change an observable characteristic of a nanowire pillar array, e.g., an absorptivity and reflectivity. Absorptivity and reflectivity are inversely related and accordingly, a detection of absorptivity is a surrogate detection of reflectivity and vice versa. Absorptivity and reflectivity can be detected, e.g., by detecting electromagnetic radiation reflected from a nanowire pillar array or by output of an electrical signal from a structure 100 where configured to output an electrical signal. In various methods set forth herein a nanowire structure having certain characteristics can be provided. For performance of the providing, a nanowire structure can be positioned or otherwise disposed for use with the method after being received from a third party manufacturer or distributor (possibly in a form incorporated in a larger apparatus). For performance of the providing a nanowire structure can alternatively be fabricated by the entity performing the method.

In one example, providing structure 100 to include a flexible substrate allows use of structure 100 for force detection wherein a force imparted to a structure changes an absorptivity and reflectivity characteristic of the structure. Absorptivity and reflectivity of structure 100 can be observed for purposes of determining a force presently imparted to structure 100. In one embodiment of a force detection application, a structure 100 can be configured so that electromagnetic radiation reflected nanowire pillar array and detected is responsive to a force imparted to the structure 100. According to another method for detection of electromagnetic radiation, structure 100 can be configured to output an electrical signal responsively to absorbed energy and can be arranged so that an electrical signal that is output from the structure 100 is responsive to a force imparted to the structure 100. In another embodiment of a force detecting application a structure 100 can be configured so that an exhibited visible color characteristic of the structure 100 is responsive to an imparted force. A structure 100 can be configured so an absorptivity and reflectivity of structure 100 are observable by more than one method, e.g. by combining two or more of detecting reflected electromagnetic radiation, detecting by an outputting of an electrical signal, and by visual observation of visible color exhibited by an array of nanowire pillars 12.

Figure 14B:
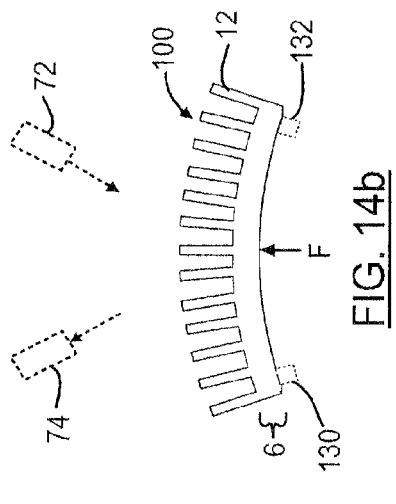
FIG. 14b is a schematic side view of a structure having a nanowire pillar array having a force imparted thereto.
Figure 14D:
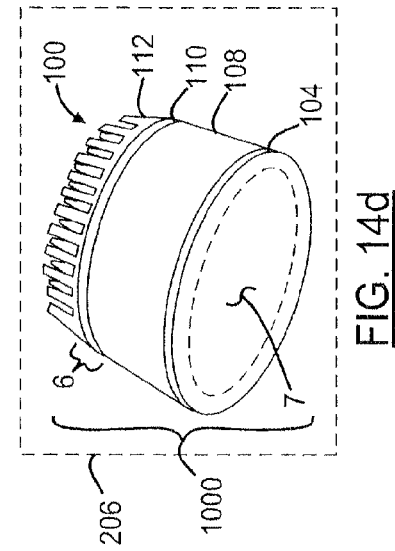
FIG. 14d is a perspective view of a pressure sensing apparatus disposed in an environment for sensing pressure.
Figure 14A:
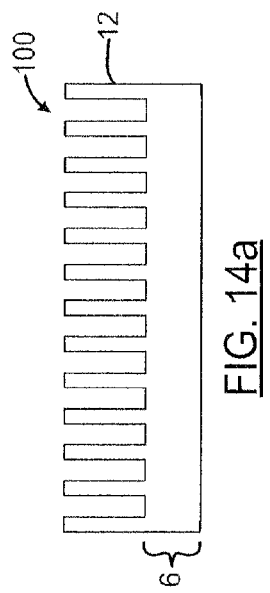
FIG. 14a is a schematic side view of a structure having a nanowire pillar array.

In one embodiment, structure 100 having an array of nanowire pillars 12 can be provided as shown in FIG. 14a. A force F can be imparted to substrate 6 of the structure 100. For determination of force F, an absorptivity and reflectivity of the array of nanowire pillars 12 can be observed. The observing can comprise a detection. In one example of a detecting, a light source 72 and light detector 74 can be utilized to detect electromagnetic radiation, e.g. light reflected from an array of nanowire pillars 12. Absorptivity and reflectivity in addition or alternatively can be detected by configuring structure 100 so that structure 100 can output an electrical signal responsively to absorbed electromagnetic energy and therefore responsive to force F. In another embodiment, an absorptivity and reflectivity characteristic of an array of nanowire pillars 12 can be observed by visual observation. In one embodiment, structure 100 can be configured so that array of nanowire pillars 12 exhibit a visual color responsively to a force imparted thereto, e.g., black (highly absorbing) in an unstressed state and a color in the visual spectrum in a deformed state.

Figure 14C:
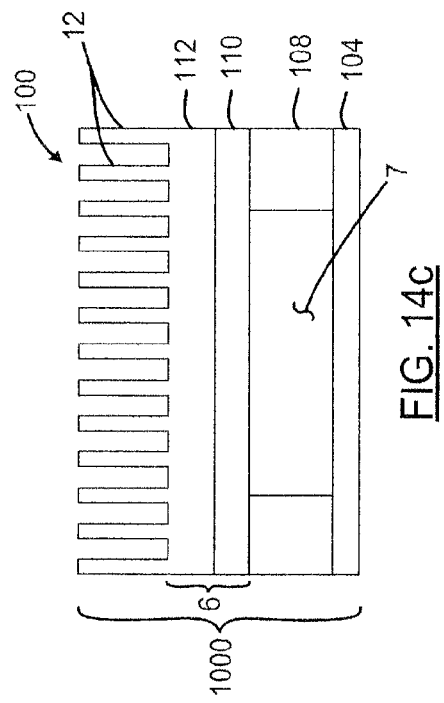
FIG. 14c is a schematic side view of a pressure sensing apparatus including a nanowire pillar array.

One specific embodiment of a force detection apparatus is shown in FIG. 14c. In FIG. 14c there is shown a pressure sensor realized by encapsulating one-side of structure 100 with use of layer 104 to define a sealed cavity 7. Sealed cavity 7 provides a reference pressure on one side, while the external pressure changes the net force acting on the substrate 6, deforming the substrate 6. The apparatus as shown in FIGS. 14c and 14d can be disposed in an environment 206 for sensing of pressure, e.g. atmospheric pressure of the environment 206 to which the apparatus including structure 100 with layer 104 to define sealed cavity 7 is exposed. In the specific embodiment of FIG. 14d, apparatus 1000 can be configured so that a pressure sensed by apparatus 1000 can be determined by visual observation of a visible color exhibited by array of nanowire pillars 12. The apparatus 1000 as shown in FIG. 14d could in addition or alternatively employ reflection detection or electrical signal output for force detection.

Where structure 100 is configured to absorb electromagnetic radiation, exposure of structure 100 to electromagnetic radiation can result in thermal expansion of substrate 6, and, accordingly, deformation of substrate 6. For increasing an amount of deformation of substrate 6 that results from thermal expansion, structure 100 as shown in FIG. 14e can have substrate 6 that includes at least first and second layers, e.g., layers 110, 112 with a first layer having a co-efficient of thermal expansion $\alpha=\alpha_1$, and a second layer having a co-efficient of thermal expansion, $\alpha=\alpha_2$, where $\alpha_1 \neq \alpha_2$. An amount of deformation of substrate 6 and accordingly, change of an absorptivity and reflectivity responsively to absorbed electromagnetic energy can be expected to increase as the difference between $\alpha_1$ and $\alpha_2$ increase given a constant layer thickness. Referring to FIG. 14e, the array of nanowire pillars 12 is formed on a layer 112 that has a different thermal expansion coefficient than the nanowire layer 110. Upon changes in the temperature of the structure, the two layers expand or contract differently leading to a bending and extension of pillars of the nanowire pillar array leading to changes in spacing and angle of pillars of the nanowire pillar array. Any temperature can lead to deformation of the nanowire structure.

According to another application for structure 100, structure 100 where provided to include a flexible substrate 6 can be utilized as a strain gauge. In FIG. 14e, there is shown a deformable body 202 capable of deforming. Body 202 can be, e.g., an animal (e.g., human) body part, or a machine part. For utilization of structure 100 as a strain gauge sensor, structure 100 can be disposed so that a deformation of structure 100 corresponds to a deformation of body 202, e.g., by disposing structure 100 so that substrate 6 is adjacent body 202. Where structure 100 is configured as described, an observable absorptivity and reflectivity of structure 100 will be indicative of a deformation of substrate 6 and of body 202. When the body 202 strains, the strain can be translated into substrate 6 changing the pillar spacing and possibly angle and therefore the observable absorptivity and reflectivity as may be observable by way of detecting reflected electromagnetic energy, outputting of an electrical signal as a detection of absorption and reflectivity, and/or by observing an optical color pattern emitted from structure 100.

According to another application for structure 100, structure 100 where provided to include a flexible substrate 6 can be utilized as curvature sensor. As described herein, structure 100 can be configured to have a baseline absorptivity and reflectivity characteristic in an unstressed state, and an absorptivity and reflectivity characteristic indicative of a deformation thereof when in a deformed state. In FIG. 14f, there is shown a curved body 204. For use of structure 100 as a curvature sensor, structure 100 can be disposed on body 204 of an unknown curvature such that by deformation of substrate 6 substrate 6 conforms to a curvature of body 204. In one embodiment of an operational disposing of apparatus 100 apparatus 100 can be disposed so that substrate 6 is adjacent to body 204. An observable absorptivity and reflectivity will accordingly be indicative of a curvature of body 202. In one example, body 204 can be an animal (e.g., human) body part or a machine part. In one specific embodiment, body 204 is a human eye and structure 100 can be utilized for detection of a curvature of a human eye by disposing structure 100 on an eye, and by observing a resulting absorptivity and reflectivity of structure 100.

In another aspect, structure 100 as set forth herein can be utilized as a remotely activated actuator. Structure 100 where configured to be absorptive of electromagnetic radiation and further configured so that substrate 6 deforms responsively to electromagnetic radiation exposure can be disposed in work environment 210 wherein it is desired to move a substance 214, e.g., a substance in a liquid gas or solid state. Work environment 210 in one embodiment can be, e.g., a human body part or a machine part. In one specific embodiment, work environment 210 can include an animal (e.g. human) brain and substance 214 that is moved with use of structure 11 is brain tissue. For utilization of structure 100, a source of electromagnetic radiation 72 can be activated so that electromagnetic energy is absorbed in structure 100 to cause deformation of substrate 6 and accordingly, movement of substance 214, e.g., a substance in gas, solid, or liquid form. Light from electromagnetic radiation source 72 can be electromagnetic radiation capable of transmission through various materials (e.g., can be Infrared light transmissive through human body tissue). Substrate 6 can have one or a plurality of layers. Where including a plurality of layers, the layers can have different co-efficients of thermal expansion as set forth herein for increasing an amount of movement of substrate 6 when thermally excited. In a specific example of use of structure 100 as an actuator. In one embodiment of a remotely activated actuator as shown in FIG. 14i, electromagnetic radiation from source 72 can be amplitude modulated and in a further specific embodiment can be amplitude modulated at a frequency that causes mechanical resonance of structure 100. When structure 100 is in mechanical resonance structure 100 can exhibit mechanical characteristics useful for actuation applications (e.g. maximum displacement and acceleration).

In a particular use case illustrated with reference to FIG. 14j, structure 100 is disposed in work environment 210 provided by a vessel for holding a liquid and substance 214 is provided by a liquid. Electromagnetic radiation source 72 can be provided by a sonic laser. When substrate 100 is excited by energization of source 72, substance 214 provided by a liquid is displaced. The displacement can be made spatially varying and continuous over time, e.g. by amplitude modulation of electromagnetic radiation source 72 over time.

With reference to FIG. 14k, structure 100 can be utilized for detection of a substance 214 in a work environment 212. As shown in FIG. 14i, work environment 210 can include a substance 214, e.g. an antigen, a gaseous molecule, a DNA sequence. Prior to introduction into environment 212, pillars 12 can be configured to include an attractant 218 for attracting of substrate 214. Table 1 below lists exemplary attractant and substance combinations.

TABLE 1

| Attractant 218 | Substance 214 |
| --- | --- |
| Antibody | Antigen |
| Oxide | Gaseous Molecule |
| DNA Sequence | DNA Sequence |

In one embodiment, substance 214 can be detected for by utilizing electromagnetic radiation source 72 for thermal excitation of structure 100. In the development of the described method, it was noted that the certain frequency of amplitude modulation of incident light from electromagnetic radiation source 72 resulting in mechanical resonance of structure 100 is a function of weight of an array of nanowire pillars 12 and accordingly will change depending on whether substance 214 is or is not attracted to pillars 12. Accordingly, a substance can be detected for by exposing structure 100 to amplitude modulated electromagnetic radiation modulated at the certain frequency and detecting whether the mechanical resonance condition has occurred. Whether a mechanical resonance condition has occurred can be detected as the absorptivity and reflectivity of structure 100 will vary according to a detectable pattern when structure 100 is in mechanical resonance. There is set forth herein a method providing a structure including a plurality of nanowire pillars, the providing including providing the plurality of nanowire pillars to be arranged on a substrate in a two dimensional array, the providing including providing the structure so that pillars included in the plurality of nanowire pillars absorb electromagnetic radiation to induce thermal expansion of a substrate of the structure. There is further set forth herein a method wherein the providing includes providing the structure so that a certain substance if present in an environment will attach to the pillars, the method further including exposing the pillars to an environment, wherein the directing include's directing amplitude modulated light from an electromagnetic radiation source modulated at a certain frequency corresponding to the mechanical resonance frequency of the structure if the pillars have the substance attached thereto, and wherein the method further includes detecting reflected light of the electromagnetic radiation source reflected from the pillars for determination of whether the environment includes the substance.

In a substance detection system as shown in FIG. 14k, the structure 100 can be exposed to an environment which may or may not include a substance that is detected for and can then be thermally excited, e.g., with the use of an electromagnetic radiation source, e.g, a light source such as a laser. The optical excitation frequency can be amplitude or frequency modulated to span the range of the mechanical resonances of structure 100. The reflection of the structure 100 changes at one or more resonance frequencies where the displacements of the structure are greatly enhanced. This allows measurement of the resonance frequency by measuring the reflected light on a photodetector 74. A determination of whether a substance, e.g., biomaterial or gas is present can then be based on a detection of the changes in the resonance frequency of the structure 100, both excited and measured optically.

In one specific embodiment of a substance detection application a frequency of modulation of electromagnetic radiation source 72 can be swept to detect for the presence of more than one mechanical resonance frequency of structure 100. The swept frequencies can include a first resonance frequency that will be exhibited by an array of nanowire pillars without a substance detected for attracted thereto and a second resonance frequency that will be exhibited by an array of nanowire pillars 12 with a substance detected for attracted thereto. Accordingly, a detection of resonance with electromagnetic radiation at the first resonance frequency being incident on structure 100 can indicate that the substance 214 is not present in environment 212. A detection of resonance with electromagnetic radiation at the second resonance frequency being incident on structure 100 can indicate that the substance 214 is present in environment 212. In one embodiment, as indicated with reference to FIG. 14j environment 212 in which substance detection can take place can be a liquid environment.

In another aspect as indicated in FIG. 14k, apparatus 100 includes a mechanical (e.g. piezoelectric) actuator 262 for mechanically moving substrate 6 to change an absorptivity and reflectivity characteristic of an array of nanowire pillars 12.

In another embodiment, structure 100 can be configured so that more than one substance 214 can be detected for. For example, referring again to FIG. 13, nanowire pillars 12 of structure 100 can include a plurality of regions 240, 242 each defining a different nanowire pillar array. Pillars 12 of first region 240 can include a first attractant for detection of a first substance and pillars 12 of second region 242 can include a second attractant for attraction of a second substance. Each different region 240 and 242 can be expected to have two resonance frequencies, the first with the substance absent and the second with the substance present. By sweeping incident amplitude modulated electromagnetic radiation from source 72 through a range of frequencies and by detecting for four mechanical resonance conditions the first and second substances can be detected for. Structure 100 as shown in FIG. 13 can be scaled up to include N regions each having a different attractant 218 for attracting a different substance. Methods described herein can be performed utilizing nanowire structures set forth herein.

Further aspects of structure 100 are described with reference to Examples as set forth herein. Among aspects that are further illustrated with reference to the Examples, Examples 1 and 2 describe a specific fabrication method for a nanowire structure including Radio Isotope Power Electron Lithography mask. Examples 3 and 4 illustrate methods for adapting a nanowire structure for converting absorbed electromagnetic radiation into electrical energy. Examples 5 and 6 illustrate a structure 100 having a flexible substrate, which can be regarded as a membrane.

Example 1

Figure 15B:
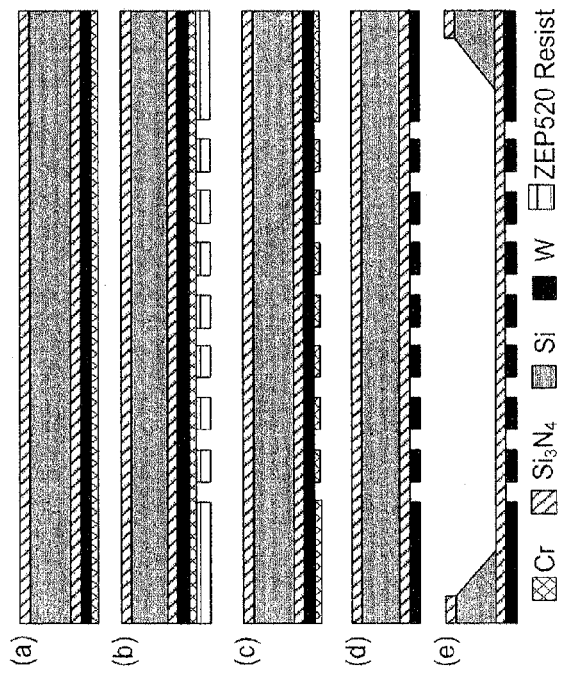
FIG. 15b is a schematic side view of a RIPEL mask fabrication process.
Figure 15A:
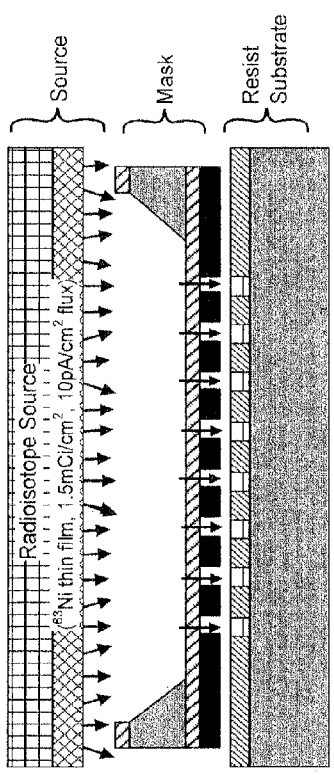
FIG. 15a is a schematic side view illustrating a Radio Isotope Powered Lithography (RIPEL) fabrication process.

A method for fabrication of a nanowire structure 100 utilizing Radio Isotope Powered Electron Lithography (RIPEL) is described with reference to FIGS. 15a-18. Referring to FIG. 15a, a schematic setup for a RIPEL fabrication process is described. As shown in FIG. 15a, a resist disposed on a substrate can be patterned using a mask fabricated as shown in FIG. 15b. For etching, the resist can be exposed to energy from a radio isotope source.

Referring to FIG. 15b, there is described a RIPEL mask fabrication process. (a) low stress LPCVD nitride (600 nm) deposition on double polished Si (100) wafer, followed by 700 nm of W sputtering and 100 nm of Cr evaporation on the front side. (b) E-beam patterning, using ZEP520 resist. (c) Cr RIE etching, using ZEP520 as the etching mask. (d) W RIE ($CF_4/SF_6$) etching, using Cr as etching mask. (e) back side nitride window patterning by optical lithography, nitride RIE etching, followed by KOH (80° C.) Si etching to etch through the Si wafer.

Figure 16B:
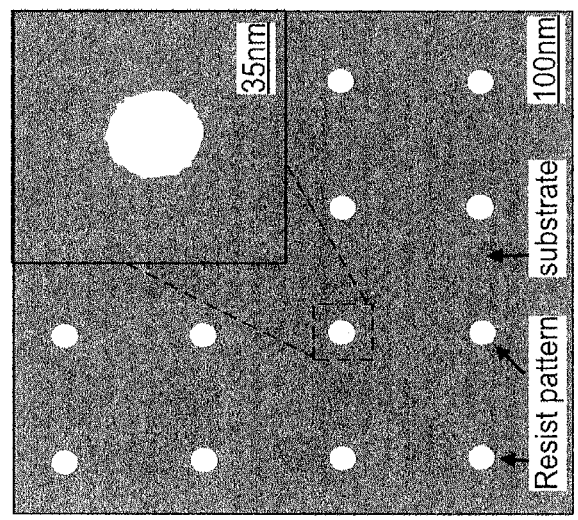
Figure 16A:
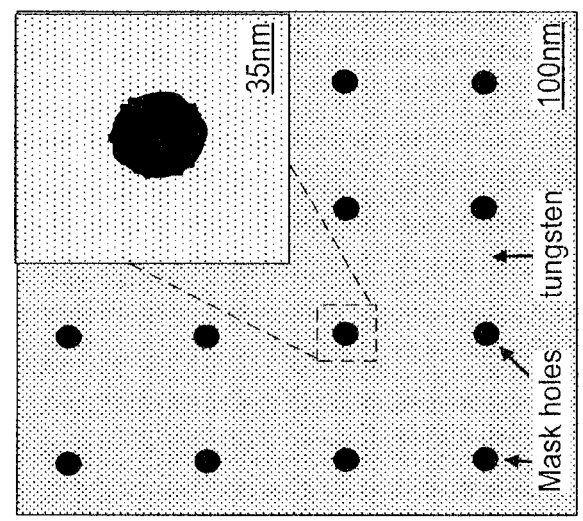
FIG. 16a illustrates top view of a mask fabricated as shown in FIG. 15b.
Figure 17:
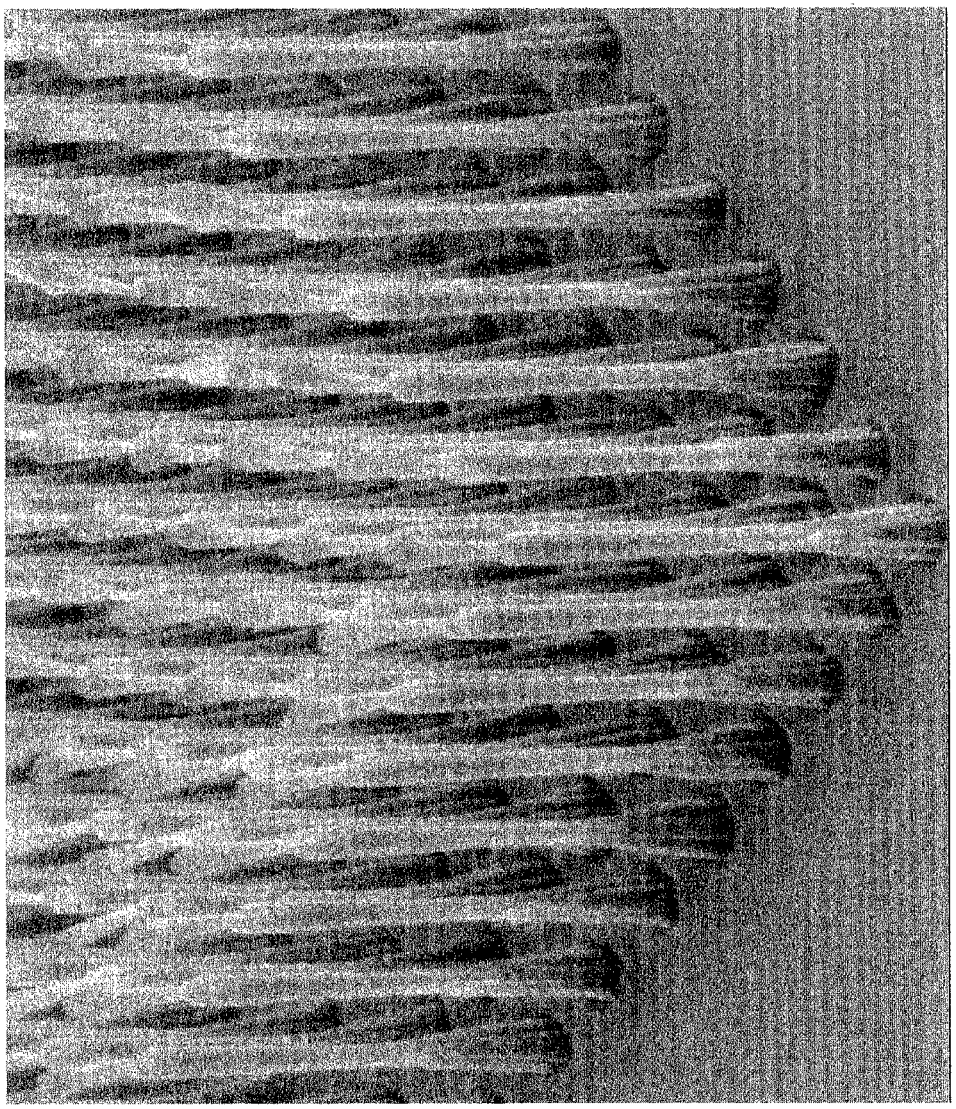
FIG. 17 is an electron microscope image illustrating a periodic nanowire pillar array characterized by a uniform (per manufacturing tolerances) pitch and pillar form.
Figure 18:
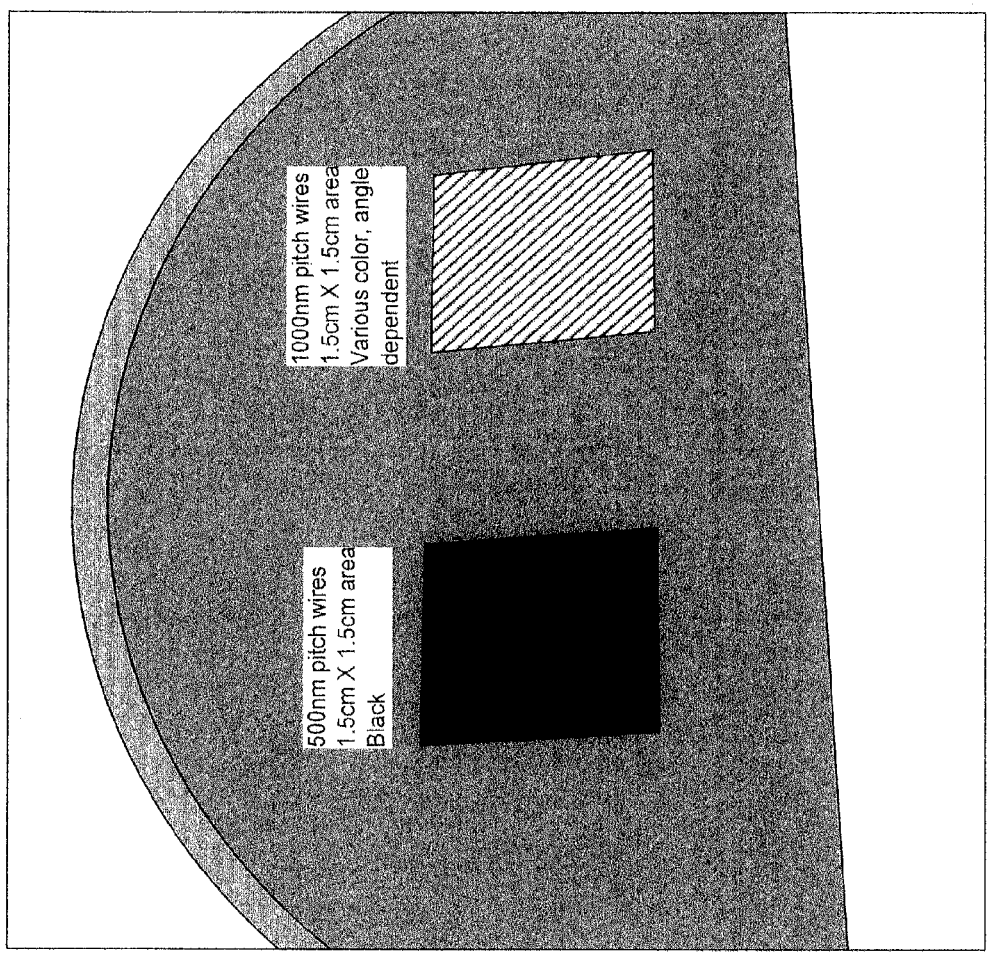
FIG. 18 is a schematic sample illustrating an effect of pitch on absorptivity and reflectivity.

FIG. 16a illustrates a top view of a mask fabricated as shown in FIG. 15b. FIG. 16b shows a top view of a resist as shown in FIG. 15a. FIG. 17 shows a resulting nanowire structure. FIG. 18 shows an effect of pitch (pillar to pillar axial center base distance) on performance of a nanowire structure. As shown in FIG. 18, with a pitch of 500 nm, a structure 100 can appear black. With a pitch of 1000 nm, the structure 100 having nanowire pillars formed of silicon can exhibit various colors.

Example 1 illustrates a method for fabrication of a nanowire structure utilizing a mask based electron lithography. While the structure 100 can be patterned using electron beam lithography, the use of mask based electron lithography allows large area structures to be made at high fabrication speeds.

Example 2

Figure 19:
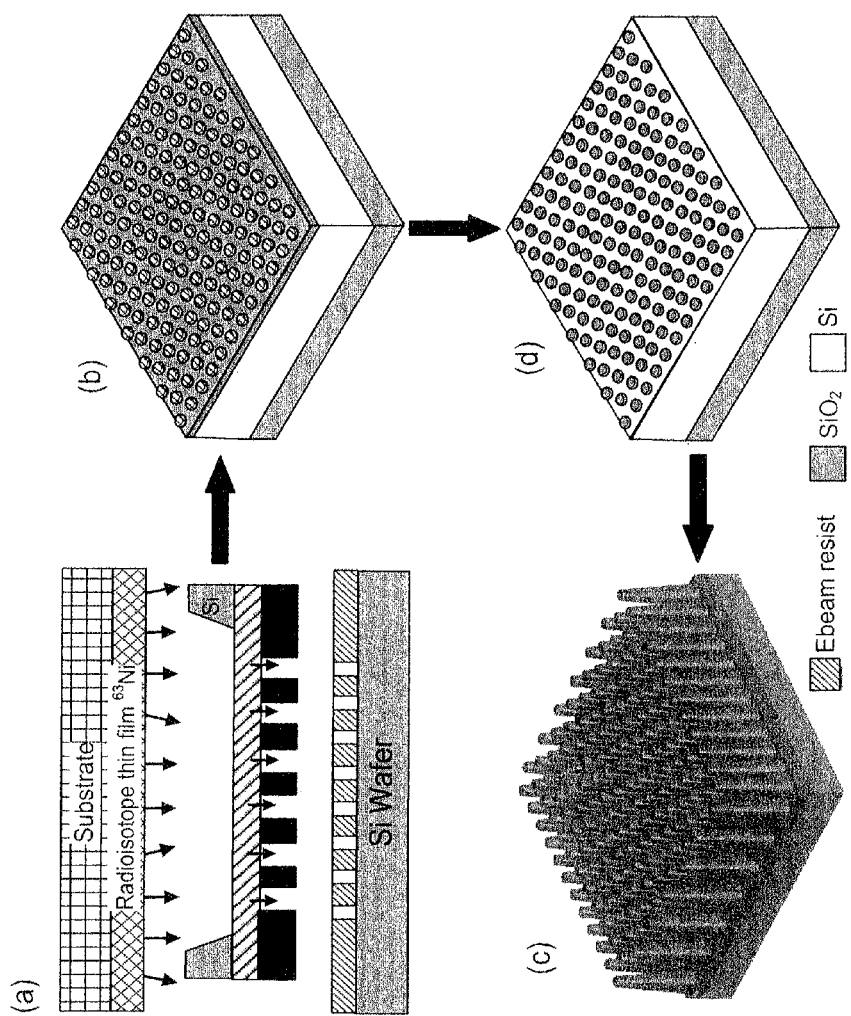
FIG. 19 is a schematic diagram illustrating a fabrication process for fabrication of a structure having a nanowire pillar array.

FIG. 19 shows the schematic illumination of the fabrication processes for periodic (ordered) Nano-conical frustum (NCF) nanowire pillar arrays, which can be regarded as frustoconical nanowire pillar arrays. A thin layer of Plasma-Enhanced Chemical Vapor Deposition (PECVD) silicon dioxide (200 nm thick) was deposited on a silicon on insulator (SOI) (Si(5 μm)/SiO$_2$(2 μm)/Si stack) wafer substrate. Self Aligning Polysilicon Electrode (SPEL) was used to pattern the E-beam resist and the pattern was transferred to SiO$_2$, using SiO$_2$ reactive ion etching (RIE). Ordered Si NCF frustoconical nanowire pillar arrays were formed, using silicon angled RIE etching recipe, with SiO$_2$ as the etching mask.

Referring to FIGS. 19a-19d, there are shown schematic drawings for ordered Si NCF arrays, fabricated by SPEL. Referring to FIG. 19a, there is shown a cross-section schematic drawing for SPEL experimental setting up, using large-area planar radioactive beta-electron thin film emitters (top) to parallel expose e-beam resist (bottom) through a stencil mask (middle). Using nature's high energy particle, SPEL potentially enables large-area massively parallel high throughput electron lithography with low cost, while maintaining sub-35 nm resolution. Referring to FIG. 19b, there is shown an E-beam resist is patterned on stack substrate SiO$_2$ (0.2 μm)/Si(5 μm)/SiO$_2$(2 μm)/Si, by SPEL. Referring to FIG. 19c, a pattern is transferred to SiO$_2$ layer by oxide RIE etching, using E-beam resist as the etching mask. Referring to FIG. 19d, ordered Si NCF arrays are formed by Si RIE etching, using SiO$_2$ as the etching mask. The bottom Si substrate of the SOI wafer is not shown here.

Ordered Si NCF arrays with different slant angles can be obtained, depending on the reactive ion etching conditions. FIG. 20a-20d shows the SEM images of two types of NCF arrays, with different slant angles, using the same ordered SiO$_2$ post arrays as the etching mask. The first NCF arrays (FIGS. 20a-20b) have 170 nm of top radius ($r_1$), 400 nm of base radius ($r_2$), 3.5 μm of height (h), 3.8 degree of slant angle (θ) and 800 nm of lattice constant. The second (FIGS. 20c-20d) type have 170 nm of equal top and base radii, 3.5 μm of height, zero degree of slant angle and 800 nm lattice constant, which are named periodic (ordered) cylindroid nanowire pillar arrays instead. In experiments, the top radii and the lattice constant were controlled by SPEL mask design. The slant angle and height are determined by the silicon RIE etching condition and etching time, respectively. The bases of all the adjacent were made connected (FIG. 20b right), while the bases of the adjacent cylindroid nanowire pillar arrays were apart from each other (FIG. 20d).

Figure 20A:
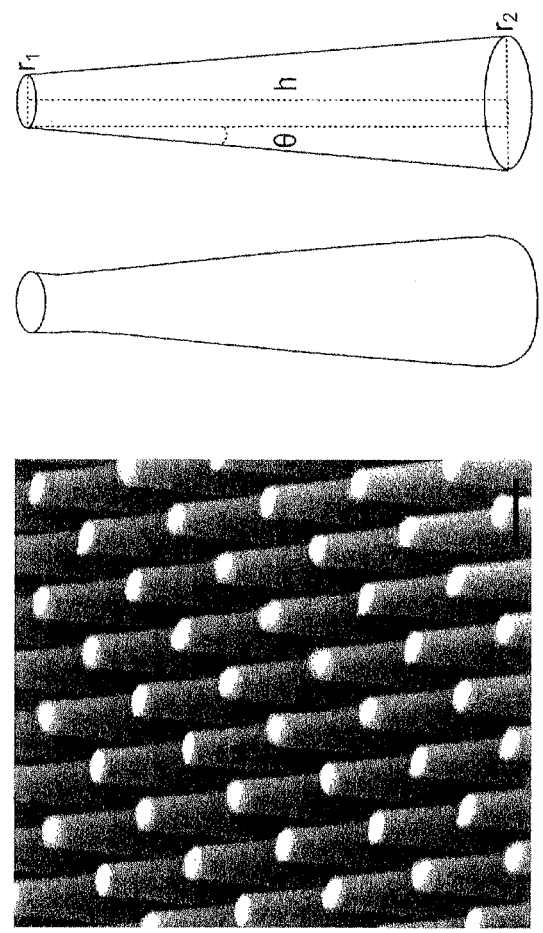
FIG. 20a is a perspective electron microscope image of a periodic nanowire pillar array characterized by a frustoconical pillar form.
Figure 20B:
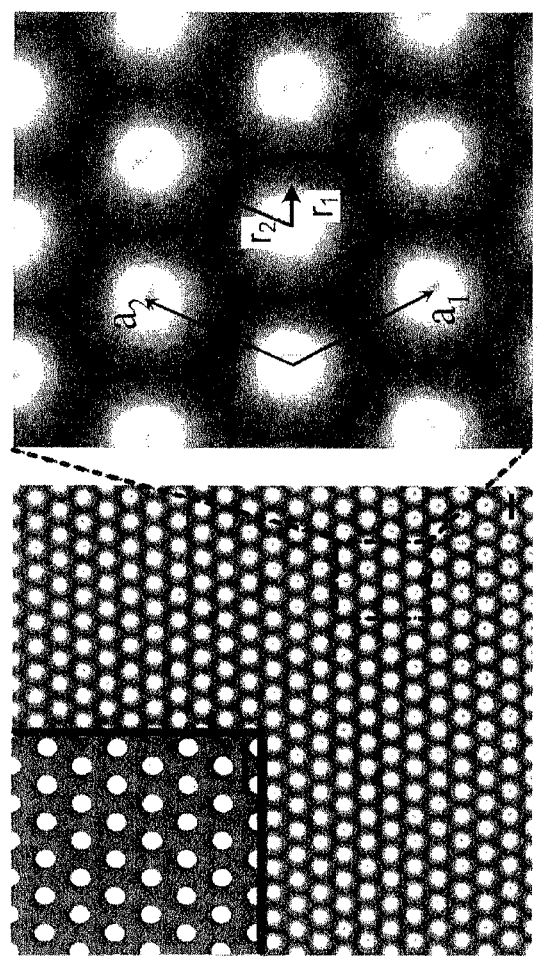
FIG. 20b is a top electron microscope image of a periodic nanowire pillar array characterized by a frustoconical pillar form.
Figure 20D:
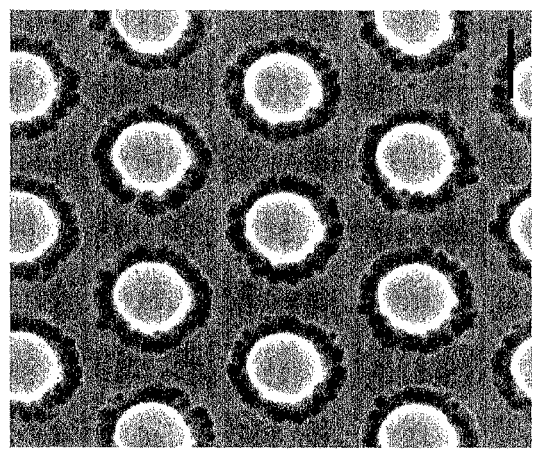
FIG. 20d is a top electron microscope image of a periodic nanowire pillar array characterized by a cylindroid pillar form.
Figure 20C:
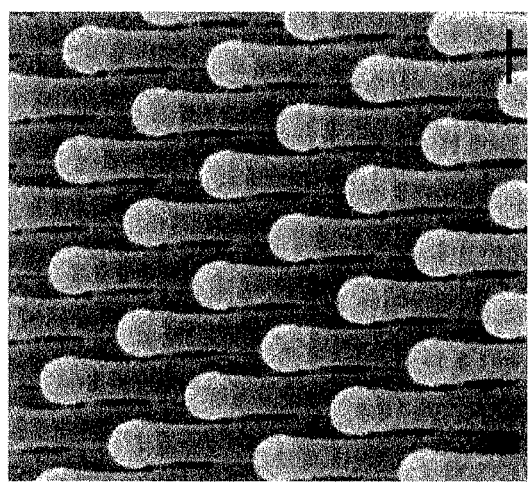
FIG. 20c is a perspective electron microscope image of a periodic nanowire pillar array characterized by a cylindroid pillar form.

Referring to FIGS. 20a-20d, there is shown microscopy images of ordered Si NCF arrays and the ordered cylindroid nanowire pillar arrays. Referring to FIG. 20a, left part shows the side view (45 degree) scanning electron microscopy (SEM) image of the ordered Si NCF arrays, with scale bar 800 nm. The zoom in SEM image (45° side view) of a single NCF is shown on right, with 170 nm of top radius ($r_1$), 400 nm of base radius ($r_2$), 3.5 μm of height (h) and 3.8 degree of slant angle (θ). The scale bar is 400 nm. Referring to FIG. 20b, top view SEM images of the ordered Si NCF arrays (left, 800 nm scale bar) and the zoom in SEM image (right, 400 nm scale bar). Inset shows the SEM image of the corresponding etching mask SiO$_2$ post arrays (800 nm scale bar). $a_1$ and $a_2$ are the lattice vectors, with lattice constant a. The bases of the adjacent NCFs are connected, with 800 nm of lattice constant and 400 nm of NCF base radius. Referring to 20c, there is presented a side view (45 degree) SEM image of the ordered Si cylindroid nanowire pillar arrays, with scale bar 400 nm. Referring to 20d, top view SEM image of the ordered Si cylindroid nanowire pillar arrays in (C), with scale bar 400 nm.

Referring to Example 2, the transmitted diffraction pattern of the ordered Si NCF arrays (800 nm lattice constant) using λ=609 nm laser (FIG. 21a), shows the high periodicity and uniformity of the nanostructures. The reflection and transmission spectra are shown in FIGS. 21a-21f. In order to get the membrane window for transmission measurements, the SOI wafer was backside etched through, by Si deep reactive ion etching (DRIE), using 4 μm of PECVD SiO$_2$ as the etching mask and the buried oxide (2 μm) as an etch stop. The window membranes consist of 3.5 μm of ordered Si NCF, arrays (or cylindroid nanowire pillar arrays), 1.5 μm of planar Si layer underneath and 2 μm of the SOI buried oxide. The control bare silicon membrane has a thickness of 5 μm planar Si and 2 μm of the SOI buried oxide. There was obtained absorption (A) spectra (FIG. 21O after acquisition of reflection (R) and transmission (T) spectra, by A=100%−R−T. The ordered Si NCF arrays exhibit maximal absorbance of ~99% over wavelengths 400-1100 nm. These Si NCF arrays show very broad band and ultrahigh optical absorption efficiency, which could be due to the photonic crystal optical absorption enhancement effect with the presence of optical guided resonance modes and the variations in the radii also create additional resonance modes ($\lambda_1, \lambda_2, \lambda_3$, et al.) at other frequencies not present in the perfectly ordered structures (FIG. 21c). Referring to additional experimental results, the described frustoconical nanowire pillar arrays showed improvement in absorption throughout the spectral range, relative to bare silicon (5 μm thick) and the ordered Si NCF arrays with 800 nm lattice constant. The improvement increases at longer wavelengths, where the silicon absorption decreases and the effect of light trapping increases. The improvement reaches an impressive value of 10-19 times at 1000-1100 nm region, where silicon has very weak absorption. There is set forth herein an apparatus comprising a plurality of nanowire pillars, a substrate supporting the plurality of nanowire pillars, wherein the plurality of nanowire pillars are arranged in a periodic array, the periodic array being a two dimensional periodic array, wherein the periodic array is further characterized by a pillar aspect ratio of greater than about 5:1, and wherein the plurality pillars are configured to that the apparatus exhibits at least 90% absorption when exposed to electromagnetic radiation through the range of from about 400 nm to about 1000 nm.

In order to investigate the light trapping properties as a function of lattice constants, we fabricated three kinds of ordered NCF nanowire arrays with the same height (3.5 μm) and constant slant angle (θ=3.8 degree), but with different lattice constants 600 nm ($r_1$=69 nm, $r_2$=300 nm), 800 nm ($r_1$=170 nm, $r_2$=400 nm) and 1000 nm ($r_1$=273 nm, $r_2$=500 nm) on the same SOI wafer. The ordered NCF arrays with 600 nm lattice constant give the lowest reflectance (<0.5%), due to the smallest top radius for minimal reflectance, which is consistent with expectation. All these three NCF samples show strong antireflective properties throughout the spectral range, which are consistent with the "black surface" (FIG. 21b). Both the ordered NCF arrays with lattice constants of 800 nm and of 1000 nm show ultra low transmittance spectra (FIG. 23b) throughout the spectral range 400-1100 nm, while the ordered NCF arrays with 600 nm lattice constant show slightly increasing transmittance for the wavelength near the band gap region 800-1100 nm.

Referring to FIG. 21a, light trapping measurements are described. In FIG. 21a there is shown a transmitted diffraction pattern of the NCF arrays (800 nm lattice constant) using $\lambda=609$ nm laser, projected onto a white paper screen and taken by digital camera. The paper screen is 4 mm away from the $SiO_2$ substrate. Scale bar is 3 mm. The window membranes consist of 3.5 µm of ordered Si NCF arrays, 1.5 µm of planar Si layer underneath and 2 µm of the SOI buried oxide. Referring to FIG. 21b, there is shown a photograph of the ordered Si NCF arrays, with scale bar 1 mm. Referring to FIG. 21c, there is shown a schematic illumination of the light trapping mechanisms for ordered NCF arrays and the ordered cylindroid nanowire pillar arrays. Ordered Si NCF array structures with variations in the radii could create additional resonance modes ($\lambda_1, \lambda_2, \lambda_3$, et al.) at other frequencies not present in the perfectly ordered structures, with a single wire radius leading to a broad band solar-energy harvesting. Respectively, FIGS. 21d, 21e, and 21f show the measured reflection, transmission and absorption spectra for light normally incident on the ordered Si NCF arrays (dashed), ordered Si cylindroid nanowire pillar arrays (dotted), and control bare silicon (black). The window membranes consist of 3.5 µm of ordered Si NCF (or cylindroid) arrays, 1.5 µm of planar Si layer underneath and 2 µm of the SOI buried oxide. The control bare silicon has a thickness of 5 µm.

Now referring to Examples 3 and 4 below, Examples 3 and 4 are provided to describe a structure adapted to convert absorbed electromagnetic radiation into electrical energy.

Example 3

The structure fabricated as described in Example 1 was adapted to convert absorbed electromagnetic radiation into electrical energy. FIG. 22a illustrates a structure adapted for converting electromagnetic radiation into electrical energy. The structure 100 as shown in FIG. 22a can have defined by Si pillars p-n junctions provided by doping of the pillars 12. The structure 100 can also include an $SiO_2$ layer disposed over the pillars as well as first electrode in electrical communication with the p region as the structure and a second electrode in electrical communication with the n region of the structure 100. FIG. 22b and FIG. 22b illustrate test data for various samples wherein pitch is varied for the samples. FIG. 22c illustrates test data for a sample having a pitch of 400 nm.

Example 4

Due to the maximal absorption throughout the spectra range, the ordered Si NCF arrays with 800 nm lattice constant as described in Example 2 were selected for Electromagnetic Radiation Energy Converter fabrication, to observe the solar energy conversion efficiency. The radial p-n junction was formed via boron ion implantation (E=10 keV), starting with $n^+$-type ordered Si NCF arrays fabricated using SOI top silicon (resistivity 0.015Ω·cm, doping concentration $2\times10^{18}$ $cm^{-3}$). (See FIG. 23a). Ion implantation offers the advantage of precise control over the total dose of dopants, depth profile, and most importantly works well also for high doping levels of the order of $10^{19}$-$10^{21}$ $cm^{-3}$. Considering the slant angle (3.8 degree) of the NCF, the sidewall implantation depth was estimated to be 20 nm, using the lateral straggling depth value calculated from SRIM ion implantation simulator. The initial doping concentration on the NCF sidewall surface was controlled to be $1\times10^{20}$ $cm^{-3}$ during the ion implantation. Rapid thermal annealing (RTA) at 900° C. for 60 seconds was used directly after implantation, to activate the dopants and remove the implantation damage. In order to minimize the loss from the surface recombination coming from the large total surface area increased by NCF array geometry, a thin layer (~20 nm thick) of $SiO_2$ wet oxide was formed as the outside passivation layer for the p-n junction, at 900 degree for 6 minutes. During the RTA and wet oxidation high temperature processes, the boron dopants diffused toward the core by an estimated 80 nm more, offering a final junction depth of 100 nm and final boron doping concentration of $2\times10^{19}$ $cm^{-3}$ after the diffusion. From outer surface to the core center, the radial p-n junction consists of 20 nm of outside passivation $SiO_2$, 100 nm of quasi-neutral boron doped $p^+$ type shell region, 25 nm of depletion inter-shell region, and 45 nm top radius (275 nm base redius) of quasi-neutral $n^+$ type Si core region (in radii). It is important to use both heavily doped $n^+$ and $p^+$ quasi-neutral region to make small depletion region in each NCF, so that the NCF is not fully depleted, since the quasi-neutral core region should exist to conduct carriers down to the bottom contact. The schematic energy conversion cell structure plot is shown in FIG. 23a.

Figure 23A:
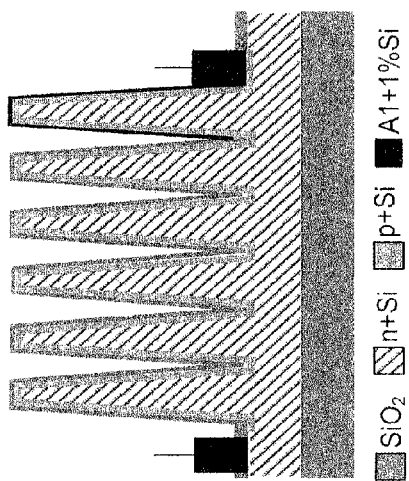
FIG. 23a is a schematic side diagram illustrating fabrication of nanowire structure configured to output an electrical signal responsively to absorbed electromagnetic radiation.
Figure 23C:
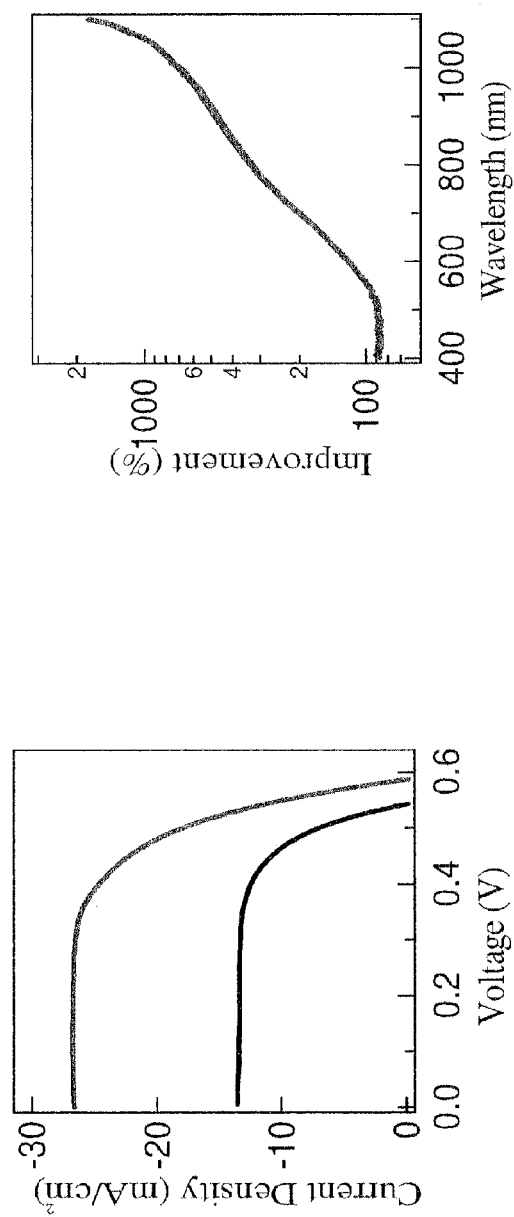
FIG. 23c is a diagram illustrating spectrally resolved absorptivity improvements of a frustoconical nanowire pillar array.
Figure 23B:
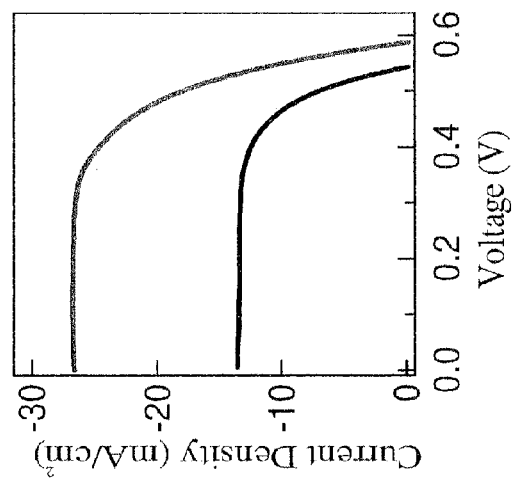
FIG. 23b is a diagram illustrating representative current density versus voltage measurements of an individual solar cell including a frustoconical nanowire pillar array.

FIG. 23b shows representative current density versus voltage measurements of the individual solar cells, under AM 1.5 G normal illumination of 100 mW/$cm^2$ at room temperature. For the solar cells with only controlled bare Si and with ordered Si NCF arrays (800 nm lattice constant), they had short circuit current densities ($J_{sc}$) of 13.6 and 26.4 mA/$cm^2$, open circuit voltages ($V_{oc}$) of 0.54 and 0.59 V, fill factors (FF) of 0.71 and 0.69, and efficiencies (η) of 5.2, 10.8%, respectively.

Referring to FIGS. 23a-23c, there is described solar cell output characteristics. Referring to FIG. 23a, FIG. 23a is a cross-section schematic drawing for the solar cell structures. Referring to FIG. 23b, FIG. 23b are Current density versus Voltage curves for the solar cells consisting of bare silicon (black), Si NCF arrays with 800 nm (blue), under AM 1.5 G normal illumination. Referring to FIG. 23c, FIG. 23c is spectrally resolved improvements in absorption for silicon NCF arrays with 800 nm lattice constant compared to that for bare silicon. The improvements are defined as the difference between values measured with ordered Si NCF arrays and those with bare silicon, divided by the value for bare silicon.

Without wishing to be bound to a single theory, the high energy conversion efficiency of the ordered Si NCF arrays is selected to be due to following reasons: (1) The ordered NCF structure arrays exhibit strong light trapping and absorption properties throughout the spectra range, with the presence of both photonic crystal enhancement effect and radii-variations induced broad band absorption. (2) The radial p-n junction structure offers the advantage of orthogonalizing the light absorption and carrier collection processes, providing high carrier collection efficiency. (3) The passivation silicon dioxide layer (~20 nm) by high temperature wet oxidation, highly reduces the large surface recombination loses. (4) These ordered Si NCF arrays have highly controllable orientation, pitch, and dimension, which could make sure all the $p^+/n^+$ diodes on each NCF have uniform and high device performances.

A large-area ordered silicon NCF arrays structure, exhibiting an impressive absorbance of ~99% over wavelengths 400-1100 nm by a thickness of only 5 µm, can be fabricated by using SPEL technique that has the potential for high lithography throughput, high resolution and low cost. High-efficiency energy conversion cells have been achieved using these ordered Si NCF arrays. Moreover, this novel high light-trapping structure arrays and the SPEL fabrication technique can be also used for low-cost substrate solar cells, using poly-silicon or other semiconductors.

Nanowire structures herein adapted for converting electromagnetic radiation into electrical energy can be utilized in larger apparatus.

In one embodiment, structure 100 as set forth herein can be utilized with a battery charging circuit. FIG. 24 shows structure 100 of the type having electrodes 502, 504 operatively coupled to a battery recharging circuit 514. Battery recharging circuit 514 in turn can be operatively coupled to rechargeable battery 520. The apparatus as shown in FIG. 24 can be utilized for energization of any portable or fixed mount electronic device.

Referring to FIG. 25, structure 100 can be utilized for solar energy conversion. Referring to FIG. 25 electrodes 502 and 504 of structure 100, e.g., the structure as shown in FIG. 25 can be coupled to inverter 510 for transformation of input DC electrical energy for output of AC electrical power. An AC output from inverter 510 can in turn be coupled to a power grid of an electrical power distribution system. Structure 100 can be disposed horizontally, e.g., at ground level or a roof top so that pillars 12 thereof extend upward for increased absorption of solar energy. In one embodiment, a configuration of structure 100 is such that structure 100 is absorptive in the infrared wavelength range, and wherein pillars 12 are formed of Silicon. A low cost scalable apparatus for wide band collection and conversion of solar energy is thus provided. Currently available solar panels require tracking devices for optimal orientation of a panel with the sun throughout a daylight period. With structure 100 which is configured for internal reflection of solar energy, such tracking devices are not required.

In the embodiment of FIG. 26, a plurality of structures 100 each forming a solar panel is distributed into a larger array 560 of solar panels. A plurality of columns of structures 100 can be series connected, and the series connected columns can be connected in parallel defining top and bottom terminals that can be connected to inverter 510 as shown in FIG. 26 for transformation of input DC electrical energy into output AC electrical power.

Regarding FIG. 27, FIG. 27 illustrates utilization of structure 100 in a silicon based infrared detector. In the embodiment of FIG. 27, structure 100 is of a type described herein in which pillars are formed of silicon, and which is at least 90% absorptive through the electromagnetic wavelength range 400 nm to 1000 nm (which can be realized using the structure indicated by the dashed line absorption plot of FIG. 210. For detection of infrared light a filter 572 for filtering electromagnetic radiation outside of the infrared band, e.g. a filter that filters visible light, can be disposed forward of structure 100. The apparatus of FIG. 27 can also include opaque shroud 574 for preventing light other than light transmitted by filter 572 from reaching structure 100. Circuit 570 can be operative to couple an electrical signal output from structure 10 to indicator 580, e.g. a light source, a display for displaying data corresponding to the signal, or to process control interface 582.

Referring to FIG. 28, a plurality of structures 100 as set forth herein can be disposed in photodetector array 602 having a plurality of adjacent structures 100 so that each structure 100 operates as a single photosite or picture element (pixel) of the photodetector array 602. The structures 100 can be disposed in linear photodetector array or in a two dimensional photodetector array as shown in the specific embodiment of FIG. 28. There is set forth herein an apparatus comprising a photodetector array having a plurality of photosite picture elements, wherein a characteristic photosite picture element of the photodetector array includes a nanowire structure having an array of nanowire pillars, and wherein the nanowire structure of the characteristic photosite picture element is configured to output an electrical signal responsively to an absorption of electromagnetic radiation by the array of nanowire pillars.

For establishing structures 100 such that each structure 100 operates as a pixel in the photodetector array each structure 100 can be established so that each structure stores a charge representative of light incident thereon independent of each other structure 100 of the photodetector array 602. The apparatus as shown in FIG. 29 can further include column circuitry 604 row circuitry 606 and control circuit 610 and each structure 100 can have appropriate pixel circuit 610 so that control circuit 612 can input into photodetector array 602, column circuitry 604, and row circuitry 606 control signals for exposure and readout of pixel image signals, and can read out image signals from photodetector array 602 on row by row basis until image data representing of light incident on photodetector array 602 is output. The image data that is output can be stored into a working memory for processing by a CPU (not shown). In the embodiment of FIG. 29 a spatial imaging apparatus is shown. The apparatus as shown in FIG. 29 includes photodetector circuit 624 as shown in FIG. 29. The spatial imaging apparatus of FIG. 29 in addition to including the components of the apparatus as shown in FIG. 28 can include an imaging lens for focusing a target object onto photodetector array 602. Where the structures 10 of array 602 are provided by the infrared absorbing embodiment of Example 2, a Silicon based infrared absorbing photodetector array is established.

It has been described that structure 100 adapted to include a flexible substrate can be adapted for use in a variety of applications including force detection applicants and substrate detection applications. Example 5 herein describes a nanowire structure for use in a force detecting application, while Example 6 illustrates use of a flexible nanowire structure in a substrate detection application.

Example 5

Figure 32:
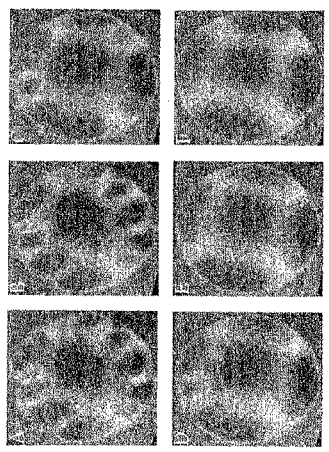
FIGS. 32a-32f are photographs illustrating nanowire pillar array color changes (illustrated in a monochrome view) with increasing pressure.
Figure 30:
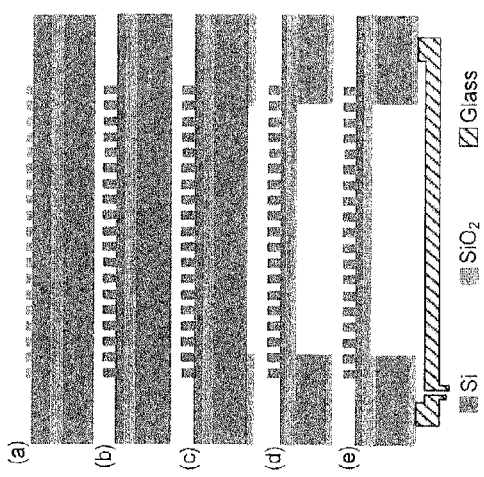
FIGS. 30a-30e are side schematic views illustrating a pressure sensor fabrication process.

Vertical silicon nanowire arrays (nanowire pillar arrays) with periodic photonic crystal structure, could selectively trap or diffract lights dependent on the light wavelength, nanowire diameter, and nanowire pitch space. Here, we realize a visual pressure sensor by fabricating controllable vertical silicon nanowire arrays on substrate configured to be flexible. Vertical nanowire pillar arrays with photonic crystal nanostructure could affect the propagation of electromagnetic waves in the same way as the periodic potential in a semiconductor crystal affects the electron motion by defining allowed and forbidden electronic energy bands. This gives rise to distinct optical phenomena such as high-reflecting omni-directional mirrors and low-loss-wave guiding. For the substrate with vertical silicon nanowire pillar arrays on top, bending the membrane by controlling the cavity pressure (FIG. 30), will lead to substrate color change due to the modulation of the nanowire pitch space and also the nanowire view angle (FIGS. 32 and 33).

Figure 31:
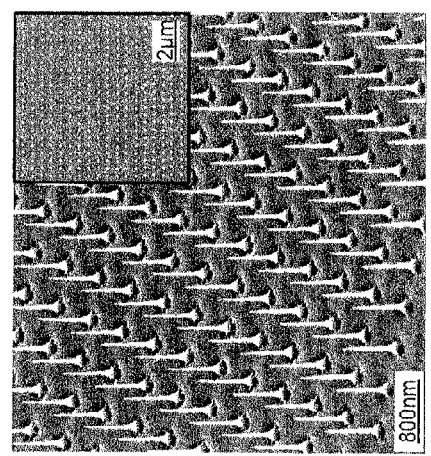
FIG. 31 is a perspective electron microscope image of a nanowire pillar array.

We used electron beam lithography to pattern the vertical silicon nanowire arrays, on a SOI wafer, by silicon RIE etching using $SiO_2$ nano-posts as the etching mask. The vertical silicon nanowire pillar array has 100 nm of wire diameter, 1 μm of nanowire pitch and 1.5 μm of nanowire height (FIG. 31). These nanowire pillar arrays show uniform wire diameter, controllable wire (pillar) orientation and pitch. Optical lithography with backside alignment was used to pattern the backside circular cavity (800 μm diameter), followed by silicon DRIE to etch through the silicon substrate using the back PECVD $SiO_2$ layer as the etching mask and the SOI buried oxide as the stopping layer. By modulating the displacement of the substrate (membrane) underneath, these photonic crystal nanowire structures will show different visual colors. Our visual pressure sensor showed high sensitivity between 0 Pa up to $8 \times 10^4$ Pa.

Referring to FIGS. 30a-30e, there are shown pressure sensor fabrication process schematic drawings. Referring to FIG. 30a, a thin layer (~300 nm) of PECVD $SiO_2$ was deposited on SOI wafer (3 μm Si/2 μm $SiO_2$). The PECVD $SiO_2$ layer was patterned by electron beam lithography using negative tone E-beam resist NEB31A, followed by oxide RIE etching. Referring to FIG. 30b, vertical Si pillar nanowire arrays were formed by Si RIE etching, using $SiO_2$ as the etching mask. Referring to FIG. 30c, a thick layer (~4 μm) PECVD $SiO_2$ was deposited on back side of the SOI wafer. Then it was patterned by optical lithography EV620 using backside alignment, followed by $SiO_2$ RIE etching. Referring to FIG. 30d, the SOI wafer Si substrate was etched through by Si deep RIE, using the back PECVD $SiO_2$ layer as the etching mask and the SOI buried oxide as the stopping layer. Referring to FIG. 30e, a glass pressure controller adapter was mounted to the back using an adhesive.

Referring to FIG. 31, FIG. 31 shown an SEM image (45 degree angle view) of the vertical Si nanowire pillar arrays, with 100 nm of wire diameter, 1 μm of nanowire pitch and 1.5 μm of nanowire height. The inset shows the top view SEM image of the $SiO_2$ posts arrays in FIG. 30a.

FIG. 32a-FIG. 32f show the top-view photograph images of the nanowire membrane color change as increasing the membrane load pressure from 0 Pa up to $8 \times 10^4$ Pa. The displacement corresponds to the maximum displacement of the center point of the circular membrane. The initial pattern is due to the stress of the thin film.

Figure 33A:
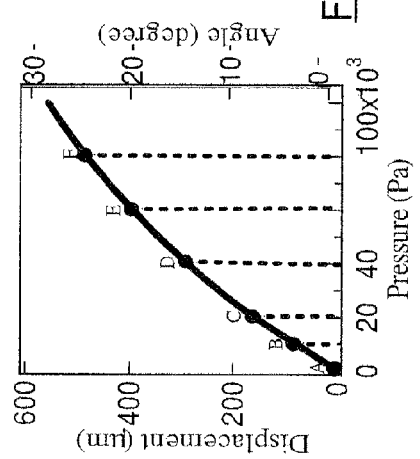
FIG. 33a is a diagram illustrating test data for a pressure sensor having a nanowire pillar array.

Referring to FIG. 33a visual pressure sensor experiment test and simulation is provided. The circular membrane has 800 μm diameter and its load pressure is defined as the pressure difference between the outside pressure and the cavity pressure.

Figure 33B:
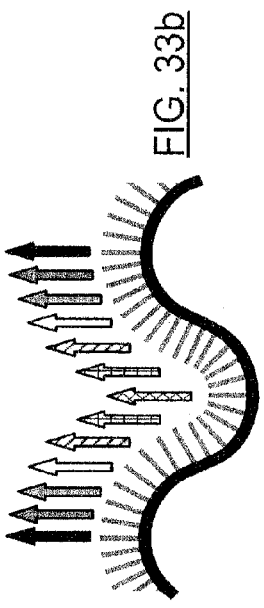
FIG. 33b is a side schematic diagram illustrating a mechanism explanation for light reflection changed on deformation of substrate supporting a nanowire pillar array.

Referring to FIG. 33b, there is set forth a schematic mechanism explanation for the light reflection from these photonic crystal vertical nanowire structures on bended membrane. The bending of the flexible substrate could modulate the pitch of the nanowire pillar arrays, resulting in wavelength dependent reflection for the areas with different nanowire densities. The arrows with different color correspond to the reflecting visible lights with different wavelengths.

Beside pressure sensing, the visual pressure sensor apparatus set forth herein could be used as a visual force sensor. The sensitivity could be enhanced by optimizing the membrane size and quality. Moreover, the demonstrated visual pressure sensor here could also be used for future touch screen or visual tiny force sensor applications.

Example 6

Figure 35:
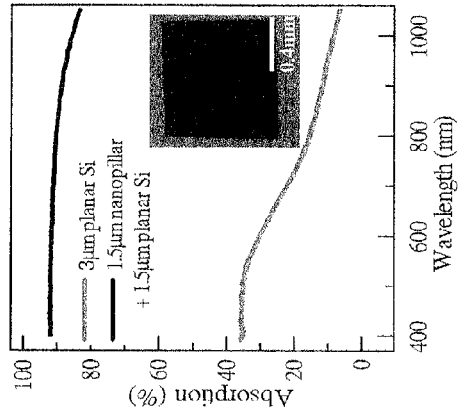
FIG. 35 is a diagram illustrating a measured light absorption spectra of a nanowire pillar array.
Figure 34:
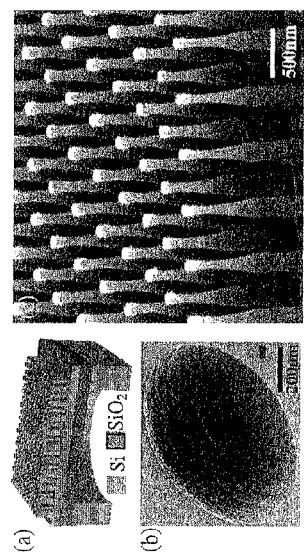
FIG. 34a is schematic view of a nanowire structure having a nanowire pillar array.
FIG. 34b is an electron microscopic image illustrating a backside cavity defined in a structure having a nanowire pillar array.
FIG. 34c shows an image of an example of a vertical silicon nano-pillar array with conical pillars of 1.5 μm in height, 250 nm in base diameter, 100nm in top diameter, and 600nm in pitch.

There is provided nanoscale photonic crystal optical absorbers for thermo-mechanical excitation of MEMS membrane resonators. Optical actuation for MEMS takes advantage of directly coupling of energy into selected device areas without any electrical interconnects as required in integrated electrostatic and piezoelectric actuation. In opto-thermo actuation, light incident onto the structures is absorbed and converted to heat via photon absorption. Here, we realized linear and broad-band optical actuation for circular Si/$SiO_2$ membrane oscillator with integrated vertical silicon nano-pillar photonic crystal arrays (FIG. 34a-34c). More importantly, we can use various lasers with different wavelength (from UV to near IR), or even modulated white light with continuous spectra, to actuate our oscillator, since the vertical silicon nano-pillar arrays with photonic crystal structures and wavelength comparable lattice constant, have been demonstrated to have highly enhanced broadband optical absorption efficiency (FIG. 35). Therefore, this realizes a high-efficiency broad-band optical actuation. In addition, the vertical nano-pillar arrays amplify the exposed surface area by five times for much higher sensitivities to mass-change based resonator sensors. The concurrent increasing in surface area and direct optical excitation and frequency detection facilitates use of the arrays for, e.g., MEMS bio-molecular or gas sensors.

Electron beam lithography was used to pattern the vertical silicon nano pillar arrays (nanowire pillar arrays) on a SOI wafer, followed by silicon RIE etching, using $SiO_2$ nano-posts as the etching mask. The vertical silicon nano-pillar array has conical pillars with 1.5 μm height, 250 nm base diameter, 100 nm top diameter, at a 600 nm pitch (FIG. 34c). As the photons enter the nano-pillar array they encounter an infinitum of reflective boundary conditions forming equivalent optical resonators at different wavelengths, resulting in light trapping. The measured optical absorption efficiency on these periodic (ordered) nanowire pillar arrays were more than 90% over broadband wavelengths 400~1000 nm (FIG. 35), consistent with the "fully black" surface (FIG. 35 inset). Optical lithography with backside alignment was used to pattern the backside circular cavity (FIG. 34b, 800 μm diameter), followed by silicon DRIE to etch through the silicon substrate using the SOI buried oxide as the stopping layer. A thin layer of nitride was deposited to compensate the compressive stress in the $SiO_2$ layer.

Figure 36:
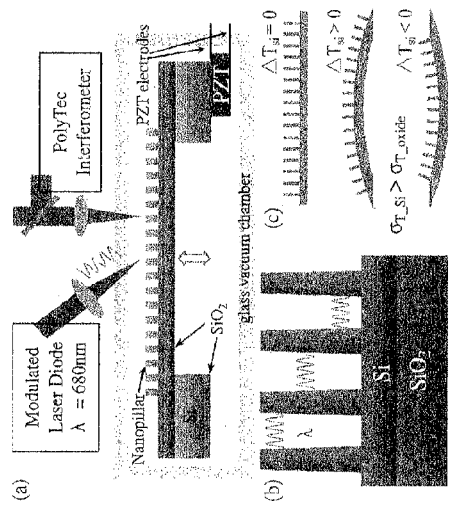
FIG. 36a-36b is a schematic diagram illustrating light trapping in a nanowire pillar array.
FIG. 36c is a schematic diagram illustrating bending moment of a structure having a nanowire pillar array.
Figure 37:
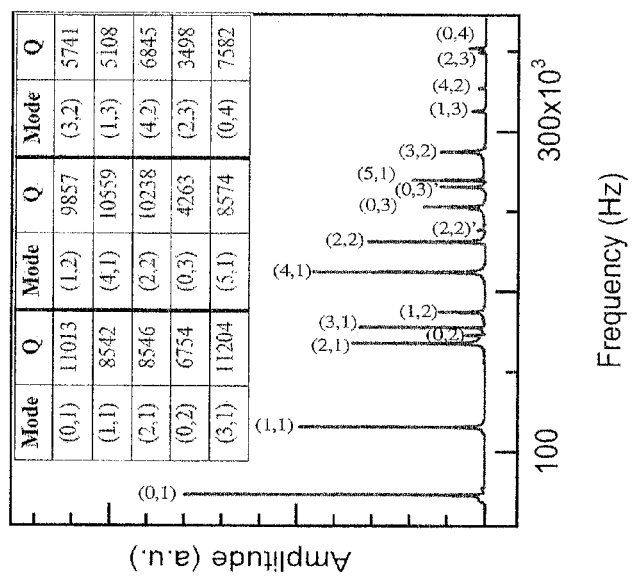
FIG. 37 is a diagram illustrating measured resonances spectra by independent actuation methods.

For optical excitation, the irradiation of the modulated laser diode was focused onto the center of the membrane with nano-pillar arrays. The local heating from the incident modulated laser leads to Si/$SiO_2$ bending moments (FIG. 36c). Since the top Si layer was thermally isolated by the $SiO_2$ and operation was in vacuum, convection losses are negligible. The calculated temperature gradient □T was less than 1 degree, with 2 μW laser diode AC output power used. In order to verify the optical excitation, we used piezoelectric actuation, by mounting a PZT plate to the backside of the device (FIG. 35a). The vibration deflection amplitude response of the membrane oscillator was measured by PolyTec interferometer with sub-1 nm resolution. Measured resonance spectra response of the membrane oscillator from optical actuation matched very well with the spectra from PZT excitation (FIG. 37). These data show linear optical actuation. Measured mapping patterns of the first fifteen modes for the Si/$SiO_2$ membrane oscillator with nano-pillar arrays were shown in FIG. 38. These experimental data matched well with the theoretical modes of a circular membrane. Remarkably, even modes with a node at the laser focus were excited as the photons are captured over the entire photonic crystal covering the membrane. Calculating the power in the laser beam of 2 μW AC power and the power lost by acoustic dissipation in each mode, we can calculate the efficiency of excitation of each mode, achieving a maximum excitation efficiency of 82%.

Referring to FIG. 34a, there is shown a schematic of the Si/SiO$_2$ (1.5 μm/2 μm) membrane with vertical Si nanopillar array (1.5 μm height). Referring to FIG. 34b, there is shown an SEM image (40° view) of the backside circular cavity. Referring to FIG. 34c, there is shown an SEM image (60° view) of the nanopillar arrays.

Referring to FIG. 35, three is shown measured light absorption spectra of the membrane with nanowire pillar arrays in FIG. 34c together with that of planar Si for compare. Inset shows photograph of device top surface with nanopillar arrays (black).

Referring to FIGS. 36a-36c, there is shown a schematic of light trapping and absorption in the photonic crystal nanopillar arrays. The light is absorbed and converted to heat as the photons generate electron-hole pairs which are then non-elastically recombined. Referring to FIG. 36c, there is shown a schematic for Si/SiO$_2$ bending moments, due to the local heating from the modulated laser.

Referring to FIG. 37, there is shown measured resonances spectra by two independent actuation methods: PZT actuation and optical actuation by the irradiation of the modulated laser diode. The modes are named by (n,m), where n is circular node and m is diametrical node. The m and n values are determined by experimental mode mapping and simulation (FIG. 37). Inset shows the schematic for experiment set up. The vibration amplitude and phase response of the membrane oscillator were measured using PolyTec interferometer. The laser diode was controlled by laser diode driver, with modulation input from a function generator. The PZT plate was actuated by another function generator.

Figure 38:
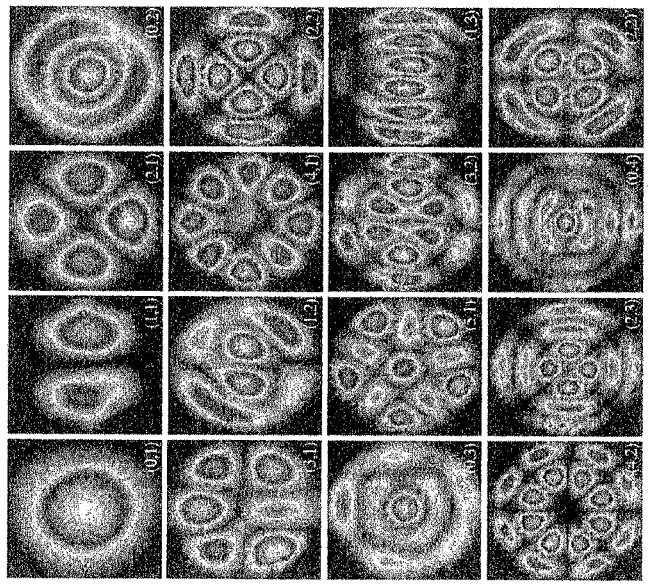
FIG. 38 illustrates mapping patterns for a plurality of modes of a structure having a nanowire pillar array.

Referring to FIG. 38, there is shown mapping patterns of the first fifteen modes (plus one non-degenerated mode (22)') for the Si/SiO$_2$ membrane oscillator with nano-pillar arrays. During mapping, the optical actuation was fixed at the resonance mode and the interferometer laser gun was controlled by a stage controller for lateral movement with sub-10 μm lateral resolution. These experiment data matched well with the theoretical modes of circular membrane. The non-degenerated mode (22)' is due to system asymmetry.

In one aspect, the described technology relates to the production of solar cells through the use of radio isotope powered electron lithography. Through the use of radio isotope powered electron lithography a novel architecture has been created comprising a nanowire array having very high aspect ratio of 40 to 1 with substantially vertical walls. Solar cells produced with this process have demonstrated increased efficiency and may produce multifunctional solar cells with integrated batteries. Variation of the spacing and pitch of the nanowire array allow for tuning of the wavelength of the reflected light.

Self-Powered Electron Lithography (SPEL) is used to fabricate the mask. Low stress LPCVD nitride (4500 nm) is deposited on double polished silicon wafer, followed by sputtering of thin layer (150 nm) of tungsten (W) and 30 nm layer of Chromium (Cr) evaporation on the front side. E-beam patterning is performed next using ZEP520 resist. Chromium radioisotope etching (Cr RIE) is performed using ZEP520 as the etching mask. Tungsten radioisotope etching (W RIE) (CF$_4$/SF$_6$) is then performed using Chromium 9Cr) as the etching mask. The back side nitride window patterning is performed by optical lithography, nitride REI etching, followed by KOH (80 C) Silicon etching to etch through the silicon wafer.

Solar cells directly convert light into electricity, and use similar physics and technology as that used in the microelectronics industry. The direct conversion of sunlight into energy using solar cells is called the photovoltaic effect. High-efficiency solar cells generate more electricity per incident solar power unit (watt/watt). Much of the industry is focused on the most cost efficient technologies in terms of cost per generated power.

Electron beam exposure is the tool of choice for highest resolution lithography, but suffers from the low throughput during serial beam writing. We have designed and developed a low-cost Self-Powered Electron Lithography (SPEL) technique, which utilizes the spontaneously emitted energetic electrons from beta-emitting radioisotope thin-films. This approach enables massively parallel e-beam lithography, with almost no limit on concurrently exposed surface area. This method potentially eliminates the need for vacuum systems and the electron focusing column as needed in existing electron beam lithography systems. This will greatly simplify the overall lithographic system, and reduce cost of deep-sub nanometer lithography (T. Ito, S. Okazaki, Nature 406, 1027 (2000); R. F. Pease, S. Y. Chou, Proceedings of the IEEE 96, 248 (2008). In SPEL, emitted electrons are spatially blocked using a nano-stenciled micromachined mask that is placed in proximity to an electron sensitive resist on silicon substrate (FIG. 1 of Exhibit 1). The electrons that are not blocked, impact and enter the photoresist, along with secondary electrons generated by primary electrons impacting the sidewalls of the stencil layer.

Using 3D Monte Carlo simulations, we show that the critical dimension in our system could be down to 20 nm with 17 keV electrons emitted from $^{63}$Ni. Our 3D MC simulation considered both elastic scattering and inelastic scattering for the high energetic primary electrons as well as the cascade secondary electrons generated. (Z. J. Ding, R. Shimizu, Scanning 18, 92 (1996)) The 20 nm limit is imposed by the secondary emission scattering. In order to prove SPEL concept, experiments were conducted using the safe, and low-activity (10 mCi/cm2) beta particle emitting 63Ni thin film source with electrons emitted at average energy of 17 keV. We exposed negative tone resist NEB31A, and a minimum gap between photoresist posts of 100 nm was achieved. The secondary electrons generated by the mask are also useful for exposure. The laterally emitted electrons are stopped by mask layer. The mask material should have high stopping power to maximally absorb lateral electrons and also have good conductivity to eliminate the charging effect. Compared with currently used electron beam lithography (EBL) with serial raster scanning taking days to expose a wafer, our lithography system will enable parallel exposure of large patterns on arbitrarily large wafers in several minutes. Along with the modeling and experimental results, we will present a trade study of using different radioisotopes and effect on resolution and throughput.

Figure 39:
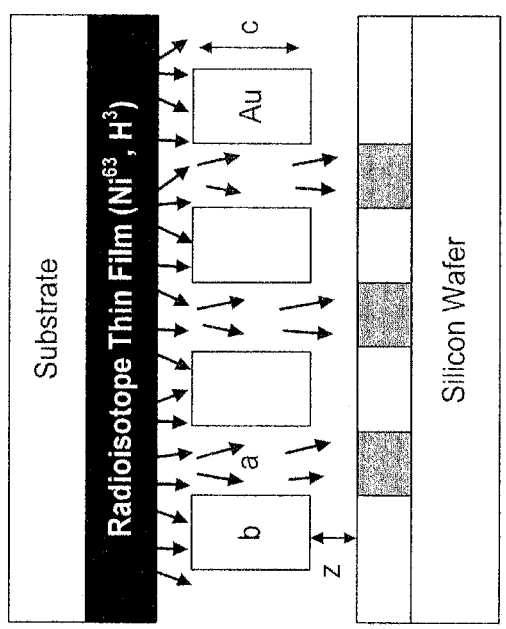
FIG. 39 is a schematic drawing for a self-powered electron lithography setup.

FIG. 39 is a schematic drawing for a self-powered electron lithography setup showing (a) the width of the line holes in nano-stenciled Au mask, (b) a separation of the lines holes, (c) the thickness of the mask needed to fully block beta particles in non-hole region, and (z) the tunable proximity to contact.

Figure 40:
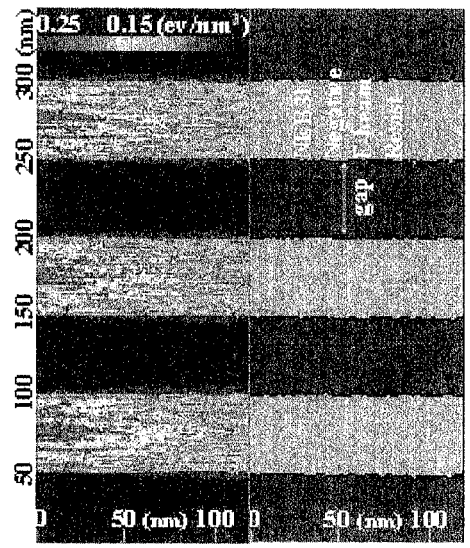
FIG. 40 is a 3D Monte Carlo simulation of the exposure and development processes.

FIG. 40 is a 3D Monte Carlo simulation of exposure and development processes using Ni thin film source to expose negative electron beam resist NEB31A, with Au mask, a=b=50 nm, c=400 nm, z=0 nm (contact). 175,000 electrons in a 350×150 nm$^2$ area were used. Top image is for exposure process showing the cross-section contour plot of the energy density absorbed by resist NEB31A. The bottom image shows the resist profile using dose-based development model.

Figure 41:
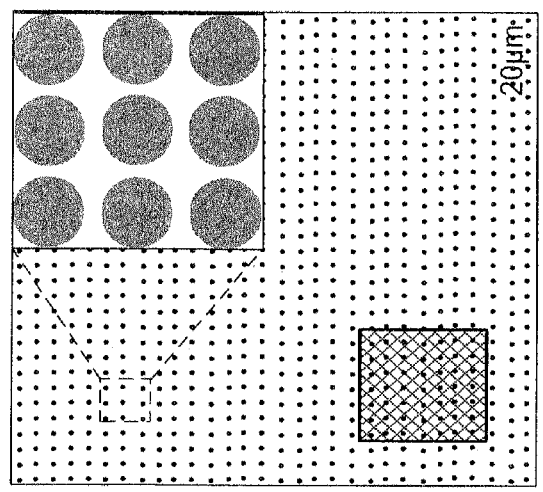
FIG. 41 is a scanning electron microscopy (SEM) image of the resist pattern.

FIG. 41 illustrates scanning electron microscopy (SEM) image of the resist pattern. Proof of concept experimental demonstration for the self-powered electron lithography system using radioactive $^{63}$Ni thin film source (I=12 pA/cm$^2$) to expose the nano-stenciled Au mast (circle-hole shape) that is placed in proximity to negative e-beam resist NEB31A (12 nm). Left-bottom inset shows the optical image of the Au membrane mask (500 nm in thickness).

Figure 42:
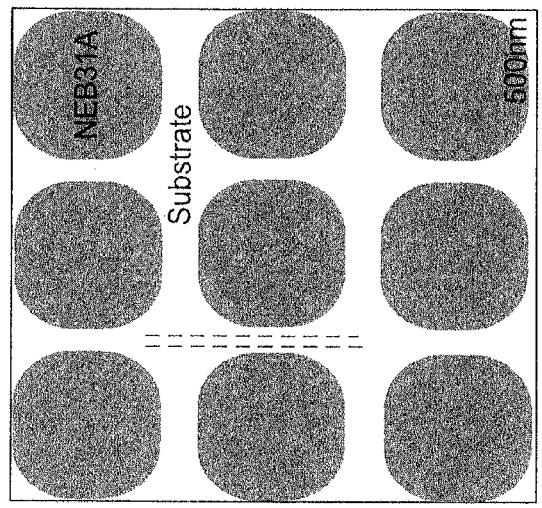
FIG. 42 is a SEM image of a NEB31A pattern.

FIG. 42 illustrates an SEM image of NEB31A pattern with ~100 nm gap, using $^{63}$Ni thin film source (I=12 pA/cm$^2$) with Au mask (quasi-square hole shape).

With reference to FIGS. 43-49 there is set forth a method including use of RIPEL to make solar cells with 12~15% efficiency. Large scale fabrication of high efficiency solar cells may be possible. Also, multifunctional solar cells may be possible as well with integrated batteries.

Figure 44:
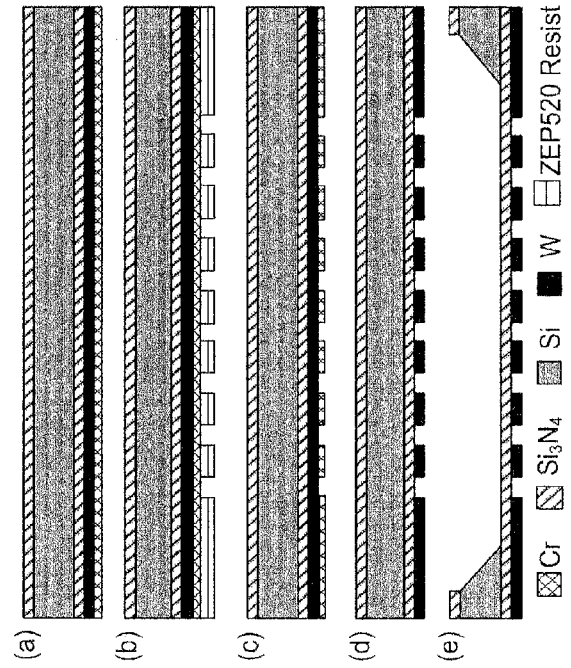
FIGS. 44a-44e are schematic diagrams illustrating a RIPEL mask fabrication process.
Figure 43:
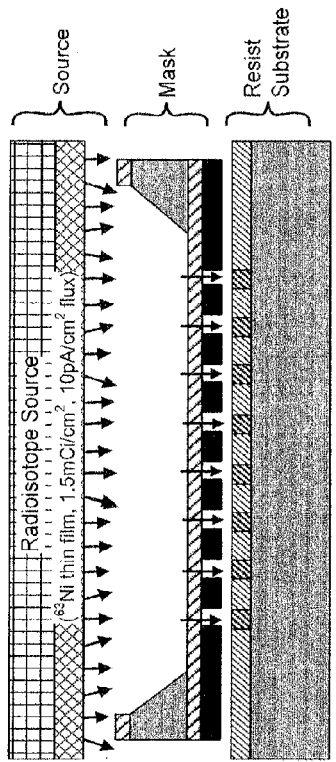
FIG. 43 is a diagram showing a schematic of RIPEL experimental set up.

Referring to FIGS. 43-44e, there is described SPEL experimental set up and mask fabrication process.

Referring to FIG. 43, there is shown a schematic of RIPEL experimental set up.

Referring to FIG. 44a-44e, there is shown a RIPEL mask fabrication process. (a) Low stress LPCVD nitride (600 nm) deposition on double polished Si (100) wafer, followed by 700 nm of W sputtering and 100 nm of Cr evaporation on the front side. (b) E-beam patterning, using ZEP520 resist. (c) Cr RIE etching, using ZEP520 as the etching mask. (d) W RIE (CF$_4$/SF$_6$) etching, using Cr as etching mask. (e) Back side nitride window patterning by optical lithography, nitride RIE etching, followed by KOH (80° C.) Si etching to etch through the Si wafer.

Figure 45:
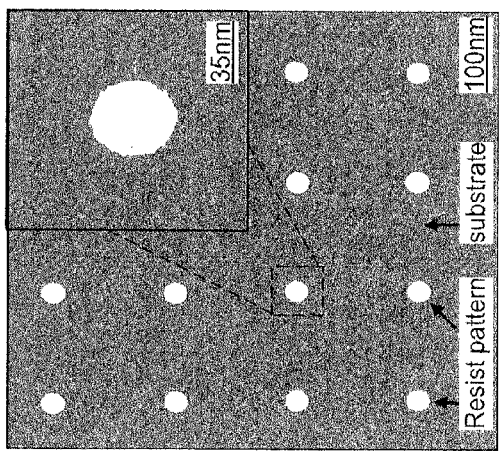
FIG. 45 is an image of a mask for use in making an array of nanowire pillars.
Figure 46:
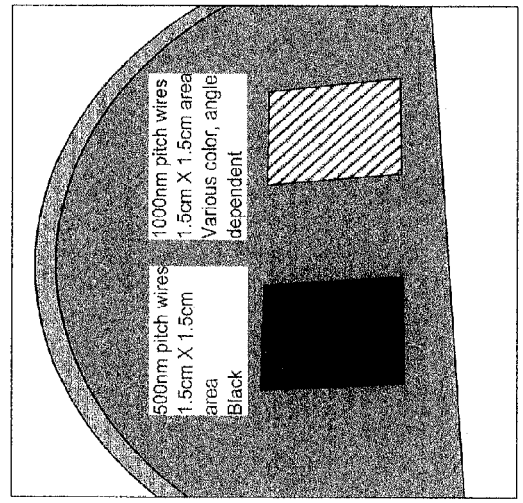
FIG. 46 is an image of a resist for use in making an array of nanowire pillars.

Referring to FIG. 45 and FIG. 46 SPEL Critical Dimension Pushing (~35 nm demonstrated) is shown. In FIG. 45 there is shown an image of a mask.

Referring to FIG. 46 there is shown an image of a resist.

Figure 47:
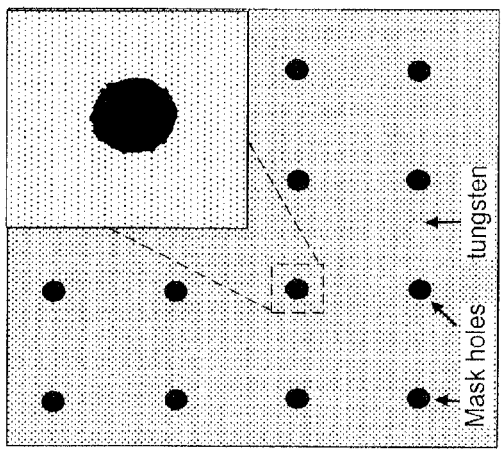
FIG. 47 is an image of an periodic array of nanowire pillars having a characteristic pillar diameter of about 250 nm and a characteristic pillar height of 10,000 nm.

Referring to FIG. 47 there is shown Nanowire Arrays Fabricated Using SPEL followed by RIE etching.

Figure 48:
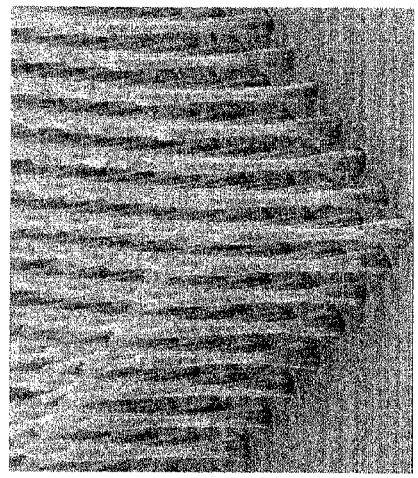
FIG. 48 is a photograph showing a first sample with 500 nm pitch wires 1.5 cm×1.5 cm area black and a second sample having 1000 nm pitch wires 1.5 cm×1.5 cm area exhibiting various colors that are angle dependent.

Referring to the left sample of FIG. 48, there is shown 500 nm pitch wires 1.5 cm×1.5 cm area black.

Referring to the right sample of FIG. 48, there are shown 1000 nm pitch wires 1.5 cm×1.5 cm area various color, angle dependent.

Figure 49:
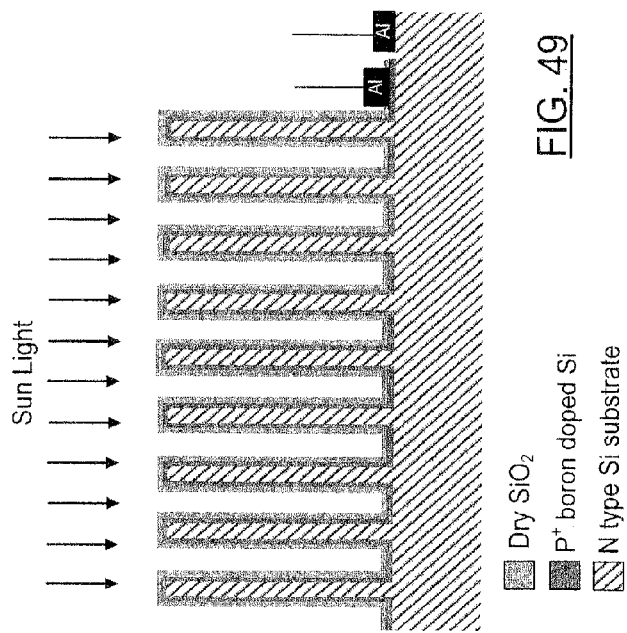
FIG. 49 is a side schematic diagram illustrating an array of nanowire pillars configured for electrical signal output.

Referring to FIG. 49, data respecting the structure shown in FIG. 49 is presented in Table A.

TABLE A

| Boron implantation condition: |
| --- |
| Energy: 7 kev |
| Dose: 2E15 |
| Penetration depth: ~30 nm |
| With 7 degree rotation. |
| Wire: 500 nm pitch |
| Height: 10 um |
| Diameter: ~100 nm |

Figure 50:
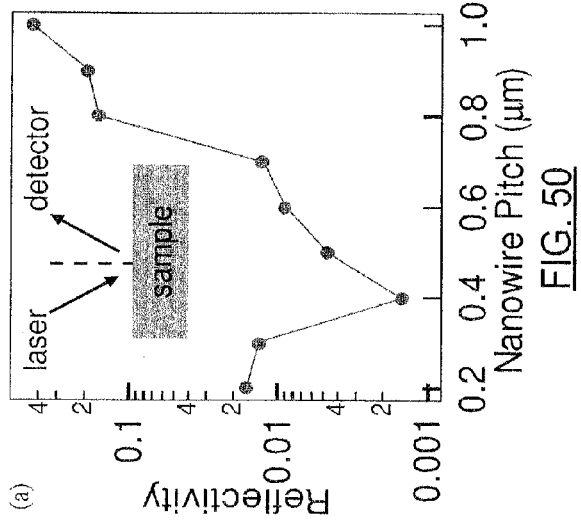
FIG. 50 is a diagram illustrating test data for various samples wherein pitch is varied for the samples.
Figure 51:
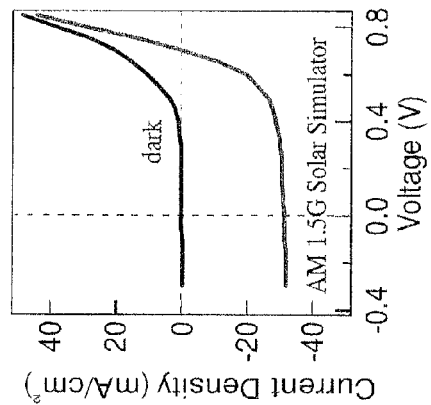
FIG. 51 is a diagram illustrating test data for a sample having a pitch of 400 nm.

Referring to FIGS. 50 and 51, FIGS. 50 and 51 are test data diagrams for a patterned parallel Si nanowire array based solar cell;

Referring to FIG. 50, FIG. 50 is a plot of reflectivity v. nanowire pitch measurement using 690 nm laser with constant incident angle 10 degree.

Referring to FIG. 51, FIG. 51 is a plot for best solar cell device, with nanowire pitch 400 nm and measured efficiency ~15.3%.

Accordingly, in view of FIGS. 39-51 and the accompanying description, there is set forth herein (a) an apparatus comprising: a plurality of nanowire pillars, a substrate supporting the plurality of nanowire pillars, wherein the plurality of nanowire pillars are arranged in a periodic array, the periodic array being a two dimensional periodic array, wherein the periodic array is characterized by a pillar to pillar pitch of less than about 800 nm, wherein the periodic array is further characterized by a pillar aspect ratio of greater than about 5:1. There is also accordingly set forth herein the apparatus of (a), wherein pillars of the plurality of nanowire pillars define semiconductor p-n junctions for generating electrical current responsively to absorption of electromagnetic radiation.

There is also accordingly set forth herein in view of FIGS. 39-51 and the accompanying description (b) an apparatus comprising structure including a plurality of nanowire pillars; wherein the structure further includes a substrate supporting the plurality of nanowire pillars, the plurality of nanowire pillars being formed of semiconductor material; wherein the plurality of nanowire pillars are arranged in a periodic array, the periodic array being a two dimensional periodic array, and wherein pillars of the plurality of pillars define semiconductor p-n junctions for generating electrical current responsively to absorption of electromagnetic radiation. There is also accordingly set forth herein the apparatus of (b), wherein the semiconductor p-n junctions are formed by doping the pillars using ion-implantation. There is also accordingly set forth herein the apparatus of (b), wherein the apparatus further includes a passivation layer over the plurality of nanowire pillars. There is also accordingly set forth herein the apparatus of (b), wherein the p-n junctions define a p region and an n region for the apparatus, and wherein the apparatus further includes a first electrode in contact with the p region and a second electrode in contact with the n region.

There is also accordingly set forth herein the apparatus of (a) or (b), wherein pillar aspect ratio is greater than 10:1. There is also accordingly set forth herein the apparatus of (a) or (b), wherein the pillar aspect ratio is greater than 20:1. There is also accordingly set forth herein the apparatus of (a) or (b), wherein the pillar aspect ratio is greater than 30:1. There is also accordingly set forth herein the apparatus of (a) or (b), wherein the pillar aspect ratio is greater than 40:1. There is also accordingly set forth herein the apparatus of (a) or (b), wherein the pillar aspect ratio is greater than 50:1. There is also accordingly set forth herein the apparatus (a) or (b), wherein the pitch is less than 700 nm. There is also accordingly set forth herein the apparatus of (a) or (b), wherein the pitch is less than 600 nm. There is also accordingly set forth herein the apparatus of (a) or (b), wherein the pitch is less than 500 nm. There is also accordingly set forth herein the apparatus of (a) or (b), wherein the pillars are formed of silicon.

A small sample of system methods and apparatus described herein are as follows:

A1. An apparatus comprising:
a plurality of nanowire pillars;
a substrate supporting the plurality of nanowire pillars;
wherein the plurality of nanowire pillars are arranged in a periodic array, the periodic array being a two dimensional periodic array;
wherein the periodic array is characterized by a pillar to pillar pitch of less than about 800 nm;
wherein the periodic array is further characterized by a pillar aspect ratio of greater than about 5:1.

A2. The apparatus of A1, wherein the periodic array is characterized by a pillar shape having a base cross sectional area larger than a top cross sectional area.

A3. The apparatus of A1, wherein the periodic array is characterized by a conical pillar form.

A4. The apparatus of A1, wherein the periodic array is characterized by a frustoconical pillar form.

A5. The apparatus of A1, wherein the periodic array is characterized by bases of adjacent ones of the plurality of pillars being in contact with one another.

A6. The apparatus of A1, wherein the substrate comprising a single layer of material.

A7. The apparatus of A1, wherein the substrate comprises a plurality of layers of material.

A8. The apparatus of A1, wherein the substrate is provided by a flexible substrate.

A9. The apparatus of A1, wherein the periodic array is characterized by a pillar to pillar pitch of less than 600 nm.

A10. The apparatus of A1, wherein the periodic array is characterized by a pillar aspect ratio of greater than 20:1.

A11. The apparatus of A1, wherein the plurality of pillars are formed of semiconductor material.

A12. The apparatus of A1, wherein the plurality of pillars are formed of silicon.

A13. The apparatus of A1, wherein the plurality of pillars are vertically extending.

A14. The apparatus of A1, wherein the structure is fabricated utilizing Radio Isotope Power Electron Lithography etching.

B1. An apparatus comprising:
a plurality of nanowire pillars;
a substrate supporting the plurality of nanowire pillars;
wherein the plurality of nanowire pillars are arranged in a periodic array, the periodic array being a two dimensional periodic array;
wherein the periodic array is further characterized by a pillar aspect ratio of greater than about 5:1; and
wherein the plurality pillars are configured so that the apparatus exhibits at least 90% absorption when exposed to electromagnetic radiation throughout the wavelength range of from about 400 nm to about 1000 nm.

B2. The apparatus of B1, wherein the plurality of nanowire pillars are formed of silicon.

B3. The apparatus of B1, wherein pillars of the plurality of pillars define semiconductor p-n junctions for generating electrical current responsively to absorption of electromagnetic radiation.

B4. The apparatus of B1, wherein the plurality pillars are configured so that the apparatus exhibits at least 90% absorption when exposed to electromagnetic radiation throughout the wavelength range 400 nm to 1000 nm.

B5. The apparatus of B1, wherein the plurality pillars are configured so that the apparatus exhibits at least 90% absorption when exposed to electromagnetic radiation throughout the wavelength range of from about 200 nm to about 1200 nm.

C1. An apparatus comprising:
a plurality of nanowire pillars;
a substrate supporting the plurality of nanowire pillars;
wherein the plurality of nanowire pillars are arranged in a periodic array, the periodic array being a two dimensional periodic array;
wherein the periodic array is configured so that the periodic array exhibits a reflectivity of at least 10% when exposed to electromagnetic radiation having a wavelength throughout the range of from about 200 nm to about 1000 nm.

C2. The apparatus of C1, wherein the periodic array is configured so that the periodic array exhibits a reflectivity of at least 10% when exposed to electromagnetic radiation having a wavelength throughout the range 200 nm to 1000 nm.

D1. An apparatus comprising:
a structure including a plurality of nanowire pillars;
wherein the structure further includes a substrate supporting the plurality of nanowire pillars, the plurality of nanowire pillars being formed of semiconductor material;
wherein the plurality of nanowire pillars are arranged in a periodic array, the periodic array being a two dimensional periodic array;
wherein pillars of the plurality of pillars define semiconductor p-n junctions for generating electrical current responsively to absorption of electromagnetic radiation.

D2. The apparatus of D1, wherein the apparatus is configured so that the substrate is flexible, and wherein the apparatus is configured so that deformation of the substrate changes an absorptivity and reflectivity characteristic of the two dimensional array.

D3. The apparatus of D1, wherein the semiconductor p-n junctions are formed by doping the pillars using ion-implantation.

D4. The apparatus of D1, wherein the semiconductor p-n junction are formed by epitaxial growth.

D5. The apparatus of D1, wherein the semiconductor p-n junctions are formed by chemical vapor deposition.

D6. The apparatus of D1, wherein the apparatus further includes a passivation layer over the plurality of pillars.

D7. The apparatus of D1, wherein the apparatus further includes a passivation layer over the plurality of pillars, and formed over the plurality of pillars by thermal oxidization for reduction of surface recombination errors.

D8. The apparatus of D1, wherein the p-n junctions define a p region and an n region for the apparatus, and wherein the apparatus further includes a first electrode in contact with the p region and a second electrode in contact with the n region.

D9. The apparatus of D1, wherein the semiconductor p-n junctions define an outer semiconductor junction region for the apparatus and inner semiconductor junction region for the apparatus, and wherein the outer semiconductor junction region is doped to a doping level on the order of at least $10^{18}/cm^3$ wherein apparatus includes a passivation layer adjacent the outer semiconductor junction region, the apparatus further having an electrode in contact with the outer semiconductor region.

D10. The apparatus of D1, wherein the plurality of pillars are configured so that the plurality of pillars exhibit at least 90% absorption when exposed to electromagnetic radiation throughout the wavelength range 400 nm to 1000 nm.

D11. The apparatus of D1, wherein the plurality of pillars are configured so that the plurality of pillars exhibit at least 90% absorption when exposed to electromagnetic radiation throughout the wavelength range 200 nm to 1200 nm.

D12. The apparatus of D1, further including an inverter for transforming direct current output from the structure into alternating current.

D13. The apparatus of D1, wherein the pillars are formed of silicon and configured to be at least 90% absorptive throughout the wavelength range 400 nm to 1000 nm.

D14. The apparatus of D1, wherein the pillars are formed of silicon and configured to be at least 90% absorptive of electromagnetic radiation throughout the wavelength range 400 nm to 1000 nm, the apparatus further including a filter for filtering electromagnetic radiation in the visible wavelength band.

E1. An apparatus comprising:
a photodetector array comprising a plurality of photosite picture elements;

wherein a characteristic photosite picture element of the photodetector array includes a nanowire structure having an array of nanowire pillars, wherein the nanowire structure of the characteristic photosite picture element is configured to output an electrical signal responsively to an absorption of electromagnetic radiation by the array of nanowire pillars.

E2. The apparatus of E1, further comprising an imaging lens for focusing an image onto the photodetector array.

E3. The apparatus of E1, further comprising an imaging lens for focusing an image onto the photodetector array, and a filter that filters visible light disposed in an optical receive path of the apparatus.

E4. The apparatus of E1, wherein pillars of the array of nanowire pillars of the characteristic photosite picture element are formed of silicon and wherein the array of nanowire pillars of the characteristic photosite picture element is configured to be at least 90% absorptive electromagnetic radiation through the wavelength range of 400 nm to 1000 nm E5. The apparatus of E1, wherein the array of nanowire pillars of the characteristic photosite picture element is configured to be at least 90% absorptive electromagnetic radiation through the wavelength range of 200 nm to 1200 nm, and wherein the apparatus further includes a filter that filters visible light disposed in an optical receive path of the apparatus.

E6. The apparatus of E1, wherein the nanowire structure of the characteristic photosite picture element of the photodetector array includes first and second regions defining first and second nanowire pillar arrays, the first and second nanowire pillar arrays being differentiated by one or more of pitch and form.

F1. An apparatus comprising:
a nanowire structure having a plurality of nanowire pillars;
wherein the nanowire structure further includes a substrate supporting the plurality of nanowire pillars;
wherein the plurality of nanowire pillars are arranged to define a two dimensional array of nanowire pillars;
wherein the apparatus is configured so that the substrate is flexible, and wherein the apparatus is further configured so that deformation of the substrate changes an absorptivity and reflectivity of pillars included in the two dimensional array.

F2. The apparatus of F1, wherein the two dimensional array is configured to exhibit at least 90% absorption through the wavelength range of between 400 nm and 1000 nm.

F3. The apparatus of F1, wherein the two dimensional array is configured to exhibit a reflectivity of at least 10% through the electromagnetic wavelength range of between 200 nm and 1000 nm.

F4. The apparatus of F1, wherein the flexible substrate is a single layer silicon substrate that is of unitary construction with the plurality of pillars.

F5. The apparatus of F1, wherein the flexible substrate includes a plurality of layers, the plurality of layers including a first layer and an adjacent second layer, the first layer having a coefficient of thermal expansion different from a coefficient of thermal expansion of the second layer.

F6. The apparatus of F1, wherein the array of nanowire pillars is fabricated by providing using an Si/SiO$_2$/Si wafer, etching the top Si layer to form the nanowire pillars and etching to remove a portion of the bottom Si layer.

F7. The apparatus of F1, wherein the apparatus includes an electromagnetic radiation source for radiating pillars of the plurality of nanowire pillars.

F8. The apparatus of F1, wherein the apparatus includes a detector for detecting light reflected from pillars of the plurality of nanowire pillars.

F9. The apparatus of F1, wherein the apparatus includes a mechanical actuator for moving the substrate.

F10. The apparatus of F1, wherein the apparatus is configured so that when the substrate deforms, a spacing of pillars of the plurality of nanowire pillars changes.

F11. The apparatus of F1, wherein the apparatus is configured so that when the substrate deforms, an angle of pillars of the plurality of nanowire pillars changes.

F12. The apparatus of F1, wherein the structure has a first region defining a first array of nanowire pillars and a second region defining a second array of nanowire pillars, the first region and the second region being differentiated based on one or more of pillar pitch, pillar form, and pillar orientation, and pillar periodic/aperiodic classification.

F13. The apparatus of F1, wherein the two dimensional array is configured to exhibit at least 90% absorption through the wavelength range of between 200 nm and 1200 nm.

G1. A method comprising:
providing a structure including a plurality of nanowire pillars, the providing including providing the plurality of nanowire pillars to be arranged on a substrate in a two dimensional array, the providing including providing the structure so that pillars included in the plurality of nanowire pillars exhibit an absorptivity and reflectivity characteristic that is responsive to a force imparted to the structure;
receiving at the structure a force imparted to the structure so that an absorptivity and reflectivity characteristic of pillars included in the plurality of nanowire pillars changes from a first characteristic to a second characteristic.

G2. The method of G1, wherein the method includes detecting an absorptivity and reflectivity of the pillars when the force is received at the structure, the absorptivity and reflectivity indicating a characteristic of the force imparted to the structure.

G3. The method of G1, wherein the providing includes providing the structure to that a visible color exhibited by the pillars is responsive to a force imparted to the structure, and wherein the method includes visually observing an exhibited color profile of the pillars when the force is received at the structure.

G4. The method of G1, wherein the providing includes providing the structure to output an electrical signal responsively to a force being imparted to the structure, the method includes outputting an electrical signal indicative of the force received at the structure.

G5. The method of G1, wherein the providing includes providing the structure with a larger apparatus defining a sealed cavity that provides a pressure reference.

H1. A method comprising:
providing a structure including a plurality of nanowire pillars, the providing including providing the plurality of nanowire pillars to be arranged on a substrate in a two dimensional array, the providing including providing the structure so that pillars included in the plurality of nanowire pillars exhibit an absorptivity and reflectivity that is responsive to a temperature in an environment of the structure;
exposing the structure to an environment of a certain temperature so that absorptivity and reflectivity of pillars included in the plurality of nanowire pillars is indicative of the certain temperature of the environment.

H2. The method of H1, wherein the method includes detecting an absorptivity and reflectivity characteristic of the pillars when the structure is exposed to the environment, the absorptivity and reflectivity characteristic indicating the certain temperature of the environment.

H3. The method of H1, wherein the providing includes providing the structure so that a visible color exhibited by the pillars is responsive to a temperature of the structure, and wherein the method includes visually observing an exhibited color profile of the pillars when the structure is exposed to the environment of the certain temperature.

H4. The method of H1, wherein the providing includes providing the structure to output an electrical signal responsively to a temperature of an environment of the structure, the method including outputting an electrical signal indicative of the certain temperature of the environment to which the structure is exposed.

H5. The method of H1, wherein the providing includes providing the structure so that the pillars include semiconductor p-n junctions for generating an electrical signal responsively to a temperature of an environment of the structure, the providing including providing the structure so that the substrate deforms responsively to a temperature in an environment of the structure. the method including generating an electrical signal indicative of the certain temperature of the environment to which the structure is exposed.

H6. The method of H1, wherein the providing includes providing the substrate to include first and second layers of material having different coefficients of thermal expansion.

H7. The method of H1, wherein the providing includes providing the structure so that the pillars exhibit a spacing change responsively to the structure being exposed to an environment undergoing a temperature change.

I1. A method comprising:
providing a structure including a plurality of nanowire pillars arranged in a two dimensional array on a substrate in thermal communication with the plurality of nanowire pillars, wherein pillars included in the plurality of nanowire pillars are configured to absorb electromagnetic radiation;
directing electromagnetic radiation toward the pillars to induce thermal expansion of the substrate and movement of the plurality of nanowire pillars.

I2. The method of I1, wherein the directing includes directing light from a light source onto the pillars.

I3. The method of I1, wherein the directing includes directing light from a light source onto the pillars, the light having an amplitude that is modulated at a frequency corresponding to a mechanical resonance of the structure.

I4. The method of I1, wherein the directing includes directing amplitude modulated light from a light source onto the pillars, the light source being amplitude modulated at a frequency that corresponds to a mechanical resonance frequency of the substrate.

I5. The method of I1, wherein the method further includes sensing reflected light reflected from the pillars.

I6. The method of I1, wherein the method further includes directing amplitude modulated radiation from an electromagnetic radiation source to the pillars and detecting reflected modulated radiation from the electromagnetic radiation source reflected from the pillars.

I7. The method of I1, wherein the providing includes providing the structure so that a certain substance if present in an environment will attach to the pillars, the method further including exposing the pillars to an environment, wherein the directing includes directing modulated light from a light source modulated at certain frequency corresponding to the mechanical resonance frequency of the substrate if the pillars have the substance attached thereto, and wherein the method further includes sensing reflected light of the light source reflected from the pillars for determination of whether the environment includes the substance.

I8. The method of I7, wherein the pillars include an attractant that is sensitive to a specific substance.

I9. The method of I7, wherein the pillars include an attractant provided by an antibody for attracting an antigen.

I10. The method of I7, wherein the pillars include an attractant provided by an oxide for attracting a certain gaseous molecule.

I11. The method of I7, wherein the pillars include an attractant provided by a DNA sequence for attracting a certain DNA sequence.

I12. The method of I1, wherein the providing includes providing the structure so that a certain substance if present in an environment will attach to the pillars, the method further including exposing the pillars to an environment, wherein the directing includes directing amplitude modulated light from a light source modulated at certain frequency corresponding to the mechanical resonance frequency of the substrate if the pillars have the substance attached thereto, and wherein the method further includes sensing reflected light of the light source reflected from the pillars for determination of whether the environment includes the substance.

I13. The method of I1, wherein the providing includes providing the structure so that a certain substance if present an environment will attach to the pillars, the method further including exposing the pillars to an environment, wherein the directing includes directing amplitude modulated light from a light source modulated at a sweep of frequencies including a certain frequency corresponding to the mechanical resonance frequency of the substrate if the pillars have the substance attached thereto, and wherein the method further includes sensing reflected light of the light source reflected from the pillars for determination of whether the environment includes the substance.

I14. The method of I1, wherein the providing includes providing the substrate to include first and second layers of material having different coefficients of thermal expansion.

J1. A method for determining a strain exhibited by a deformable body, the method comprising:
providing a deformable nanowire structure having a plurality of nanowire pillars arranged in a two dimensional array of nanowire pillars, the deformable nanowire structure having a substrate supporting the plurality of nanowire pillars;
disposing the deformable nanowire structure so that a deformation of the deformable body is translated to deform the deformable nanowire structure; and
observing a change in absorptivity and reflectivity of pillars included in the plurality of nanowire pillars.

J2. The method of J1, wherein the providing includes providing the deformable nanowire structure so that the two dimensional array is a periodic two dimensional array.

J3. The method of J1, wherein the disposing includes disposing the deformable nanowire structure so that the substrate is adjacent the deformable body.

J4. The method of J1, wherein the providing includes providing the deformable nanowire structure so that a visible color exhibited by the pillars is responsive to a deformation of the nanowire structure, and wherein the observing includes visually observing the pillars.

J5. The method of J1, wherein the observing includes detecting a change in absorptivity and reflectivity of the pillars by detecting reflected electromagnetic radiation reflected from the pillars.

J6. The method of J1, wherein the providing includes providing the nanowire structure so that the nanowire structure outputs an electrical signal responsively to electromagnetic radiation absorbed by the pillars, and wherein the detecting includes outputting an electrical signal from the nanowire structure.

J7. The method of J1, wherein the disposing includes disposing the deformable nanowire structure so that a deformation of an animal body is translated to the deformable nanowire structure K1. A method for determining a curvature of a curved body, the method comprising:
providing a deformable nanowire structure having a plurality of nanowire pillars arranged in a two dimensional array of nanowire pillars, the deformable nanowire structure having a substrate supporting the plurality of nanowire pillars, the deformable nanowire structure being configured so that the plurality of nanowire pillars have a first absorptivity and reflectivity when in an unstressed state, and an absorptivity and reflectivity different from the first absorptivity and reflectivity when in a deformed state;
disposing the deformable nanowire structure so that the deformable nanowire structure conforms to a curved surface of the curved body; and
observing absorptivity and reflectivity of pillars included in the plurality of nanowire pillars.

K2. The method of K1, wherein the providing includes providing the deformable nanowire structure so that the two dimensional array is a periodic two dimensional array.

K3. The method of K1, wherein the disposing includes disposing the deformable nanowire structure so that the substrate is adjacent the curved body.

K4. The method of K1, wherein the providing includes providing the deformable nanowire structure so that a visible color exhibited by the pillars is responsive to a deformation of the nanowire structure, and wherein the observing includes visually observing the pillars.

K5. The method of K1, wherein the observing includes detecting a change in absorptivity and reflectivity of the pillars by detecting reflected electromagnetic radiation reflected from the pillars.

K6. The method of K1, wherein the providing includes providing the deformable nanowire structure so that the nanowire structure outputs an electrical signal responsively to electromagnetic radiation absorbed by the pillars, and wherein the detecting includes outputting an electrical signal from the nanowire structure.

K7. The method of K1, wherein the disposing includes disposing the deformable nanowire structure so that the deformable nanowire structure conforms to a curved body provided by an animal body part.

K8. The method of K1, wherein the disposing includes disposing the deformable nanowire structure so that the deformable nanowire structure conforms to a curved body provided by an animal eye.

In the above described solar cell structures based on optically absorptive nanowire arrays, a spatially complementary electrode array that matches the nanowire array can be implemented to form a solar cell structure with a built-in electrical energy storage mechanism.

Figure 52A:
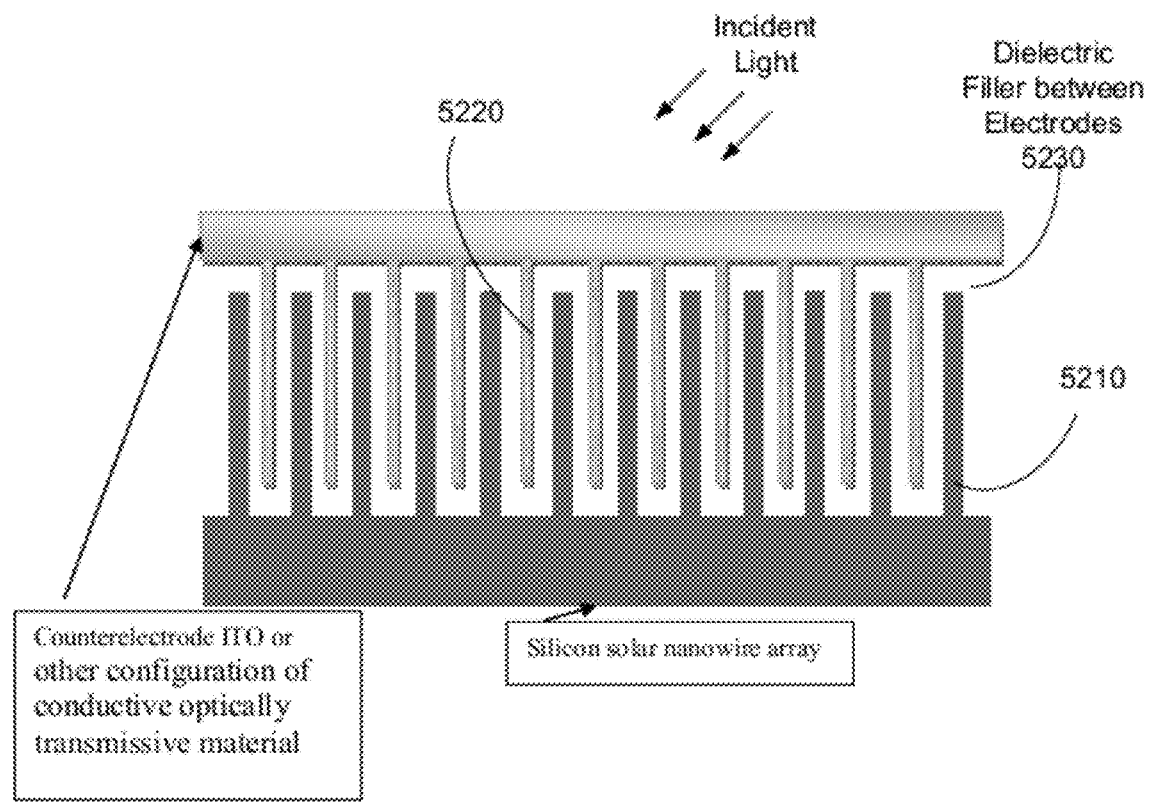
FIGS. 52A and 52B show an example of a solar cell device with an integrated storage.
Figure 52B:
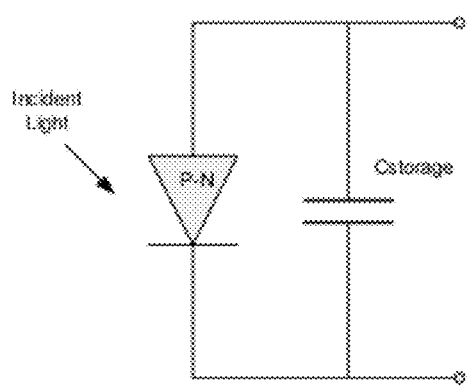

FIGS. 52A and 52B show an example of such a solar cell storage device. In this example, the device includes a nanowire array 5210 having nanowires that absorb light to produce electrical currents. In addition, a spatially complementary electrode array 5220 is formed on top of the nanowire array 5210. The electrodes of the electrode array 5220 are designed to match the nanowires of the nanowire array 5210 and are spatially shifted from the nanowires to spatially interleave with the nanowires. Under this design, two adjacent nanowire and electrode form a capacitor (Cstorage) which is charged up by the photo-induced current from the nanowire. Such charged-up capacitors serve to store the electrical energy generated by the nanowires. FIG. 52B illustrates the equivalent circuitry of the solar cell storage device in FIG. 52A.

In implementations, a dielectric filler material 5230, a liquid or solid dielectric material, can be filled between the top electrode array 5220 and the bottom nanowire array 5210. In fabrication, the nanowire array 5210 is first formed, and the dielectric filler material 5230 is then filled between the nanowires. Next, the top electrode array 5220, which is a counter electrode array with respect to the nanowire array 5210, is formed and the electrodes of the top electrode array 5220 are like needles or fingers that spatially interleave with the nanowires. For example, under this design, the nearest neighbors of each electrode of the top electrode array 5220 are nanowires and the nearest neighbors of each nanowire are electrodes of the top electrode array 5220. This design provides a large total surface area between the electrodes 5220 and the nanowires 5210 to provide a large storage capacity. The top electrode array 5210 can be made of an optically transparent electrode material, e.g., indium tin oxide (ITO), to allow transmission of light from the top to reach the underlying nanowire array 5210. This design provides a solar cell device that integrates a solar light converter with a energy storage mechanism.

The Si/SiO$_2$ bilayer structure of the nanowire array 100 has different thermal properties in the Si nanoware layer and in the underlying SiO$_2$ layer. As such, the optical absorption in the Si/SiO$_2$ bilayer structure of the nanowire array 100 can lead to bending of the Si/SiO$_2$ bilayer structure. This mechanism provides an optical actuation of the bending of the Si/SiO$_2$ bilayer structure by controlling the incident light. Notably, a modulated optical beam can be directed to the nanowire array 100 to use the optical modulation of the beam power or intensity to cause modulated optical absorption that causes modulated bending in the Si/SiO$_2$ bilayer structure. The nanowire array 100 is a mechanical oscillator or resonator based on the bending motion. The resonance frequency of the oscillator/resonator formed by the nanowire array 100 depends on, among other factors, the mass of the nanowire array 100. As the mass of the nanowire array 100 changes, the mechanical resonance frequency of this resonator changes. This relationship can be used as a sensing mechanism.

One of the applications of the above sensing mechanism is a label-free DNA sensor where the nanowires of the nanowire array 100 are functionalized to attach to targeted substances such as DNA molecules. Attachment of the targeted DNA molecules changes the mass of the nanowire array 100 and this change leads to a shift in the mechanical resonance frequency of the nanowire array 100 as a resonator. This frequency shift can be measured to detect the respective targeted DNA molecules since different DNA molecules have different weights.

The nanowire array 100 exhibits a large surface area for attaching significant amounts of targeted molecules and a large ratio of its surface area to the volume. The nanowire array 100 can be used to construct a nanomechanical resonator device with ordered vertical nanowire (NW) arrays on top of a Si/SiO2 bilayer thin membrane. The device shows strongly enhanced total surface area-to-volume ratio $10^8$ m$^{-1}$ and the state-of-the-art mass-per area resolution $1.8 \times 10^{-12}$ kg m$^{-2}$, enabling biomolecule sensing in low-concentration target solution. As an example, a label-free DNA sensor based on the nanowire array 100 was tested to have a 500 aM concentration sensitivity. Compared with other label-free mechanical mass-based sensing techniques, the present NW array biosensor shows significantly enhanced concentration sensitivity. Moreover, the NW array forms a photonic crystal that shows strong light trapping and absorption over broadband optical wavelengths, enabling high-efficiency opto-thermo-mechanical actuation of the resonator. The optical energy coupling directly into the device eliminates the need for any interconnect wires, and could enable high-efficiency remote optically driven actuation and biosensing on a chip.

Figure 53A:
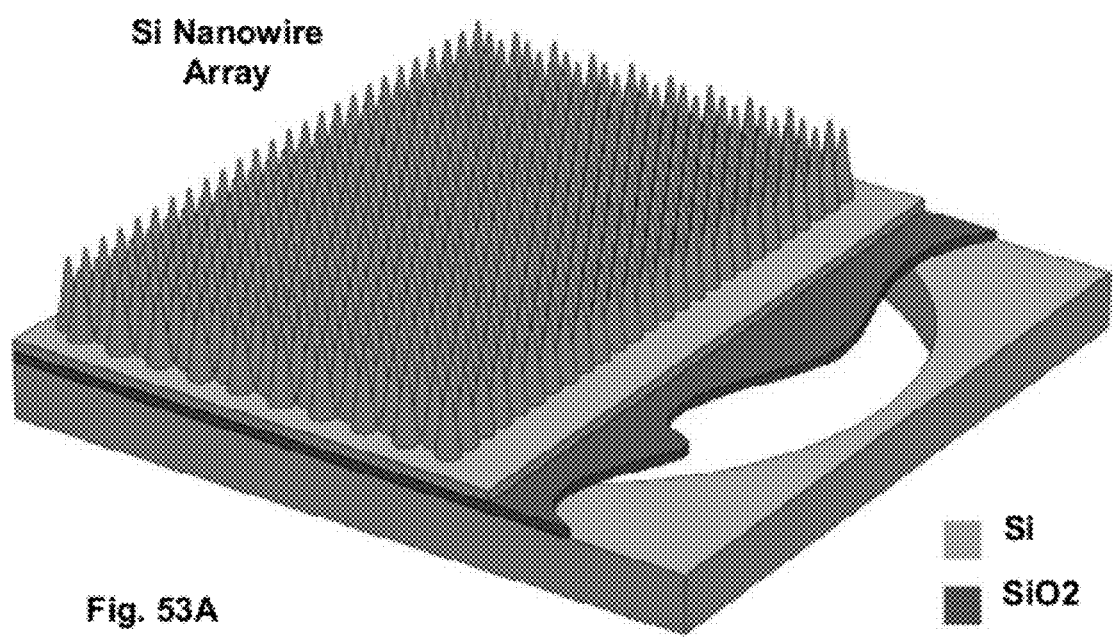
FIGS. 53A, 53B and 53C show the structure of an exemplary Si nanowire array for a sensitive sensor device such as a DNA sensor.
Figure 53B:
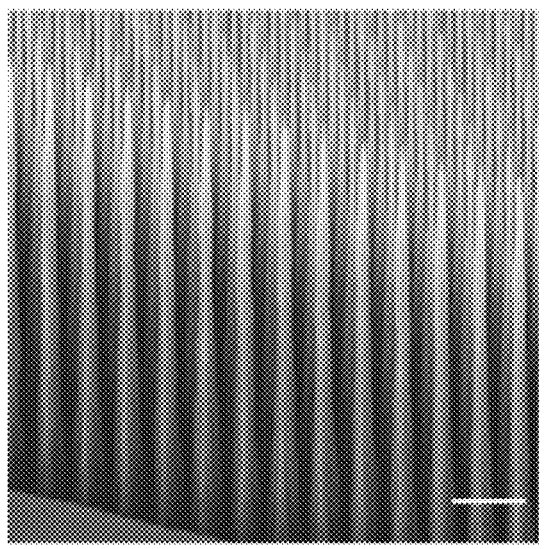
Figure 53C:
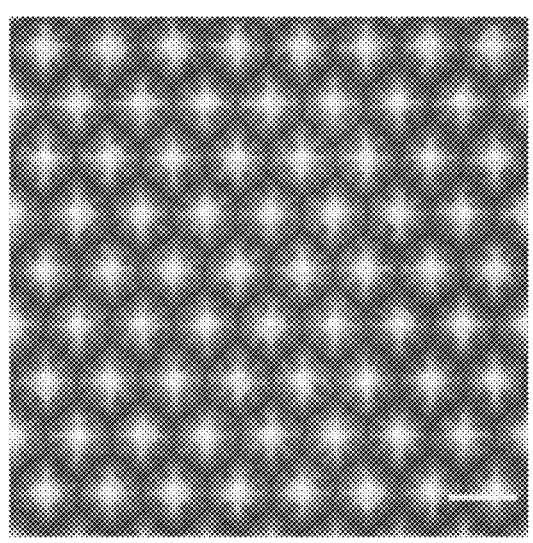

FIGS. 53A, 53B and 53C show the structure of an exemplary Si NW array of a DNA sensor. FIG. 53A show a schematic representation ordered vertical Si NW arrays on top of the $Si/SiO_2$ (300 nm/200 nm) membrane. The outer surface of NWs on membrane region was coated with a thin Ti/Au (2 nm/3 nm) passivation layer. FIG. 53B shows an SEM image taken at 40° side view of the Si NW array with 1.7 µm wire height, 100 nm wire base diameter, ~5 nm tip, at a 100 nm pitch. FIG. 53C shows the SEM image (top view) of the NW array in FIG. 53B.

As an example, the fabrication of the photonic crystal NW array resonator in FIGS. 53A-C can be performed by the following steps. Dry SiO2 (100 nm) was formed on the top surface of a SOI wafer (Si (2 µm)/SiO2 (0.2 µm)/Si (200 µm) stack) at 1,000° C. A thick layer of plasma-enhanced chemical vapor deposition (PECVD) SiO2 (3 µm, at 400° C.) was deposited on the backside of the SOI wafer. A thin layer of negative tone chemical-amplified e-beam resist NEB31A was spun on top of the dry SiO 2 surface, followed by electron beam lithography (100 keV beam energy) patterning and normal NEB31A development process. Ordered SiO 2 post arrays were formed by silicon dioxide RIE, using NEB31A as the etching mask. Si NW arrays were created by Si RIE (70 sccm of BCl 3, 2 sccm of H2, 20 mTorr), using SiO 2 posts array as the etching mask. The Si NW height could be controlled by etching time and 300 nm of planar Si under the NW arrays remained after etching. Then the sample was annealed at 1,000° C. for 30 s in vacuum, to remove the organic absorber on the Si surface and the crystal defects caused by previous Si RIE. A thin layer of Ti/Au (2 nm/3 nm) was deposited to passivate the outer surface of the NW, by the conformal CHA evaporator at low deposition rate. In the deposition process, the surface area enhancement factor by the NW structure needs to be considered. Then the top side was coated with a thick layer of photoresist stack (LOR(~1 µm)/SPR 220-4.5(~5 µm)) to protect the NW arrays for following backside processes. Circular cavity was formed on the backside PECVD SiO 2 layer, using EV620 contact aligner photolithography with backside alignment and followed the SiO 2 RIE process. A layer of SiO2 (1 µm) was patterned to cover the whole chip top surface except the circular membrane region, with optical photolithography patterning, SiO 2 deposition and lift off. This SiO2 layer was used to cover the Au surface that will not be used for DNA detection. Finally, a membrane was formed by etching through the SOI wafer Si substrate, using Si deep reactive ion etching (SF6) with the PECVD back oxide as the mask and the buried oxide as an etch stop.

The surface area-to-volume ratio of our ordered NW array resonator is large, e.g., up to $10^8$ m$^{-1}$, which is nearly two and three orders of magnitude larger than that of some microcantilever resonators and suspended microchannel resonators, respectively. This large surface area-to-volume ratio allows highly effective surface-based biomolecular mass sensing, especially at low target concentrations.

The optical absorption of the Si NW array shows a broad optical absorption range. Both reflectance (R) spectra and transmittance (T) spectra measurements can be conducted using, e.g., a xenon lamp combined with a monochromator. The absorption (A) spectra can be calculated by A=100%−R−T.

FIGS. 54A, 54B and 54C show enhanced broad-band light absorption measurements for the above photonic crystal NW array. FIG. 54A shows a photograph image of the device top surface with the NW array sample (black area), illustrating highly anti-reflective optical properties of the NW array. FIG. 54B shows an infrared camera image of the NW array sample, irradiated by a white light lamp (10 mW) in air showing that light incident onto the NW array can be absorbed and converted to heat efficiently via photon absorption. The NW array area (white) was heated up much faster than the surrounding planar Si area (grey). FIG. 54C shows measured light absorption spectra of the membrane (300 nm Si) with NW on top (black curve), compared with that of bare planar thin Si membrane (2 µm thick, cyan curve). For both samples, the surfaces have the same thin passivation layer Ti/Au (2 nm/3 nm). The inset in FIG. 54C shows the schematic illumination of the enhanced light trapping mechanisms for photonic crystal Si NW arrays. The NW array shows strongly enhanced light trapping and absorption efficiency over a broad-band wavelengths from 400 nm to 900 nm.

Figure 55A:
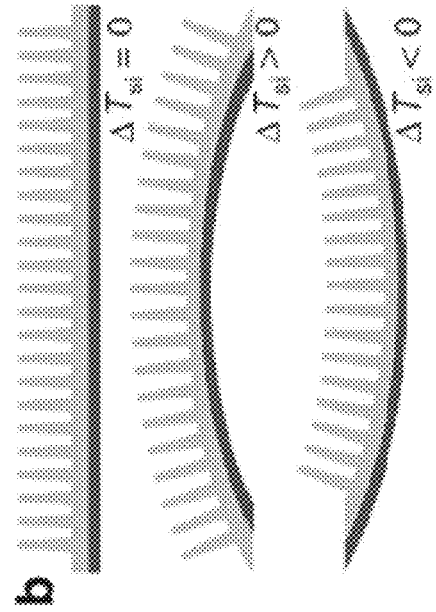
FIGS. 55A, 55B, 55C and 55D show opto-thermo-mechanical actuation for the photonic crystal in a resonator having vertical NW arrays on Si/SiO$_2$ bilayer membrane, with membrane diameter of 50 μm.
Figure 55B:
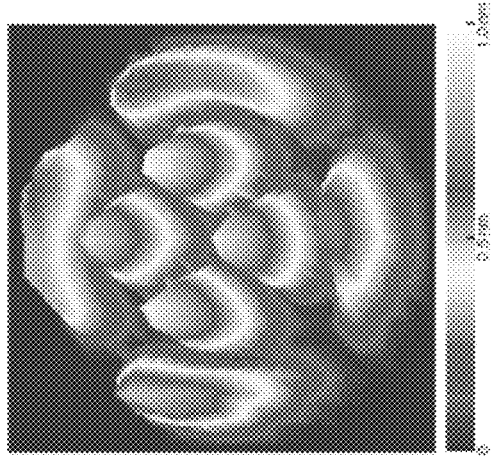
Figure 55C:
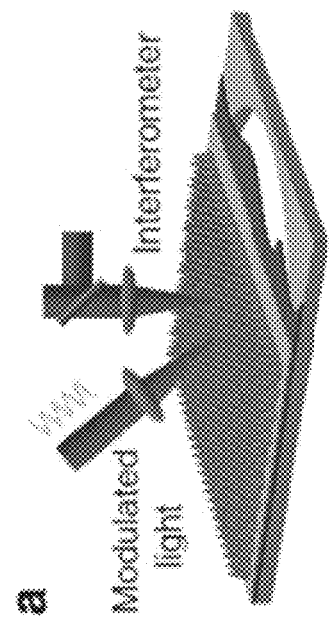
Figure 55D:
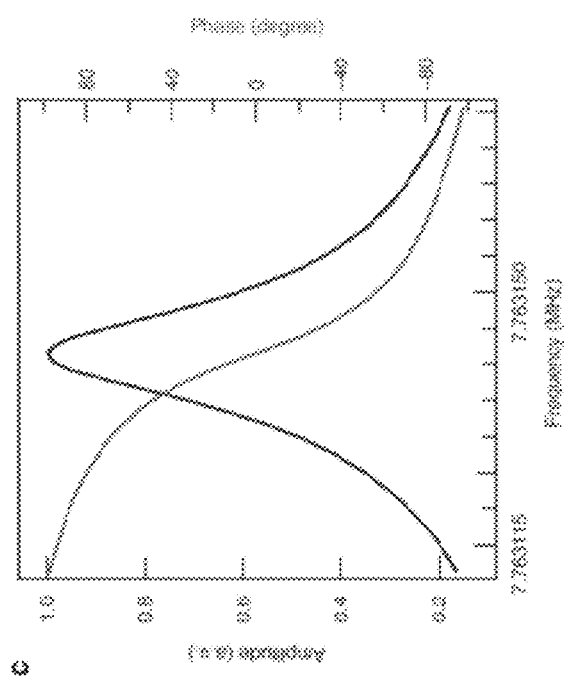

FIGS. 55A, 55B, 55C and 55D show that the strong broad-band light trapping and absorption optical properties of the photonic crystal NW arrays enable the high-efficiency opto-thermo-mechanical excitation for the resonator. In this example, the optical actuation mechanism includes a modulated laser and an optical detector such as an optical interferometer. Both the laser and the detector can be off the NW array to provide remote optical actuation and remote optical detection. In FIG. 55A, an intensity modulated laser light (e.g., $\lambda$=680 nm) is focused onto the membrane. In conducted tests, the thermo-optically excited vibration response of the laminate was measured using a PolyTec interferometer with a phase-locked loop, which has a resolution of <0.1 nm in vibration amplitude resolution. The heating from the incident modulated light leads to bending moments in the Si/SiO2 laminate due to the differences in the coefficient of linear thermal expansion in the two layers. FIG. 55B shows three states of the membrane bending due to thermal heating caused by optical absorption. This opto-thermo-mechanical actuation takes advantage of direct coupling of optical energy into selected device areas, eliminating the electrical interconnects required in integrated electrostatic or piezoelectric actuation and enabling high-efficiency remote optically driven actuation for biosensing. Conducted tests show that one of the mechanical modes possesses a quality factor up to $3.2 \times 10^5$, as shown by the frequency response plot in FIG. 55C. The high quality factor of the resonator (in vacuum 0.1 mTorr) might be due to the reduced surface loss and clamping loss, through proper Si surface high-temperature annealing treatment processes and the induced tensile stress to the Si film, respectively. FIG. 55D shows measured standing-wave vibration amplitude 2D mapping pattern of this mode. During mapping, the optical actuation frequency was fixed at the resonance mode and the interferometer laser gun was controlled by a stage controller for lateral movement with sub 0.5 µm lateral resolution. The measured standing-wave pattern of this mode matched well with the simulated mode pattern of the circular membrane.

The optical actuation in FIG. 55A can be implemented to achieve one or more advantages in applications. For example, the excitation efficiency of the photonic crystal NW array resonator has an enhancement factor of 5 to 30 in the measured spectral range from 400 nm to 900 nm over some other Si resonator designs. This allows the present NW array sensor to provide highly sensitive measurements. For another example, the broad spectral band of the optical absorption of the NW array can range from ultraviolet to near infrared. In biosensing, this broad-band excitation capability enables the protection of the biomolecules that are sensitive to high-energy photons, by using low-energy photon excitation, such as near infrared range.

The NW array resonator detection scheme relies on the resonance frequency shift due to the mass change after biomolecule attachment. The resonance frequency, f, could be expressed as:

$$f = \frac{1}{2\pi}\sqrt{\frac{k}{m_{eff} + \alpha \cdot \delta m}}$$

with resonator spring constant k, effective mass $m_{eff}$, mass change $\delta m$ and a numerical constant $\alpha$ that depends on the geometric localization of the added mass (Supplementary Methods). When $m_{eff}$ is much greater than $\delta m$, the resonance frequency shift, $\delta f$, could be expressed as a function of the initial resonant frequency of the resonator $f_0$:

$$\delta f = -\alpha \cdot \frac{f_0}{2m_{eff}} \cdot \delta m$$

Device mass responsivity was measured by adding various known mass to the sensor, through chemisorption of thiolated single-stranded DNA molecules. The measured mass responsivity is $(9.0\pm0.4)$ Hz $fg^{-1}$. With the experimentally determined frequency uncertainty of 1 Hz, the measured minimum absolute mass resolution of our resonator is $1.1\times10^{-19}$ kg. Using the measured total surface area $6.1\times10^{-8}$ $m^2$ of the resonator, the measured mass-per-area sensitivity is determined to be $1.8\times10^{-12}$ kg $m^{-2}$, which is around two and four orders of magnitude larger than that for the previous suspended micro-channel resonator and micro-cantilever resonator, respectively (Table 2). Our photonic crystal NW array resonator shows the enhanced mass-per-area sensitivity in comparison with other reported mechanical mass biosensors.

TABLE 2

| Methods | Absolute mass sensitivity (kg) | Total surface area ($m^2$) | Mass-per-area sensitivity ($kgm^{-2}$) |
|---|---|---|---|
| QCM[33] | $1.0\times10^{-12}$ | $2.0\times10^{-05}$ | $5.0\times10^{-08}$ |
| SMR[12] | $1.0\times10^{-18}$ | $1.0\times10^{-08}$ | $1.0\times10^{-10}$ |
| Resonant micro-cantilever[17] | $5.0\times10^{-23}$ | $^a1.3\times10^{-15}$ | $3.8\times10^{-08}$ |
| Resonant nano-cantilever[34] | $8.7\times10^{-23}$ | $4.8\times10^{-13}$ | $1.8\times10^{-10}$ |
| Photonic crystal NW array resonator (ours) | $1.1\times10^{-19}$ | $6.1\times10^{-08}$ | $1.8\times10^{-12}$ |

NW, nanowire; QCM, quartz crystal microbalance; SMR, suspended microchannel resonator.
$^a$The maximum top surface area of the most sensitive cantilever is $1.4\times10^{-12}$ $m^2$. In the original paper[17]; only a small Au dot (area $1.3\times10^{-15}$ $m^2$) was patterned for DNA binding.

The above NW array resonator was functionalized to demonstrate a sensitive DNA sensor.

FIG. 56A shows a schematic representation of the DNA immobilization and hybridization over the surfaces of the nanowires. FIG. 56B shows measured resonance frequency shift, plotted as a function of target concentration. The dashed fitting line is also added. The control experiment, using 10 pM non-matching DNA, is shown by a green square. The error bars present s.e. values on the mean, for multiple measurements (n=3). The frequency shows saturation at concentrations above 10 pM. FIG. 56C shows measured sensor responses for repeated DNA hybridization at 500 aM target solution and dehybridization. The resonance frequency shows negative shift (29.3±2.5 Hz) after DNA hybridization (even times) and resonance frequency shift goes to background noise level (5.4±2.0 Hz) after DNA dehybridization (odd times except the first time).

For DNA hybridization, we carried out the control experiment against a non-matching DNA sequence at 10 pM concentration first and then the hybridization experiments for matching sequence at varying target DNA concentrations from 500 aM up to 10 pM. The resonance frequency negative shift has a well-defined linear relation with the target DNA concentration (FIG. 56b). The demonstrated concentration sensitivity (500 aM) of our DNA sensor represents enhancement of one to six orders of magnitude in the detection limit, compared with the previously reported label-free DNA detection methods. Thiolated single-strand DNA (1 μM, IDT) was tethered to the freshly prepared gold surface in 1.0 M $KH_2PO_4$ buffer (PH=4.1). Immobilization was carried out at room temperature for 3 hours, followed by copious rinsing with distilled water (18.2 MΩcm). Mercaptohexanol (1 mM) was then used to remove nonspecific binding and passivate the gold surface for 1 hour. DNA hybridization was carried out in 1 ml of the hybridization buffer (1.0 M NaCl with TE buffer (10 mM Tris and 1 mM EDTA, pH=8.2)) at 37° C. for 2 hours under constant mixing. After hybridization, the device was rinsed with TE buffer to remove nonspecific DNA bindings, followed by volatile salt ammonium acetate solution (10 mM) rinsing and dried in a weak stream of nitrogen. The volatile salt can be removed in vacuum within several minutes. Control experiment was carried out in 10 pM non-matching DNA in hybridization buffer. For DNA dehybridization, the device was soaked in 55° C. TE buffer three times, 10 min each. Then the device was rinsed with distilled water and dried in nitrogen.

DNA sequences used in tests were (1) 5'-CACGACGTTG-TAAAACGACGGCCAG-3' as the probe DNA for immobilization, (2) 5'-CTGGCCGTCGTTTTACAACGTCGTG-3' as the target DNA, and (3) 5'-TCGCGCATCAATGCT-GATACTAGTC-3' as the control non-matching DNA.

The high mass per-area sensitivity of the described resonator enables high-sensitivity surface based detection of biomolecules at ultra-low concentrations. This is proved by demonstrating a low-concentration DNA sensor. For DNA detection, single-stranded probe DNA molecules with known sequence are immobilized onto the gold-coated NW surface and followed by surface passivation with mercaptohexanol. Although the planar gold surface is hydrophilic (52° contact angle), the gold-coated NW array structure is superhydrophilic, which is good for solution-based biomolecule detection.

The reusability of our device is also demonstrated (FIG. 56C). The resonance frequency shows negative shift (29.3±2.5 Hz) after DNA hybridization at 500 aM target solution and the shift goes to background noise level (5.4±2.0 Hz) after DNA dehybridization. Similar reusability demonstration was also shown with high concentration 10 pM target solution. Compared with the non-reusable device of previous multi-step chemical-amplified DNA detection techniques, the reusability of our device can potentially greatly reduce the cost. In addition, cost can be further reduced by using our recently reported technique, high-throughput self-powered parallel electron lithography, to pattern the NW arrays, instead of using the expensive and low-throughput electron beam lithography.

Therefore, a sensing technique is provided based on using a nanowire array resonator. In this method, a nanowire array resonator having at least two different layers with different thermal properties is placed in contact with a target substance to be detected to cause an amount of the substance to attach to the nanowires of the nanowire array. A temporally modulated optical beam of light is directed to the nanowire array to cause optical absorption of the modulated light in the nanowire array and modulated bending of the nanowire array in response to the modulation in the modulated optical beam. The property of the modulated bending of the nanowire array is measured to determine a resonance frequency of the modulated bending with the attached target substance. Based on a reference resonance frequency of the modulated bending without having the attached target substance, the shift in the resonance frequency due to attachment of the target substance is determined and this shift in the resonance frequency is used to determine the amount of the target substance that is attached to the nanowires.

In some implementations, the nanowires can be functionalized to selectively attach to the target substance via specific binding. For example, the nanowires can be coated with a metal such as gold and molecules can be attached to the metal for selectively binding with target molecules as shown in FIG. 56A. In addition to specific binding, non-specific binding could also occur to cause other materials or particles to bind onto the nanowires. Such non-specific bonded materials or particles aversely affect the accuracy of the measurement. Many non-specific bindings tend to be weaker than specific bindings, therefore, the modulation frequency of the temporally modulated optical beam can be set at an acoustic frequency or ultrasound frequency to use the modulated bending to shake off materials or particles that are attached to the nanowires via non-specific bindings while maintaining the target substance attached to the nanowires. This can improve the device's tolerance to the non-specific bindings.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Only a few implementations and examples are described and other implementations, enhancements and variations can be made based on what is described and illustrated in this patent document.

What is claimed is:

1. An apparatus comprising:
    a plurality of nanowire pillars;
    a substrate supporting the plurality of nanowire pillars;
    wherein the plurality of nanowire pillars are arranged in a periodic array with the nanowire pillars erected substantially perpendicular to the substrate, the periodic array being a two dimensional periodic array;
    a light source in optical communication with the substrate at a first location above the substrate and at an angle with respect to the substrate to produce modulated light and illuminate the two dimensional periodic array of nanowire pillars on the substrate;
    wherein the nanowire pillars erected substantially perpendicular to the substrate are structured to undergo a change in a physical spacing between the nanowire pillars in concert with a deformation of the substrate in response to the modulated light illuminated thereupon based on an induced temperature variation in the substrate caused by optical absorption of the modulated light at the nanowire pillars; and
    an optical interferometer in optical communication with the substrate at a second location above the substrate and at an angle with respect to the substrate to receive light collected from the two dimensional periodic array of nanowire pillars on the substrate due to illumination by the modulated light to detect information carried by the received light from the two dimensional periodic array of nanowire pillars on the substrate that indicates a resonance change corresponding to the deformation of the substrate,
    wherein the substrate includes a material having flexural rigidity, and wherein the deformation of the substrate includes bending of the substrate based on thermal expansion such that the physical spacing changes between the nanowire pillars and a pitch between the nanowire pillars is constant.

2. The apparatus of claim 1, wherein the plurality of nanowire pillars are configured so that the apparatus exhibits at least 90% optical absorption efficiency throughout the wavelength range of from 200 nm to 1200 nm.

3. The apparatus of claim 1,
    wherein the substrate includes materials that has flexural rigidity and deformation of the substrate changes the physical spacing between the nanowire pillars of the two dimensional periodic array of nanowire pillars.

4. The apparatus of claim 1,
    wherein the substrate includes two layers of materials having different thermal expansion coefficients from each other.

5. The apparatus of claim 1,
    wherein the substrate includes two layers of different materials including a Si layer and a SiO2 layer.

6. The apparatus of claim 1,
    wherein the two dimensional periodic array of nanowire pillars exhibits a large surface area for attracting significant amounts of a target and a large ratio of the surface area to the volume.

7. The apparatus of claim 1,
    wherein the two dimensional periodic array of nanowire pillars are arranged to form a photonic crystal structure showing strong light trapping and absorption over broad-band optical wavelengths.

8. The apparatus of claim 1,
    wherein each nanowire pillar is structured to have a shape with a larger base cross-section than top cross-section.

9. The apparatus of claim 1, wherein the periodic array of nanowire pillars are arranged on the substrate to have a pillar aspect ratio of greater than 5:1.

10. The apparatus of claim 1, wherein each nanowire pillar in the periodic array of nanowire pillars is structured to form a conical pillar shape.

11. A method comprising:
deforming a substrate of an apparatus having arranged on the substrate a two dimensional periodic array of nanowire pillars erected substantially perpendicular to the substrate, wherein the substrate includes a material having flexural rigidity, and wherein the deforming includes:
using a light source, the light source being in optical communication with the substrate at a first location above the substrate and at an angle with respect to the substrate, to produce modulated light that illuminate the substrate and the two dimensional periodic array of nanowire pillars arranged substantially perpendicular to the substrate, the modulated light causing an induced temperature variation in the substrate caused by optical absorption of the modulated light at the nanowire pillars to deform the substrate and thereby changing a physical spacing between the nanowire pillars in the two dimensional periodic array in concert with a deformation of the substrate; and
receiving, using an optical interferometer in optical communication with the substrate at a second location above the substrate and at an angle with respect to the substrate, light collected from the two dimensional periodic array of nanowire pillars perpendicularly erected on the substrate due to illumination by the modulated light to detect information carried by the received light from the two dimensional periodic array of nanowire pillars on the substrate that indicates a resonance change corresponding to the deformation of the substrate,
wherein the deformation of the substrate includes bending of the substrate based on thermal expansion such that the physical spacing changes between the nanowire pillars and a pitch between the nanowire pillars is constant.

12. The method of claim 11,
wherein the plurality of nanowire pillars are configured so that the apparatus exhibits at least 90% optical absorption efficiency throughout the wavelength range of from 200 nm to 1200 nm.

13. The method of claim 11,
wherein the substrate includes two layers of materials having different thermal expansion coefficients from each other.

14. The method of claim 11,
wherein the substrate includes two layers of different materials including a Si layer and a SiO2 layer.

15. The method of claim 11,
wherein the two dimensional periodic array of nanowire pillars exhibits a large surface area for attracting significant amounts of a target and a large ratio of the surface area to the volume.

16. The method of claim 11,
wherein the two dimensional periodic array of nanowire pillars are arranged to form a photonic crystal structure showing strong light trapping and absorption over broad-band optical wavelengths.

17. The method of claim 11,
wherein each nanowire pillar is structured to have a shape with a larger base cross-section than top cross-section.

18. The apparatus of claim 1, wherein the apparatus is operable to measure a mass of a substance or structure attached to the two dimensional periodic array of nanowire pillars based on the resonance change.

19. The apparatus of claim 18, wherein the resonance change includes a resonance frequency shift due to attachment of the substance or structure.

20. The apparatus of claim 18, wherein the substance includes a biomolecule.

* * * * *